(12) United States Patent
Robinson et al.

(10) Patent No.: US 8,623,448 B2
(45) Date of Patent: Jan. 7, 2014

(54) HIGH-THROUGHPUT PRINTING OF SEMICONDUCTOR PRECURSOR LAYER FROM CHALCOGENIDE MICROFLAKE PARTICLES

(75) Inventors: Matthew R. Robinson, San Jose, CA (US); Jeroen K. J. Van Duren, Menlo Park, CA (US); Brian M. Sager, Menlo Park, CA (US)

(73) Assignee: Nanosolar, Inc., San Jose, CA (US)

( * ) Notice: Subject to any disclaimer, the term of this patent is extended or adjusted under 35 U.S.C. 154(b) by 1282 days.

(21) Appl. No.: 11/765,436

(22) Filed: Jun. 19, 2007

(65) Prior Publication Data

US 2008/0121277 A1 May 29, 2008

Related U.S. Application Data

(63) Continuation-in-part of application No. 11/395,426, filed on Mar. 30, 2006, and a continuation-in-part of application No. 11/361,498, filed on Feb. 23, 2006, now abandoned, and a continuation-in-part of application No. 11/361,521, filed on Feb. 23, 2006, now abandoned, and a continuation-in-part of application No. 11/361,497, filed on Feb. 23, 2006, and a continuation-in-part of application No. 11/362,266, filed on Feb. 23, 2006, now abandoned, and a continuation-in-part of application No. 11/290,633, filed on Nov. 29, 2005, now Pat. No. 8,048,477, and a continuation-in-part of application No. 11/081,163, filed on Mar. 16, 2005, now Pat. No. 7,604,843, and a continuation-in-part of application No. 10/943,657, filed on Sep. 18, 2004, now Pat. No. 7,306,823, and a continuation-in-part of application No. 10/943,685, filed on Sep. 18, 2004, and a continuation-in-part of application No. 10/782,017, filed on Feb. 19, 2004, now Pat. No. 7,663,057.

(51) Int. Cl.
*B05D 5/06* (2006.01)

(52) U.S. Cl.
USPC .......................................... 427/74

(58) Field of Classification Search
USPC .......................................... 427/74
See application file for complete search history.

(56) References Cited

U.S. PATENT DOCUMENTS

| | | |
|---|---|---|
| 3,423,301 A | 1/1969 | Stearns |
| 3,586,541 A | 6/1971 | Chamberlin |

(Continued)

FOREIGN PATENT DOCUMENTS

| | | |
|---|---|---|
| DE | 2741954 A | 3/1979 |
| EP | 793277 A | 9/1997 |

(Continued)

OTHER PUBLICATIONS

Office Action dated Apr. 5, 2007 for U.S. Appl. No. 10/836,307.

(Continued)

*Primary Examiner* — Robert Vetere
(74) *Attorney, Agent, or Firm* — Joshua D. Isenberg; JDI Patent

(57) ABSTRACT

Methods and devices are provided for high-throughput printing of semiconductor precursor layer from microflake particles. In one embodiment, the method comprises of transforming non-planar or planar precursor materials in an appropriate vehicle under the appropriate conditions to create dispersions of planar particles with stoichiometric ratios of elements equal to that of the feedstock or precursor materials, even after settling. In particular, planar particles disperse more easily, form much denser coatings (or form coatings with more interparticle contact area), and anneal into fused, dense films at a lower temperature and/or time than their counterparts made from spherical nanoparticles. These planar particles may be microflakes that have a high aspect ratio. The resulting dense film formed from microflakes is particularly useful in forming photovoltaic devices. In one embodiment, at least one set of the particles in the ink may be inter-metallic flake particles (microflake or nanoflake) containing at least one group IB-IIIA inter-metallic alloy phase.

22 Claims, 18 Drawing Sheets

(56) References Cited

U.S. PATENT DOCUMENTS

| | | |
|---|---|---|
| 3,891,519 A | 6/1975 | Grellet |
| 3,907,566 A | 9/1975 | Inoue et al. |
| 3,966,568 A | 6/1976 | Crossley et al. |
| 4,104,134 A | 8/1978 | Roberts et al. |
| 4,191,794 A | 3/1980 | Shirland et al. |
| 4,192,721 A | 3/1980 | Fawcett et al. |
| 4,404,422 A | 9/1983 | Green et al. |
| 4,410,758 A | 10/1983 | Grolitzer |
| 4,522,663 A | 6/1985 | Ovshinsky et al. |
| 4,536,607 A | 8/1985 | Wiesmann |
| 4,598,306 A | 7/1986 | Nath et al. |
| 4,622,432 A | 11/1986 | Yamazaki |
| 4,642,140 A | 2/1987 | Noufi et al. |
| 4,677,250 A | 6/1987 | Barnett et al. |
| 4,806,436 A | 2/1989 | Tada et al. |
| 4,827,083 A | 5/1989 | Inasaka et al. |
| 4,940,604 A | 7/1990 | Suyama et al. |
| 5,013,464 A | 5/1991 | Sugimura et al. |
| 5,045,409 A | 9/1991 | Eberspacher et al. |
| 5,078,804 A | 1/1992 | Chen et al. |
| 5,093,453 A | 3/1992 | St. Clair et al. |
| 5,141,564 A | 8/1992 | Chen et al. |
| 5,244,509 A | 9/1993 | Arao et al. |
| 5,275,714 A | 1/1994 | Bonnet et al. |
| 5,277,786 A | 1/1994 | Kawakami |
| 5,286,306 A | 2/1994 | Menezes |
| 5,356,839 A | 10/1994 | Tuttle et al. |
| 5,401,573 A | 3/1995 | Babel et al. |
| 5,419,781 A | 5/1995 | Hamakawa et al. |
| 5,436,204 A | 7/1995 | Albin et al. |
| 5,439,575 A | 8/1995 | Thornton et al. |
| 5,441,897 A | 8/1995 | Noufi et al. |
| 5,445,847 A | 8/1995 | Wada et al. |
| 5,489,372 A | 2/1996 | Hirano |
| 5,501,786 A | 3/1996 | Gremion et al. |
| 5,538,903 A | 7/1996 | Aramoto et al. |
| 5,558,723 A | 9/1996 | Ufert |
| 5,567,469 A | 10/1996 | Wada et al. |
| 5,578,503 A | 11/1996 | Karg et al. |
| 5,626,688 A | 5/1997 | Probst et al. |
| 5,633,033 A | 5/1997 | Nishitani et al. |
| 5,674,555 A | 10/1997 | Birkmire et al. |
| 5,677,250 A | 10/1997 | Knapp |
| 5,728,231 A | 3/1998 | Negami et al. |
| 5,730,852 A | 3/1998 | Bhattacharya et al. |
| 5,769,963 A | 6/1998 | Fujioka et al. |
| 5,817,410 A | 10/1998 | Tsujimura et al. |
| 5,925,228 A | 7/1999 | Panitz et al. |
| 5,945,217 A | 8/1999 | Hanrahan |
| 5,985,691 A * | 11/1999 | Basol et al. ............... 438/95 |
| 5,994,163 A | 11/1999 | Bodegard et al. |
| 6,022,487 A | 2/2000 | Daume et al. |
| 6,107,562 A | 8/2000 | Hashimoto et al. |
| 6,117,454 A | 9/2000 | Kreuter et al. |
| 6,121,541 A | 9/2000 | Arya |
| 6,124,039 A | 9/2000 | Goetz et al. |
| 6,124,041 A | 9/2000 | Aoude et al. |
| 6,126,740 A | 10/2000 | Schulz et al. |
| 6,127,202 A * | 10/2000 | Kapur et al. ............... 438/47 |
| 6,150,022 A | 11/2000 | Coulter |
| 6,228,904 B1 | 5/2001 | Yadav et al. |
| 6,258,620 B1 | 7/2001 | Morel et al. |
| 6,268,014 B1 | 7/2001 | Eberspacher et al. |
| 6,323,417 B1 | 11/2001 | Gillespie et al. |
| 6,344,272 B1 | 2/2002 | Oldenburg et al. |
| 6,372,538 B1 | 4/2002 | Wendt et al. |
| 6,429,369 B1 | 8/2002 | Tober et al. |
| 6,454,886 B1 | 9/2002 | Martin et al. |
| 6,472,459 B2 | 10/2002 | Morales et al. |
| 6,500,733 B1 | 12/2002 | Stanbery |
| 6,518,086 B2 | 2/2003 | Beck et al. |
| 6,593,690 B1 | 7/2003 | McCormick et al. |
| 6,641,898 B2 | 11/2003 | Yazaki et al. |
| 6,685,986 B2 | 2/2004 | Oldenburg et al. |
| 6,821,559 B2 | 11/2004 | Eberspacher et al. |
| 6,897,603 B2 | 5/2005 | Mao et al. |
| 6,908,496 B2 | 6/2005 | Halas et al. |
| 6,951,398 B2 | 10/2005 | Borra et al. |
| 6,974,976 B2 | 12/2005 | Hollars |
| 7,144,627 B2 | 12/2006 | Halas et al. |
| 2002/0006470 A1 | 1/2002 | Eberspacher et al. |
| 2002/0132045 A1 | 9/2002 | Halas et al. |
| 2002/0160195 A1 | 10/2002 | Halas et al. |
| 2002/0170672 A1 | 11/2002 | Perlov et al. |
| 2002/0187347 A1 | 12/2002 | Halas et al. |
| 2003/0051664 A1 | 3/2003 | Stanbery |
| 2003/0052382 A1 | 3/2003 | Stanbery |
| 2003/0052391 A1 | 3/2003 | Stanbery |
| 2003/0054582 A1 | 3/2003 | Stanbery |
| 2003/0054661 A1 | 3/2003 | Stanbery |
| 2003/0054662 A1 | 3/2003 | Stanbery |
| 2003/0054663 A1 | 3/2003 | Stanbery |
| 2003/0059820 A1 | 3/2003 | Vo-Dinh |
| 2003/0175004 A1 | 9/2003 | Garito et al. |
| 2003/0192584 A1 | 10/2003 | Montello et al. |
| 2003/0205270 A1 | 11/2003 | Stanbery |
| 2003/0211369 A1 | 11/2003 | Riman et al. |
| 2003/0211646 A1 | 11/2003 | Stanbery |
| 2004/0033345 A1 | 2/2004 | Dubertret et al. |
| 2004/0063320 A1 | 4/2004 | Hollars |
| 2004/0144419 A1 | 7/2004 | Fix et al. |
| 2004/0214001 A1 | 10/2004 | Oldenburg et al. |
| 2004/0219730 A1 * | 11/2004 | Basol ............... 438/200 |
| 2005/0022747 A1 | 2/2005 | Stanbery |
| 2005/0035983 A1 | 2/2005 | Cruchon-Dupeyrat et al. |
| 2005/0058587 A1 | 3/2005 | Wagner |
| 2005/0074551 A1 | 4/2005 | Huang et al. |
| 2005/0150789 A1 | 7/2005 | Crane |
| 2005/0175836 A1 | 8/2005 | Kuehnle et al. |
| 2005/0183767 A1 | 8/2005 | Yu et al. |
| 2005/0183768 A1 | 8/2005 | Roscheisen et al. |
| 2005/0186342 A1 | 8/2005 | Sager et al. |
| 2005/0186805 A1 | 8/2005 | Stanbery |
| 2005/0194036 A1 | 9/2005 | Basol |
| 2005/0194038 A1 | 9/2005 | Brabec et al. |
| 2005/0202589 A1 | 9/2005 | Basol |
| 2005/0235869 A1 | 10/2005 | Cruchon-Dupeyrat et al. |
| 2005/0247340 A1 | 11/2005 | Zeira |
| 2005/0266600 A1 | 12/2005 | Basol |
| 2005/0268962 A1 | 12/2005 | Gaudiana et al. |
| 2005/0272263 A1 | 12/2005 | Brabec et al. |
| 2006/0054506 A1 | 3/2006 | Natan et al. |
| 2006/0099146 A1 | 5/2006 | Chow et al. |
| 2006/0121701 A1 | 6/2006 | Basol |
| 2006/0134505 A1 | 6/2006 | Wang et al. |
| 2006/0159922 A1 | 7/2006 | O'Keefe |
| 2006/0165911 A1 | 7/2006 | Basol |
| 2006/0178012 A1 | 8/2006 | Basol |
| 2006/0189155 A1 | 8/2006 | Basol |
| 2006/0192955 A1 | 8/2006 | Jorgenson et al. |
| 2006/0207644 A1 | 9/2006 | Robinson et al. |
| 2006/0251874 A1 | 11/2006 | McClure et al. |
| 2007/0044834 A1 | 3/2007 | Berke et al. |
| 2007/0092648 A1 | 4/2007 | Duren et al. |
| 2007/0093006 A1 | 4/2007 | Basol |
| 2007/0093059 A1 | 4/2007 | Basol |
| 2007/0111367 A1 | 5/2007 | Basol |
| 2007/0145507 A1 | 6/2007 | Basol |
| 2007/0163383 A1 | 7/2007 | Van Duren et al. |
| 2007/0163637 A1 | 7/2007 | Robinson et al. |
| 2007/0163638 A1 | 7/2007 | Van Duren et al. |
| 2007/0163639 A1 | 7/2007 | Robinson et al. |
| 2007/0163640 A1 | 7/2007 | Van Duren et al. |
| 2007/0163642 A1 | 7/2007 | Van Duren et al. |
| 2007/0163643 A1 | 7/2007 | Van Duren et al. |
| 2007/0163644 A1 | 7/2007 | Van Duren et al. |
| 2007/0166453 A1 | 7/2007 | Van Duren et al. |
| 2007/0166964 A1 | 7/2007 | Basol |
| 2007/0169809 A1 | 7/2007 | Van Duren et al. |
| 2007/0169810 A1 | 7/2007 | Van Duren et al. |
| 2007/0169811 A1 | 7/2007 | Van Duren et al. |
| 2007/0169812 A1 | 7/2007 | Robinson et al. |
| 2007/0169813 A1 | 7/2007 | Robinson et al. |

(56) References Cited

U.S. PATENT DOCUMENTS

| 2007/0178620 A1 | 8/2007 | Basol |
| 2008/0121277 A1 | 5/2008 | Robinson et al. |
| 2008/0124831 A1 | 5/2008 | Robinson et al. |

FOREIGN PATENT DOCUMENTS

| JP | 61244004 | | 10/1986 |
| JP | 63249379 | A | 10/1988 |
| JP | 6289369 | A | 10/1994 |
| JP | 2001044464 | | 2/2001 |
| KR | 2005119705 | | 12/2005 |
| WO | 03007386 | A1 | 1/2003 |
| WO | 03043736 | A | 5/2003 |

OTHER PUBLICATIONS

Office Action dated Apr. 10, 2009 for U.S. Appl. No. 11/362,266.
Office Action dated Apr. 14, 2011 for U.S. Appl. No. 11/933,400.
Office Action dated Apr. 26, 2012 for U.S. Appl. No. 12/840,220.
Office Action dated Apr. 28, 2010 for U.S. Appl. No. 12/176,312.
Office Action dated Aug. 22, 2011 for U.S. Appl. No. 11/933,357.
Office Action dated Aug. 28, 2008 for U.S. Appl. No. 11/361,688.
Office Action dated Aug. 29, 2008 for U.S. Appl. No. 11/362,266.
Office Action dated Dec. 12, 2008 for U.S. Appl. No. 11/361,515.
Office Action dated Dec. 14, 2010 for U.S. Appl. No. 12/176,312.
Office Action dated Dec. 21, 2011 for U.S. Appl. No. 11/361,497.
Office Action dated Dec. 23, 2008 for U.S. Appl. No. 11/395,668.
Office Action dated Dec. 24, 2008 for U.S. Appl. No. 11/361,522.
Office Action dated Dec. 26, 2008 for U.S. Appl. No. 11/361,523.
Office Action dated Dec. 31, 2007 for U.S. Appl. No. 10/782,017.
Office Action dated Feb. 2, 2011 for U.S. Appl. No. 11/933,357.
Office Action dated Feb. 3, 2012 for U.S. Appl. No. 12/176,312.
Office Action dated Feb. 9, 2007 for U.S. Appl. No. 10/943,657.
Office Action dated Feb. 9, 2009 for U.S. Appl. No. 11/395,426.
Office Action dated Feb. 16, 2011 for U.S. Appl. No. 11/290,633.
Office Action dated Feb. 16, 2011 for U.S. Appl. No. 11/395,426.
Office Action dated Feb. 18, 2010 for U.S. Appl. No. 11/933,400.
Office Action dated Feb. 25, 2009 for U.S. Appl. No. 11/361,521.
Office Action dated Jan. 3, 2007 for U.S. Appl. No. 10/943,685.
Office Action dated Jan. 7, 2009 for U.S. Appl. No. 11/290,633.
Office Action dated Jan. 18, 2011 for U.S. Appl. No. 10/943,685.
Office Action dated Jan. 24, 2006 for U.S. Appl. No. 10/943,685.
Office Action dated Jan. 26, 2010 for U.S. Appl. No. 11/361,497.
Office Action dated Jan. 29, 2009 for U.S. Appl. No. 11/361,103.
Office Action dated Jan. 29, 2009 for U.S. Appl. No. 11/361,498.
Office Action dated Jul. 15, 2008 for U.S. Appl. No. 11/361,433.
Office Action dated Jul. 16, 2010 for U.S. Appl. No. 11/361,497.
Office Action dated Jul. 17, 2008 for U.S. Appl. No. 10/943,685.
Office Action dated Jul. 18, 2012 for U.S. Appl. No. 11/361,497.
Office Action dated Jul. 29, 2008 for U.S. Appl. No. 11/362,266.
Office Action dated Jul. 31, 2008 for U.S. Appl. No. 11/933,375.
Office Action dated Jun. 10, 2009 for U.S. Appl. No. 11/395,668.
Office Action dated Jun. 11, 2008 from U.S. Appl. No. 10/836,307.
Office Action dated Jun. 15, 2009 from U.S. Appl. No. 11/395,438.
Office Action dated Mar. 10, 2009 for U.S. Appl. No. 11/361,497.
Office Action dated Mar. 10, 2009 U.S. Appl. No. 11/361,497.
Office Action dated May 14, 2008 for U.S. Appl. No. 11/081,163.
Office Action dated May 14, 2008 from U.S. Appl. No. 11/081,163.
Office Action dated Nov. 9, 2009 for U.S. Appl. No. 11/290,633.
Office Action dated Nov. 23, 2009 for U.S. Appl. No. 11/395,426.
Office Action dated Oct. 19, 2009 for U.S. Appl. No. 11/361,521.
Office Action dated Oct. 26, 2011 for U.S. Appl. No. 11/395,426.
Office Action dated Sep. 2, 2011 for U.S. Appl. No. 10/943,685.
Padhi et al., Planarization of Copper Thin Films by Electropolishing in Phoshoric Acid for ULSI Applications, Journal of the Electrochemical Society, 2003, G10-G14, vol. 150, No. 1, Electrochemical Society Inc: USA.
Park et al., "Synthesis of "Solid Solution" and "Core-Shell" Type Cobald-Platinum Magnetic Nanoparticles via Transmetalation Reactions" Journal of the American Chemical Society, 123, May 25, 2001, pp. 5743-5746.
Poloni et al., Liquid gallium in confined droplets under high-temperature and high-pressure conditions, Physical Review B 71. 184111 (2005).
Raffaelle et al., Electrodeposited CuInSe(2) thin film junctions, Prepared for the 1997 Fall meeting sponsored by the Materials Research Society, Dec. 1-5, 1997, Boston, MA.
Ramakrishna Reddy et al., Photoacousstic spectroscopy of sprayed CuGa(x)in(1-x)Se(2) thin films, Thin Solid Films, 2001, 205-207, vol. 387, Elsevier Science, Amsterdam : Netherlands.
S. Wiedeman et al. "CIGS Processing on a Flexible Polyimide Substrates" Proc. 2001 NCPV Program Review Meeting, p. 49-50 (2001).
Saltman and Nachtrieb, The Electrochemistry of Gallium, Journal of the Electrochemical Society, Mar. 1953, 126-130, vol. 100, No. 3, Electrochemical Society Inc.: USA.
Schnable and Javes, Electrodeposition of Molten Low-Melting Metals and Alloys from Fused-Salt Systems, Electrochemical Technology, Jul.-Aug. 1964, 201-206, Electrochemical Society, Manchester, N. H.
Schnable, Electrodeposition of Molten Metals and Alloys from Glycerine Solutions, Journal of the Electrochemical Society, Oct. 1961, 964-969, vol. 108, No. 10, Electrochemical Society Inc.: USA.
Schulz et al., Cu-In-Ga-Se Nanoparticle Colloids as Spray Deposition Precursors for Cu(in, Ga)Se(2) Solar Cell Materials, Journal of Electornic Materials, 1998, 433-437, vol. 27, No. 5, Mineral Metals & Materials Society: USA.
Schwarcz et al., TEM observations of early nucleation and growth stages in aluminum films on liquid gallium droplets, Thin Solid Films (1994), 245(1-2), 260-6.
Sedoi and Valevich. "Direct Production of Nanosized powders by the exploding wire method" Physics, Chemistry & Applications of Nanostructures (Reviews).
Sedoi et al, Generation of aerosols by the electrical explosion of wires at reduced air pressure, Aerosols, 1998, vol. 4e, No. 2, pp. 48-54.
Sedoi et al, Production of submicron aerosols by the exploding wire method, Aerosols, 1998, vol. 4e, No. 2, pp. 41-47.
Sen et al., "Preparation of Cu, Ag, Fe and Al nanoparticles by the exploding wire technique" in Proc. Indian Acad. Sci. (Chem. Sci.), vol. 115, No. 5 & 6, pp. 499-508, Oct.-Dec. 2003, Indian Academy of Sciences.
Subramanian and Laughlin, Binary Alloy Phase Diagrams, 2nd Edition, edited by Massalski, T.B. 1990, ASM International, Materials Park, OH, pp1410-1412.
Sun et al., "Monodisperse FePt Nanoparticles and Ferromagnetic FePt Nanocrystal Superlattices", Science, 287, pp. 1989-1992 (Mar. 17, 2000).
Tepper et al., "Nanosized ALumina Fibers", Advanced Materials, American Ceramic Society Bulletin, vol. 80, No. 6, Jun. 2001.
U.S. Appl. No. 11/081,163, filed on Mar. 16, 2005.
U.S. Appl. No. 10/943,658, filed on Sep. 18, 2004.
U.S. Appl. No. 10/698,988, filed on Oct. 31, 2002.
U.S. Appl. No. 10/782,017, filed on Feb. 19, 2004.
U.S. Appl. No. 11/290,633, filed on Mar. 15, 2005, titled "Metallic Dispersion".
U.S. Appl. No. 11/396,199, filed on Mar. 30, 2006 titled "Dispersion Using Inter-metallic Materials".
U.S. Appl. No. 11/933,136, filed on Oct. 31, 2007 titled "Solution-based Fabrication of Photovoltaic Cell".
U.S. Appl. No. 11/933,255, filed on Oct. 31, 2007 titled "Solution-based Fabrication of Photovoltaic Cell".
U.S. Appl. No. 11/933,285, filed on Oct. 31, 2007 titled "Solution-based Fabrication of Photovoltaic Cell".
U.S. Appl. No. 11/933,315, filed on Oct. 31, 2007 titled "Solution-based Fabrication of Photovoltaic Cell".
U.S. Appl. No. 11/933,322, filed on Oct. 31, 2007 titled "Solution-based Fabrication of Photovoltaic Cell".
U.S. Appl. No. 11/933,338, filed on Oct. 31, 2007 titled "Solution-based Fabrication of Photovoltaic Cell".
U.S. Appl. No. 11/933,357, filed on Oct. 31, 2007 titled "Solution-based Fabrication of Photovoltaic Cell".
U.S. Appl. No. 11/933,375, filed on Oct. 31, 2007 titled "Solution-based Fabrication of Photovoltaic Cell".

(56) References Cited

OTHER PUBLICATIONS

U.S. Appl. No. 11/933,400, filed on Oct. 31, 2007 titled "Solution-based Fabrication of Photovoltaic Cell".
U.S. Appl. No. 11/933,407, filed on Oct. 31, 2007 titled "Solution-based Fabrication of Photovoltaic Cell".
U.S. Appl. No. 12/095,463, filed on May 29, 2008 titled "Chalcogenide Solar Cell".
Wang and Xia, "Bottom-Up and Top-Down Approaches to the Synthesis of Monodispersed Spherical Colloids of Low Melting-Point Metals", NANO LETTERS, vol. 4, No. 10, Sep. 2, 2004, pp. 2047-2050.
Weng and Cocivera, Preperation of copper indium diselenide by selenization of copper indium oxide, Journal of Applied Physics, Aug. 1, 1993, 2046-2052, vol. 74, No. 3, American Institute of Physics, New York.
Yasuto Miyazawa and G. M. Pound, Homogeneous Nucleation of Crystalline Gallium from Liquid Gallium, Journal of Crystal Growth 23 (1974) 45-57.
Yu et al., "Heterogeneous Seed Growth: A Potentially General Synthesis of Monodisperse Metallic Nanoparticles" in J. Am. Che. Soc. 2001, vol. 123, pp. 9198-9199.
Zhu et al., General Sonochemical Method for the Preparation of Nanophasic Selenides: Synthesis of ZnSe Nenoparticles, Chem. Mayer. 2000, 12, 73-78.
Ag-GA and Cu-Ga Phase Diagrams. Nov. 1999.
Arita et al., CuInSe(2) films prepared by screen-printing and sintering method, 1988, IEEE.
B. A. Ridley et al, "All-Inorganic Field Effect Transistors Fabricated by Printing" in Science, vol. 286, pp. 746-749, Oct. 22, 1999.
Banger et al., "Synthesis and Characterization of the First Liquid Single-Source Precursors for the Deposition of Ternary Chalcopyrite (CuInS2) Thin Film Materials", Chem Matter, vol. 13, 3827-3829, 2001, American Chemical Society.
Beck, and Michael Cocivera, Thin-film copper indium diselenide prepared by selenization of copper indium oxide formed by spray pyrolysis, Thin Solid Films, 1996, 71-82, vol. 272, Elsevier Publishing Company, Amsterdam.
Berty et al., Electron diffraction study of the supercooling of very small gallium droplets, Scripta Metallurgica (1976), 10(7), 645-8.
Bosio and Windsor, Observation of a Metastability Limit in Liquid Gallium, Physical Review Letters, vol. 35, No. 24, Dec. 15, 1975.
Carmalt et al., Solid-state and solution phase metathetical synthesis of copper indium chalcogenides, Journal of Materials Chemistry, 1998, 2209-2211, vol. 8, No. 10, Roya Society of Chemistry, Great Britain.
Castro et al., "Nanocrystalline Chalcopyrite Materials (CuInS2 and CuInSe2) via Low-Temperature Pyrolsis of Molecular Single-Source Precursors" Chem Mater, vol. 15, pp. 3142-3147, 2003.
Dabbousi et al., "(CdSe)ZnS Core-Shell Quantum Dots: Synthesis and Characterization of a Size Series of Highly Luminscent Nanocrystallites", J. Phys. Chem. B, 101, 9453-9475 (1997).
De Silva et al., Electrodeposition and characterization of CuInSe(2) for applications in thin film solar cells, Thin Solid Films, 2001, 158-163, vol. 382, Elsevier Science, Amsterdam: Netherlands.
Definition of "globule" from Oxford English Dictionary Online. 2nd edition, 1989.
Di Cicco et al., Phase transitions and undercooling in confied gallium, Philosophical Magazine B: Physics of Condensed Matter: Statistical Mechanics, Electronic, Optical and Magnetic Properties (1999), 79(Nov. 2012), 2113-2120. Publisher: Taylor & Francis Ltd.
Di Cicco, Phase Transitions in Confined Gallium Droplets, Physical Review Letters (1998), 81(14), 2942-2945, Publisher: American Physical Society.
Eberspacher et al., Improved processes for forming CuInSe(2) films, UNISUN, 1-4, Newberry Park, CA.
Eberspacher et al., Non-vacuum processing of CIGS solar cells, UNISUN, 223-224, 2001, Newbury Park, CA.
Eberspacher et al., Non-vacuum processing of CIGS solar cells, UNISUN, pp. 1-5, 2003, Newbury Park, CA.
Eberspacher et al., Non-vacuum thin-film CIGS modules, Materials Research Society Symposia Proceedings, 2003, B8.27.1-B827.6, vol. 763, Materials Reserach Society, Warrendale, PA.
Eberspacher et al., Thin-filme CIS alloy PV materials fabricated using non-vacuum, particles-based techniques, Thin Solid Films, 2001, 18-22, Volumer 387, Elsevier Publishing Company, Amsterdam.
Freeman et al., Ag-Clad Au Nanoparticles: Novel Aggregation, Optical, and Surface-Enhanced Raman Scattering Properties, J. Phys. Chem., vol. 100, 1996, pp. 718-724.
Granqvist and Buhrman. "Ultrafine metal particles". J. Applied Physics 47 (5): 220-2219 (1976).
Guillen and Herrero, Recrystallization and components redistribution processes in electrodeposited CuInSe(2) thin films, Thin Solid Films, 2001, 57-59, vol. 387, Elsevier Science, Amsterdam: Netherlands.
Hambrock et al. "Nano-Brass: Bimetallic Copper/Zinc Colloids by a Nonacqueous Organometallic Route using [Cu(OCH(Me)CH2NMes)2] and Et27n as Precursors", Chem. Mater, 15: 4217-4222, (2003).
Heyding et al., Metastable phases in gallium dispersions, Journal of Physics and Chemistry of Solids (1973), 34(1), 133-6.
Huang et al., Preparation and internal friction of nanoscale gallium droplets, Physica Status Solidi A: Applied Research (2002), 194(1), 167-172.
ISET, Inc. Website (isetinc.com/cigs.html) from Feb. 4, 2003, available from www.archive.org, 2 pages.
Jeong et al. "Synthesis of Monodisperse Spherical Colloids of Amorhous Selenium", Advanced Materials, vol. 17, No. 1, Jan. 6, 2005, pp. 102-106.
Kaelin et al., CIS and CIGS layers from selenized nanoparticle precursors, Thin Solid Films, 2003, 58-62, vol. 431-432, Elsevier Science, Amsterdam: Netherlands.
Kaelin et al., Electrosprayer and selenized Cu/in metal particle films, Thin Solid Films, 2004, 391-396, vol. 457, Elsevier Science, Amsterdam: Netherlands.
Kampmann et al., Juction Formation Studies of One-Step Electrodeposited CuInSe(2) on CdS, Journal of the Electrochemical Society, 1999, 150-155, vol. 146, No. 1, Royal Society of Chemistry, Great Britain.
Kapur et al., Non-Vacuum Processing of CuIn(1-x)Ga(x)Se(2) solar cells on rigid and felixble substrates using nanoparticle precursor inks, Thin Solid Films, 2003, 53-57, vol. 431-432, Elsevier Publishing Company, Amsterdam.
Karpov et al., Gallium droplet formation during MOVPE and thermal annealing of GaN, Materials Science & Engineering, B: Solid-State Materials for Advanced Technology (2001), B82(1-3), 22-24.
Kemell et al., Electrochemical Quartz Crystal Microbalance Study of the Electrodeposition Mechanisms of CuInSe(2) Thin Films, Journal of the Electrochemical Society, 2001, C110-C118, vol. 148, No. 2, Electrochemical Society: USA.
Kronik et al., "Interface redox engineering of Cu(in,Ga)Se2—based solar cells: oxygen, sodium, and chemical bath effects", Thin Solic Films, vol. 361-362, p. 353-359 (2000).
Lee et al., Fabrication of high-output-power AlGaN/GaN-based UV-light emitting diode using a Ga droplet layer, Japanese Journal of Applied Physics, Part 2: Letters (2002), 41(10A), L1037-L1039.
Li et al, "Synthesis by a Solvothermal Route and Characterization of CuInSe2 Nanowhiskers and Nanoparticles" in Advanced Materials, vol. 11, No. 17, pp. 1456-1459, 1999, Wiley-VCH Verlag GmbH.
Lundberg, O. et al., "Influence of the Cu(In,GA)Se2 Thickness and GA Grading on Solar Cell Performance", Prog. PHotovolt: Res. Appl. 11, 77-88. (2003) Published online on Nov. 22, 2002.
Malik et al, "A Novel Route for the Preparation of CuSe and CuInSe2 Nanoparticles" in Advanced Materials, vol. 11, No. 17, pp. 1441-1444, Wiley-VCH Verlag GmbH, Weinheim.
Miyazawa and Pound, Homogeneous Nucleation of Crystalline Gallium from Liquid Gallium, Journal of Crystal Growth 23 (1974) 45-57.
Munoz et al., Electrodeposition of Indium onto Vitreous Carbon from Acid Chloride Solutions, Journal of the Electrochemical Society, 1999, 2123-2130, vol. 146, No. 6, Electrochemical Society Inc.: USA.

(56) References Cited

OTHER PUBLICATIONS

Norsworthy et al., CIS film growth by metallic ink coating and selenization, Solar Energy Materials & Solar Cells, 2000, 127-134, vol. 60, Elsevier Science, Amsterdam: Netherlands.
Notice of Allowance and Fees dated Aug. 31, 2011 for U.S. Appl. No. 11/933,400.
Notice of Allowance and Fees dated Jul. 28, 2011 for U.S. Appl. No. 11/290,633.
Notice of Allowance and Fees due dated Feb. 9, 2009 for U.S. Appl. No. 11/081,163.
Notice of Allowance and Fees due dated Jul. 11, 2008 for U.S. Appl. 10/782,017.
Notice of Allowance and Fees Due dated Jul. 25, 2007 for U.S. Appl. No. 10/943,657.
Notice of Allowance and Fees due dated Jun. 11, 2009 for U.S. Appl. No. 11/081,163.
Notice of Allowance and Fees due dated Mar. 20, 2009 for U.S. Appl. No. 10/782,017.
Notice of Allowance and Fees due dated Sep. 18, 2009 for U.S. Appl. No. 10/782,017.
Office Action dated Apr. 1, 2009 for U.S. Appl. No. 11/933,400.
Notice of Allowance dated Sep. 30, 2013 for U.S. Appl. No. 12/763,146.

* cited by examiner

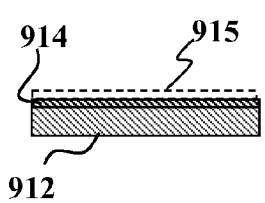
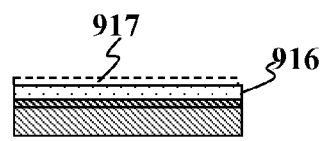
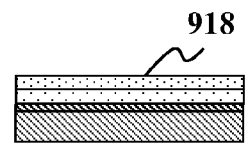
FIG. 13A  FIG. 13B  FIG. 13C
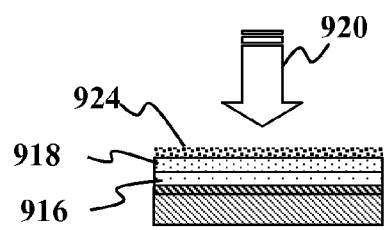
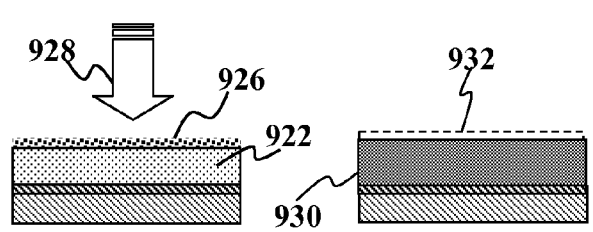
FIG. 13D  FIG. 13E  FIG. 13F
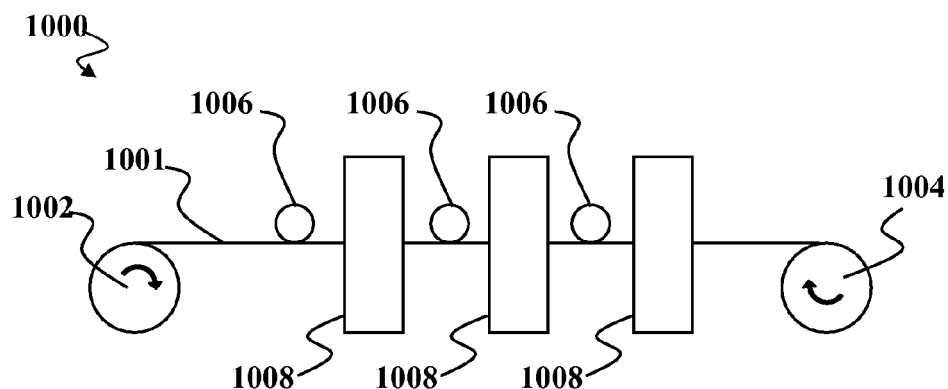
FIG. 14

US 8,623,448 B2

HIGH-THROUGHPUT PRINTING OF SEMICONDUCTOR PRECURSOR LAYER FROM CHALCOGENIDE MICROFLAKE PARTICLES

CROSS-REFERENCE TO RELATED APPLICATION

This application is a continuation-in-part of commonly-assigned, U.S. patent application Ser. Nos. 11/361,498, now abandoned 11/361,521, now abandoned 11/361,497, and 11/362,266, now abandoned all filed on Feb. 23, 2006. This application is a continuation-in-part of commonly-assigned, co-pending application Ser. No. 11/395,426 filed on Mar. 30, 2006. This application is a continuation-in-part of commonly-assigned, application Ser. No. 11/290,633, now U.S. Pat. No. 8,048,477 entitled "CHALCOGENIDE SOLAR CELLS" filed Nov. 29, 2005 and Ser. No. 10/782,017, now U.S. Pat. No. 7,663,057 entitled "SOLUTION-BASED FABRICATION OF PHOTOVOLTAIC CELL" filed Feb. 19, 2004 and published as U.S. patent application publication 20050183767, the entire disclosures of which are incorporated herein by reference. This application is also a continuation-in-part of commonly-assigned, U.S. patent application Ser. No. 10/943,657, now U.S. Pat. No. 7,306,823 entitled "COATED NANOPARTICLES AND QUANTUM DOTS FOR SOLUTION-BASED FABRICATION OF PHOTOVOLTAIC CELLS" filed Sep. 18, 2004, the entire disclosures of which are incorporated herein by reference. This application is also a continuation-in-part of commonly-assigned, U.S. patent application Ser. No. 11/081,163, now U.S. Pat. No. 7,604,843 entitled "METALLIC DISPERSION", filed Mar. 16, 2005, the entire disclosures of which are incorporated herein by reference. This application is a also continuation-in-part of commonly-assigned, co-pending U.S. patent application Ser. No. 10/943,685, entitled "FORMATION OF CIGS ABSORBER LAYERS ON FOIL SUBSTRATES", filed Sep. 18, 2004. The entire disclosures of all documents listed above are incorporated herein by reference for all purposes.

FIELD OF THE INVENTION

This invention relates generally to semiconductor films, and more specifically, to the fabrication of solar cells that use semiconductor films based on IB-IIIA-VIA compounds.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-sulfo-di-selenide, $Cu(In, Ga)(S, Se)_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as zinc oxide ($ZnO_x$) is formed on the junction partner layer and is typically used as a transparent electrode. CIS-based solar cells have been demonstrated to have power conversion efficiencies exceeding 19%.

A central challenge in cost-effectively constructing a large-area CIGS-based solar cell or module is that the elements of the CIGS layer must be within a narrow stoichiometric ratio on nano-, meso-, and macroscopic length scale in all three dimensions in order for the resulting cell or module to be highly efficient. Achieving precise stoichiometric composition over relatively large substrate areas is, however, difficult using traditional vacuum-based deposition processes. For example, it is difficult to deposit compounds and/or alloys containing more than one element by sputtering or evaporation. Both techniques rely on deposition approaches that are limited to line-of-sight and limited-area sources, tending to result in poor surface coverage. Line-of-sight trajectories and limited-area sources can result in non-uniform three-dimensional distribution of the elements in all three dimensions and/or poor film-thickness uniformity over large areas. These non-uniformities can occur over the nano-, meso-, and/or macroscopic scales. Such non-uniformity also alters the local stoichiometric ratios of the absorber layer, decreasing the potential power conversion efficiency of the complete cell or module.

Alternatives to traditional vacuum-based deposition techniques have been developed. In particular, production of solar cells on flexible substrates using non-vacuum, semiconductor printing technologies provides a highly cost-efficient alternative to conventional vacuum-deposited solar cells. For example, T. Arita and coworkers [20th IEEE PV Specialists Conference, 1988, page 1650] described a non-vacuum, screen printing technique that involved mixing and milling pure Cu, In and Se powders in the compositional ratio of 1:1:2 and forming a screen printable paste, screen printing the paste on a substrate, and sintering this film to form the compound layer. They reported that although they had started with elemental Cu, In and Se powders, after the milling step the paste contained the Cu—In—$Se_2$ phase. However, solar cells fabricated from the sintered layers had very low efficiencies because the structural and electronic quality of these absorbers was poor.

Screen-printed Cu—In—$Se_2$ deposited in a thin-film was also reported by A. Vervaet et al. [9th European Communities PV Solar Energy Conference, 1989, page 480], where a micron-sized Cu—In—$Se_2$ powder was used along with micron-sized Se powder to prepare a screen printable paste. Layers formed by non-vacuum, screen printing were sintered at high temperature. A difficulty in this approach was finding an appropriate fluxing agent for dense Cu—In—$Se_2$ film formation. Even though solar cells made in this manner had poor conversion efficiencies, the use of printing and other non-vacuum techniques to create solar cells remains promising.

There is a widespread notion in the field, and certainly in the CIGS non-vacuum precursor field, that the most optimized dispersions and coating contain spherical particles and that any other shape is less desirable in terms of dispersion stability and film packing, particularly when dealing with nanoparticles. Accordingly, the processes and theories that dispersion chemists and coating engineers are geared toward involve spherical particles. Because of the high density of metals used in CIGS non-vacuum precursors, especially those incorporating pure metals, the use of spherical particles requires a very small size in order to achieve a well dispersed media. This then requires that each component be of similar size in order to maintain desired stoichiometric ratios, since otherwise, large particles will settle first. Additionally, spheroids are thought to be useful to achieve high packing density on a packing unit/volume basis, but even at high density, spheres only contact at tangential points which represent a very small fraction of interparticle surface area. Furthermore, minimal flocculation is desired to reduce clumping if good atomic mixing is desired in the resulting film.

Due to the aforementioned issues, many experts in the non-vacuum precursor CIGS community desire spherical nanoparticles in sizes that are as small as they can achieve. Although the use of traditional spherical nanoparticles is still promising, many fundamental challenges remain, such as the difficulty in obtaining small enough spherical nanoparticles in high yield and low cost (especially from CIGS precursor materials) or the difficulty in reproducibly obtaining high quality films. Furthermore, the lower interparticle surface area at contact points between spheroidal particles may serve to impede rapid processing of these particles since the reaction dynamics depend in many ways on the amount of surface area contact between particles.

SUMMARY OF THE INVENTION

Embodiments of the present invention address at least some of the drawbacks set forth above. The present invention provides for the use of non-spherical particles in the formation of high quality precursor layers which are processed into dense films. The resulting dense films may be useful in a variety of industries and applications, including but not limited to, the manufacture of photovoltaic devices and solar cells. More specifically, the present invention has particular application in the formation of precursor layers for thin film solar cells. The present invention provides for more efficient and simplified creation of a dispersion, and the resulting coating thereof. It should be understood that this invention is generally applicable to any processes involving the deposition of a material from dispersion. At least some of these and other objectives described herein will be met by various embodiments of the present invention.

In one embodiment of the present invention, a method is provided for transforming non-planar and/or planar precursor metals in an appropriate vehicle under the appropriate conditions to create dispersions of planar particles with stoichiometric ratios of elements equal to that of the feedstock or precursor metals, even after selective settling. In particular, planar particles described herein have been found to be easier to disperse, form much denser coatings, and anneal into films at a lower temperature and/or time than their counterparts made from spherical nanoparticles that have substantially similar composition but different morphology. Additionally, even unstable dispersions using large microflake particles that may require continuous agitation to stay suspended still create good coatings. In one embodiment of the present invention, a stable dispersion is one that remains dispersed for a period of time sufficient to allow a substrate to be coated. In one embodiment, this may involve using agitation to keep particles dispersed in the dispersion. In other embodiments, this may include dispersions that settle but can be re-dispersed by agitation and/or other methods when the time for use arrives.

In another embodiment of the present invention, a method is provided that comprises of formulating an ink of particles wherein substantially all of the particles are microflakes. In one embodiment, at least about 95% of all particles (based on total weight of all particles) are microflakes. In one embodiment, at least about 99% of all particles (based on total weight of all particles) are microflakes. In one embodiment, all particles are microflakes. In yet another embodiment, all particles are microflakes and/or nanoflakes. Substantially each of the microflakes contains at least one element from group IB, IIIA and/or VIA, wherein overall amounts of elements from group IB, IIIA and/or VIA contained in the ink are such that the ink has a desired or close to a desired stoichiometric ratio of the elements for at least the elements of group IB and IIIA. The method includes coating a substrate with the ink to form a precursor layer and processing the precursor layer in a suitable atmosphere to form a dense film. The dense film may be used in the formation of a semiconductor absorber for a photovoltaic device. The film may comprise of a fused version of the precursor layer which comprises of a plurality of individual particles which are unfused.

In yet another embodiment of the present invention, a material is provided that comprises of a plurality of microflakes having a material composition containing at least one element from groups IB, IIIA, and/or VIA. The microflakes are created by milling or size reducing precursor particles characterized by a precursor composition that provides sufficient malleability to form a planar shape from a non-planar and/or planar starting shape when milled or size reduced, and wherein overall amounts of elements from groups IB, IIIA and/or VIA contained in the precursor particles combined are at a desired or close to a desired stoichiometric ratio of the elements for at least the elements of groups IB and IIIA. In one embodiment, planar includes those that particles that are wide in two dimensions, thin in every other dimension. The milling may transform substantially all of the precursor particles into microflakes. Alternatively, the milling transforms at least about 50% of the precursor particles into microflakes. The milling may occur in an oxygen-free atmosphere to create oxygen-free microflakes. The milling may occur in an inert gas environment to create oxygen-free microflakes. These non-spherical particles may be microflakes that have its largest dimension (thickness and/or length and/or width) greater than about 20 nm, since sizes smaller than that tend to create less efficient solar cells. Milling can also be chilled and occur at a temperature lower than room temperature to allow milling of particles composed of low melting point material. In other embodiments, milling may occur at room temperature. Alternatively, milling may occur at temperatures greater than room temperature to obtain the desired malleability of the material. In one embodiment of the present invention, the material composition of the feedstock particles preferably exhibits a malleability that allows non-planar feedstock particles to be formed into substantially planar microflakes at the appropriate temperature. In one embodiment, the microflakes have at least one surface that is substantially flat.

In a still further embodiment according to the present invention, a solar cell is provided that comprises of a substrate, a back electrode formed over the substrate, a p-type semiconductor thin film formed over the back electrode, an n-type semiconductor thin film formed so as to constitute a pn junction with the p-type semiconductor thin film, and a transparent electrode formed over the n-type semiconductor thin film. The p-type semiconductor thin film results by processing a dense film formed from a plurality of microflakes having a material composition containing at least one element from Groups IB, IIIA, and/or VIA, wherein the dense film has a void volume of 26% or less. In one embodiment, this number may be based on free volume of packed spheres of different diameter to minimize void volume. In another embodiment of the invention, the dense film has a void volume of about 30% or less.

In another embodiment of the present invention, a method is provided for forming a film by using particles with particular properties. The properties may be based on particle size, shape, composition, and morphology distribution. As a non-limiting example, the particles may be microflakes within a desired size range. Within the microflakes, the morphology may include particles that are amorphous, those that are crystalline, those that are more crystalline than amorphous, and those that are more amorphous than crystalline. The properties may also be based on interparticle composition and morphology distribution. In one embodiment of the present invention, it should be understood that the resulting flakes have a morphology where the flakes are less crystalline than the feedstock material from which the flakes are formed.

In yet another embodiment of the present invention, the method comprises formulating an ink of particles wherein about 50% or more of the particles (based on the total weight of all particles) are flakes each containing at least one element from group IB, IIIA and/or VIA and having a non-spherical, planar shape, wherein overall amounts of elements from group IB, IIIA and/or VIA contained in the ink are such that the ink has a desired stoichiometric ratio of the elements. In another embodiment, 50% or more may be based on the number of particles versus the total number of particles in the ink. In yet another embodiment, at least about 75% or more of the particles (by weight or by number) are microflakes. The method includes coating a substrate with the ink to form a precursor layer and processing the precursor layer in a suitable processing condition to form a film. The film may be used in the formation of a semiconductor absorber for a photovoltaic device. It should be understood that suitable processing conditions may include, but are not limited to, atmosphere composition, pressure, and/or temperature. In one embodiment, substantially all of the particles are flakes with a non-spherical, planar shape. In one embodiment, at least 95% of all particles (based on weight of all particles combined) are flakes. In another embodiment, at least 99% of all particles (based on weight of all particles combined) are flakes. The flakes may be comprised of microflakes. In other embodiments, the flakes may be comprised of both microflakes and nanoflakes.

It should be understood that the planar shape of the microflakes may provide a number of advantages. As a non-limiting example, the planar shape may create greater surface area contact between adjacent microflakes that allows the dense film to form at a lower temperature and/or shorter time as compared to a film made from a precursor layer using an ink of spherical nanoparticles wherein the nanoparticles have a substantially similar material composition and the ink is otherwise substantially identical to the ink of the present invention. The planar shape of the microflakes may also create greater surface area contact between adjacent microflakes that allows the dense film to form at an annealing temperature at least about 50 degrees C. less as compared to a film made from a precursor layer using an ink of spherical nanoparticles that is otherwise substantially identical to the ink of the present invention.

The planar shape of the microflakes may create greater surface area contact between adjacent microflakes relative to adjacent spherical nanoparticles and thus promotes increased atomic intermixing as compared to a film made from a precursor layer made from an ink of the present invention. The planar shape of the microflakes creates a higher packing density in the dense film as compared to a film made from a precursor layer made from an ink of spherical nanoparticles of the same composition that is otherwise substantially identical to the ink of the present invention.

The planar shape of the microflakes may also create a packing density of at least about 70% in the precursor layer. The planar shape of the microflakes may create a packing density of at least about 80% in the precursor layer. The planar shape of the microflakes may create a packing density of at least about 90% in the precursor layer. The planar shape of the microflakes may create a packing density of at least about 95% in the precursor layer. Packing density may be mass/volume, solids/volume, or non-voids/volume.

The planar shape of the microflakes results in grain sizes of at least about 1 micron in the semiconductor absorber of a photovoltaic device. The planar shape of the microflakes may results in grain sizes of at least about 0.5 µm in at least one dimension in the semiconductor absorber of a photovoltaic device. In other embodiments, the microflakes results in grain sizes of at least about 0.1 µm in at least one dimension in the semiconductor absorber of a photovoltaic device. In still further embodiments, the microflakes results in grain sizes of at least about 0.1 µm in at least one dimension in the semiconductor absorber of a photovoltaic device. The planar shape of the microflakes may result in grain sizes of at least about 0.3 µm wide in the semiconductor absorber of a photovoltaic device. In other embodiments, the planar shape of the microflakes results in grain sizes of at least about 0.3 µm wide in the semiconductor absorber of a photovoltaic device when the microflakes are formed from one or more of the following: copper selenide, indium selenide, or gallium selenide.

The planar shape of the microflakes provides a material property to avoid rapid and/or preferential settling of the particles when forming the precursor layer. The planar shape of the microflakes provides a material property to avoid rapid and/or preferential settling of microflakes having different material compositions, when forming the precursor layer. The planar shape of the microflakes provides a material property to avoid rapid and/or preferential settling of microflakes having different particle sizes, when forming the precursor layer. The planar shape of the microflakes provides a material property to avoid grouping of microflakes in the ink and thus enables the microflakes to provide a good coating.

The planar shape of the microflakes provides a material property to avoid undesired grouping of microflakes of a particular class in the ink and thus enables an evenly dispersed solution of microflakes. The planar shape of the microflakes provides a material property to avoid undesired grouping of microflakes of a specific material composition in the ink and thus enables an evenly dispersed solution of microflakes. The planar shape of the microflakes provides a material property to avoid grouping of microflakes of a specific phase separation in the precursor layer resulting from the ink. The microflakes have a material property that reduces surface tension at interface between microflakes in the ink and a carrier fluid to improve dispersion quality.

In one embodiment of the present invention, the ink may be formulated by use of a low molecular weight dispersing agent whose inclusion is effective due to favorable interaction of the dispersing agent with the planar shape of the microflakes. The ink may be formulated by use of a carrier liquid and without a dispersing agent. The planar shape of the microflakes provides a material property to allow for a more even distribution of group IIIA material throughout in the dense film as compared to a film made from a precursor layer made from an ink of spherical nanoparticles that is otherwise substantially identical to the ink of the present invention. In another embodiment, the microflakes may be of random planar shape and/or a random size distribution.

The microflakes may be of non-random planar shape and/or a non-random size distribution. The microflakes may each have a length less than about 5 microns and greater than about 500 nm. The microflakes may each have a length between about 3 microns and about 500 nm. The particles may be microflakes having lengths of greater than about 500 nm. The particles may be microflakes having lengths of greater than about 750 nm. The microflakes may each have a thickness of about 100 nm or less. The particles may be microflakes having thicknesses of about 75 nm or less. The particles may be microflakes having thicknesses of about 50 nm or less. The microflakes may each have a thickness less than about 20 nm. The microflakes may have lengths of less than about 2 microns and thicknesses of less than about 100 nm. The microflakes may have lengths of less than about 1 microns and a thicknesses of less than about 50 nm. The microflakes may have an aspect ratio of at least about 10 or more. The microflakes have an aspect ratio of at least about 15 or more.

The microflakes may be oxygen-free. The microflakes may be a single metal. The microflakes may be an alloy of group IB, IIIA elements. The microflakes may be a binary alloy of group IB, IIIA elements. The microflakes may be a ternary alloy of group IB, IIIA elements. The microflakes may be a quaternary alloy of group IB, IIIA, and/or VIA elements. The microflakes may be group IB-chalcogenide particles and/or group IIIA-chalcogenide particles. Again, the particles may be particles that are substantially oxygen-free, which may include those that include less than about 1 wt % of oxygen. Other embodiments may use materials with less than about 5 wt % of oxygen. Still other embodiments may use materials with less than about 3 wt % oxygen. Still other embodiments may use materials with less than about 2 wt % oxygen. Still other embodiments may use materials with less than about 0.5 wt % oxygen. Still other embodiments may use materials with less than about 0.1 wt % oxygen.

In one embodiment of the present invention, the coating step occurs at room temperature. The coating step may occur at atmospheric pressure. The method may further comprise depositing a film of selenium onto the dense film. The processing step may be accelerated via thermal processing techniques using at least one of the following: pulsed thermal processing, exposure to a laser beam, or heating via IR lamps, and/or similar or related methods. The processing may comprise of heating the precursor layer to a temperature greater than about 375° C. but less than a melting temperature of the substrate for a period of less than 15 minutes. The processing may comprise of heating the precursor layer to a temperature greater than about 375° C. but less than a melting temperature of the substrate for a period of 1 minute or less. In another embodiment of the present invention, processing may be comprised of heating the precursor layer to an annealing temperature but less than a melting temperature of the substrate for a period of 1 minute or less. The suitable atmosphere may be comprised of a hydrogen atmosphere. In another embodiment of the present invention, the suitable atmosphere comprises a nitrogen atmosphere. In yet another embodiment, the suitable atmosphere comprises a carbon monoxide atmosphere. The suitable atmosphere may be comprised of an atmosphere having less than about 10% hydrogen. The suitable atmosphere may be comprised of an atmosphere containing selenium. The suitable atmosphere may be comprised of an atmosphere of a non-oxygen chalcogen. In one embodiment of the present invention, the suitable atmosphere may comprise of a selenium atmosphere providing a partial pressure greater than or equal to vapor pressure of selenium in the precursor layer. In another embodiment, the suitable atmosphere may comprise of a non-oxygen atmosphere containing chalcogen vapor at a partial pressure of the chalcogen greater than or equal to a vapor pressure of the chalcogen at the processing temperature and processing pressure to minimize loss of chalcogen from the precursor layer, wherein the processing pressure is a non-vacuum pressure. In yet another embodiment, the chalcogen atmosphere may be used with one or more binary chalcogenides (in any shape or form) at a partial pressure of the chalcogen greater than or equal to a vapor pressure of the chalcogen at the processing temperature and processing pressure to minimize loss of chalcogen from the precursor layer, wherein optionally, the processing pressure is a non-vacuum pressure.

In yet another embodiment of the present invention, prior to the step of formulating the ink, there is included a step of creating microflakes. The creating step comprises of providing feedstock particles containing at least one element of groups IB, IIIA, and/or VIA, wherein substantially each of the feedstock particles have a composition of sufficient malleability to form a planar shape from a non-planar starting shape and milling the feedstock particles to reduce at least the thickness of each particle to less than 100 nm. The milling step may occur in an oxygen-free atmosphere to create substantially oxygen-free microflakes. In some embodiments of the present invention, microflakes may have lengths of greater than about 500 nm. In some embodiments of the present invention, microflakes may have lengths of greater than about 750 nm. The microflakes may have thicknesses of at least about 75 nm. The substrate may be a rigid substrate. The substrate may be a flexible substrate. The substrate may be an aluminum foil substrate or a polymer substrate, which is a flexible substrate in a roll-to-roll manner (either continuous or segmented) using a commercially available web coating system. The rigid substrate may be comprised of at least one material selected from the group: glass, soda-lime glass, steel, stainless steel, aluminum, polymer, ceramic, metal plates, metallized ceramic plates, metallized polymer plates, metallized glass plates, and/or any single or multiple combination of the aforementioned. The substrate may be at different temperatures than the precursor layer during processing. This may enable the substrate to use materials that would melt or become unstable at the processing temperature of the precursor layer. Optionally, this may involve actively cooling the substrate during processing.

In yet another embodiment of the present invention, a method is provided for formulating an ink of particles wherein a majority of the particles are microflakes each containing at least one element from group IB, IIIA and/or VIA and having a non-spherical, planar shape, wherein the overall amounts of the elements from group IB, IIIA and/or VIA contained in the ink are such that the ink has a desired stoichiometric ratio of the elements. The method may include coating a substrate with the ink to form a precursor layer, and processing the precursor layer to form a dense film for growth of a semiconductor absorber of a photovoltaic device. In one embodiment, at least 60% of the particles (by weight or by number) are microflakes. In yet another embodiment, at least 70% of the particles (by weight or by number) are microflakes. In another embodiment, at least 80% of the particles (by weight or by number) are microflakes. In another embodiment, at least 90% of the particles (by weight or by number) are microflakes. In another embodiment, at least 95% of the particles (by weight or by number) are microflakes.

In another embodiment, a liquid ink may be made using one or more liquid metals. For example, an ink may be made starting with a liquid and/or molten mixture of Gallium and/or Indium. Copper nanoparticles may then be added to the mixture, which may then be used as the ink/paste. Copper nanoparticles are available commercially. Alternatively, the temperature of the Cu—Ga—In mixture may be adjusted (e.g. cooled) until a solid forms. The solid may be ground at that temperature until small nanoparticles (e.g., less than 5 nm) are present. Selenium may be added to the ink and/or a film formed from the ink by exposure to selenium vapor, e.g., before, during, or after annealing.

In yet another embodiment of the present invention, a process is described comprising of formulating a dispersion of solid and/or liquid particles comprising group IB and/or IIIA elements, and, optionally, at least one group VIA element. The process includes depositing the dispersion onto a substrate to form a layer on the substrate and reacting the layer in a suitable atmosphere to form a film. In this process, at least one set of the particles are inter-metallic particles containing at least one group IB-IIIA inter-metallic phase. Any of the above embodiments may use flakes (micro flakes or nanoflakes) that contain an inter-metallic phase as described herein.

In yet another embodiment of the present invention, a composition is provided comprised of a plurality of particles comprising group IB and/or IIIA elements, and, optionally, at least one group VIA element. At least one set of the particles contains at least one group IB-IIIA inter-metallic alloy phase.

In a still further embodiment of the present invention, the method may include formulating a dispersion of particles comprising group IB and/or IIIA elements, and, optionally, at least one group VIA element. The method may include depositing the dispersion onto a substrate to form a layer on the substrate and reacting the layer in a suitable atmosphere to form a film. At least one set of the particles contain a group IB-poor, group IB-IIIA alloy phase. In some embodiments, group IB-poor particles contribute less than about 50 molar percent of group IB elements found in all of the particles. The group IB-poor, group IB-IIIA alloy phase particles may be a sole source of one of the group IIIA elements. The group IB-poor, group IB-IIIA alloy phase particles may contain an inter-metallic phase and may be a sole source of one of the group IIIA elements. The group IB-poor, group IB-IIIA alloy phase particles may contain an inter-metallic phase and are a sole source of one of the group IIIA elements. The group IB-poor, group IB-IIIA alloy phase particles may be $Cu_1In_2$ particles and are a sole source of indium in the material.

It should be understood that for any of the foregoing the film and/or final compound may include a group IB-IIIA-VIA compound. The reacting step may comprise of heating the layer in the suitable atmosphere. The depositing step may include coating the substrate with the dispersion. At least one set of the particles in the dispersion may be in the form of nanoglobules. At least one set of the particles in the dispersion may be in the form of nanoglobules and contain at least one group IIIA element. At least one set of the particles in the dispersion may be in the form of nanoglobules comprising of a group IIIA element in elemental form. In some embodiments of the present invention, the inter-metallic phase is not a terminal solid solution phase. In some embodiments of the present invention, the inter-metallic phase is not a solid solution phase. The inter-metallic particles may contribute less than about 50 molar percent of group IB elements found in all of the particles. The inter-metallic particles may contribute less than about 50 molar percent of group IIIA elements found in all of the particles. The inter-metallic particles may contribute less than about 50 molar percent of the group IB elements and less than about 50 molar percent of the group IIIA elements in the dispersion deposited on the substrate. The inter-metallic particles may contribute less than about 50 molar percent of the group IB elements and more than about 50 molar percent of the group IIIA elements in the dispersion deposited on the substrate. The inter-metallic particles may contribute more than about 50 molar percent of the group IB elements and less than about 50 molar percent of the group IIIA elements in the dispersion deposited on the substrate. The molar percent for any of the foregoing may be based on a total molar mass of the elements in all particles present in the dispersion. In some embodiments, at least some of the particles have a platelet shape. In some embodiments, a majority of the particles have a platelet shape. In other embodiments, substantially all of the particles have a platelet shape.

For any of the foregoing embodiments, an inter-metallic material for use with the present invention is a binary material. The inter-metallic material may be a ternary material. The inter-metallic material may comprise of $Cu_1In_2$. The inter-metallic material may be comprised of a composition in a δ phase of $Cu_1In_2$. The inter-metallic material may be comprised of a composition in between a δ phase of $Cu_1In_2$ and a phase defined by Cu16In9. The inter-metallic material may be comprised of $Cu_1Ga_2$. The inter-metallic material may be comprised of an intermediate solid-solution of $Cu_1Ga_2$. The inter-metallic material may be comprised of $Cu_{68}Ga_{38}$. The inter-metallic material may be comprised of $Cu_{70}Ga_{30}$. The intermetallic material may be comprised of $Cu_{75}Ga_{25}$. The inter-metallic material may be comprised of a composition of Cu—Ga of a phase in between the terminal solid-solution and an intermediate solid-solution next to it. The inter-metallic may be comprised of a composition of Cu—Ga in a γ1 phase (about 31.8 to about 39.8 wt % Ga). The inter-metallic may be comprised of a composition of Cu—Ga in a γ2 phase (about 36.0 to about 39.9 wt % Ga). The inter-metallic may be comprised of a composition of Cu—Ga in a γ3 phase (about 39.7 to about −44.9 wt % Ga). The inter-metallic may be comprised of a composition of Cu—Ga in a phase between γ2 and γ3. The inter-metallic may be comprised of a composition of Cu—Ga in a phase between the terminal solid solution and γ1. The inter-metallic may be comprised of a composition of Cu—Ga in a θ phase (about 66.7 to about 68.7 wt % Ga). The inter-metallic material may be comprised of Cu-rich Cu—Ga. Gallium may be incorporated as a group IIIA element in the form of a suspension of nanoglobules. Nanoglobules of gallium may be formed by creating an emulsion of liquid gallium in a solution. Gallium nanoglobules may be created by being quenched below room temperature.

A process according to the any of the foregoing embodiments of the present invention may include maintaining or enhancing a dispersion of liquid gallium in solution by stirring, mechanical means, electromagnetic means, ultrasonic means, and/or the addition of dispersants and/or emulsifiers. The process may include adding a mixture of one or more elemental particles selected from: aluminum, tellurium, or sulfur. The suitable atmosphere may contain selenium, sulfur, tellurium, $H_2$, CO, $H_2Se$, $H_2S$, Ar, $N_2$ or combinations or mixture thereof. The suitable atmosphere may contain at least one of the following: $H_2$, CO, Ar, and $N_2$. One or more classes of the particles may be doped with one or more inorganic materials. Optionally, one or more classes of the particles are doped with one or more inorganic materials chosen from the group of aluminum (Al), sulfur (S), sodium (Na), potassium (K), or lithium (Li).

Optionally, embodiments of the present invention may include having a copper source that does not immediately alloy with In, and/or Ga. One option would be to use (slightly) oxidized copper. The other option would be to use CuxSey. Note that for the (slightly) oxidized copper approach, a reducing step may be desired. Basically, if elemental copper is used in liquid In and/or Ga, speed of the process between ink preparation and coating should be sufficient so that the particles have not grown to a size that will result in thickness non-uniform coatings.

It should be understood that the temperature range may that of the substrate only since that is typically the only one that should not be heated above its melting point. This holds for the lowest melting material in the substrate, being Al and other suitable substrates.

In yet another embodiment of the present invention, a material is provided that comprises of a plurality of microflakes having a material composition containing at least one element from Groups IB, IIIA, and/or VIA. The microflakes may be created by milling precursor particles characterized by a precursor composition that provides sufficient malleability to form a planar shape from a non-planar starting shape when milled, and wherein overall amounts of elements from Groups IB, IIIA and/or VIA contained in the precursor particles combined are at a desired stoichiometric ratio of the elements. It should also be understood that other flakes such as but not limited to nanoflakes may also be used to form the precursor material.

In one embodiment of the present invention, the milling transforms at least about 50% of the precursor particles into microflakes. In other embodiments, milling transforms at least about 95% of the precursor particles into microflakes. This may be by percent weight of all of the particles or based only on the number of particles. Optionally, the milling transforms substantially all of the precursor particles into microflakes. The precursor particles may be about 10 microns or larger when measured along their longest dimension. The milling may occur in an oxygen free atmosphere to create oxygen free microflakes. The milling may occur in an inert gas environment to create oxygen free microflakes. The milling may occur at room temperature. The milling may occur at a cryogenic temperature. The milling may occur at a milling temperature wherein all elements in the precursor particles are solids and have the precursor particles have a sufficient ductility at the milling temperature to form the planar shape from the non-planar starting shape. The milling may occur at a temperature less than about 15 degrees C. The milling may occur at a temperature less than about −200 degrees C.

Optionally, the precursor particles may be single metal particles. The precursor particles may be elemental particles. The precursor particles may be alloy particles. The precursor particles may be binary alloy particles. The precursor particles may be ternary alloy particles. The precursor particles may be quaternary alloy particles. The precursor particles may be solid solution particles. The microflakes may be comprised of only Group IIIA materials. The microflakes may be comprised of only Group IB and Group IIIA materials. The microflakes may be comprised of only Group IB and Group VIA materials. The microflakes may be comprised of only Group IIIA and Group VIA materials. The molar ratio of Group IB material to Group IIIA material in the plurality of microflakes may be larger than about 1.0. The precursor particles may be elemental particles and wherein milling forms alloy microflakes from the elemental particles. The precursor particles may be chalcogenide particles characterized by a stoichiometric ratio of elements that provides the precursor particles with sufficient ductility to form a planar shape from a non-planar starting shape. The precursor particles may be selected from one of the following: copper selenide, indium selenide, or gallium selenide. The stoichiometric ratio of elements may vary between microflakes so long as the overall amount in all of the microflakes combined is at the desired stoichiometric ratio. The material may have been size discriminated such that the microflakes to exclude microflakes above a desired length. The microflakes may exclude microflakes above a desired thickness. The size variation may be controlled such that the microflakes deviate less than about 30% from the mean length and about 30% from mean thickness. The particle size distribution may be such that one standard deviation from a mean length of the microflakes is less than 100 nm. The particle size distribution may be such that one standard deviation from a mean length of the microflakes is less than 50 nm. The particle size distribution may be such that one standard deviation from a mean thickness of the microflakes is less than 10 nm. The particle size distribution may be such that one standard deviation from a mean thickness of the microflakes is less than 5 nm. The particle size distribution may be such that substantially each of the microflakes has a thickness about 100 nm or less. The particle size distribution may be such that microflakes are substantially void free particles.

Optionally, the microflakes may have a coating with at least one layer of material containing a group VIA element. The microflakes may have a coating the microflakes with at least one layer of material containing selenium and/or a selenide. The microflakes may form a dry powder. The microflakes may have an aspect ratio of at least about 10 or more. The microflakes may have an aspect ratio of at least about 15 or more.

In a still further embodiment of the present invention, a solar cell is provided that comprises of a substrate, a back electrode formed over the substrate, a p-type semiconductor thin film formed over the back electrode, an n-type semiconductor thin film formed so as to constitute a pn junction with the p-type semiconductor thin film, and a transparent electrode formed over the n-type semiconductor thin film. The p-type semiconductor thin film results by processing a dense film formed from a plurality of microflakes having a material composition containing at least one element from Groups IB, IIIA, and/or VIA, wherein the dense film has a void volume of about 26% or less. The dense film may be a substantially void free film.

Optionally, the molar ratio of Group IB material to Group IIIA material in the plurality of microflakes is larger than 1.0. The microflakes may be substantially oxygen free microflakes. The microflakes may be single metal particles. The microflakes may be elemental particles. The microflakes may be alloy particles. The microflakes may be binary alloy particles. The microflakes may be ternary alloy particles. The microflakes may be quaternary alloy particles. The microflakes may be solid solution particles. The microflakes may comprise of only Group IIIA materials. The microflakes may comprise of only Group IB and Group IIIA materials. The microflakes may comprise of only Group IB and Group VIA materials. The microflakes may comprise of only Group IIIA and Group VIA materials. The microflakes may be selected from one of the following: copper selenide, indium selenide, or gallium selenide. The microflakes may have a size distribution such that one standard deviation from a mean length of the microflakes is less than 100 nm. The microflakes may have a size distribution such that one standard deviation from a mean length of the microflakes is less than 50 nm. The microflakes may have a size distribution such that one standard deviation from a mean thickness of the microflakes is less than 10 nm. The microflakes may have a size distribution such that one standard deviation from a mean thickness of the microflakes is less than 5 nm. The microflakes may have a composition such that the stoichiometric ratio of elements varies between microflakes so long as the overall amount in all of the particles combined is at the desired stoichiometric ratio. The microflakes may have an aspect ratio of at least about 10 or more. The microflakes may have an aspect ratio of at least about 15 or more. The microflakes may have a random planar shape and/or a random size distribution. The microflakes may be of non-random planar shape and/or a non-random size distribution. The microflakes may each have a thickness less than about 100 nm. The microflakes may each have a thickness less than about 20 nm. The microflakes may each have a length and/or largest lateral dimension of less than about 2 microns and a thickness of less than 100 nm. The microflakes may have a length of less than about 1 microns and a thickness of less than 50 nm.

Optionally, the film may be formed by heating a precursor layer of microflakes to a temperature greater than about 375° C. but less than a melting temperature of the substrate for a period of 1 minute or less. The dense film may be formed by heating a precursor layer of microflakes to an annealing temperature but less than a melting temperature of the substrate for a period of 1 minute or less. Dense film formation may be accelerated via thermal processing techniques using at least one of the following: pulsed thermal processing, laser beams, or heating via IR lamps. The substrate may be a flexible substrate. The substrate may be a rigid substrate.

A further understanding of the nature and advantages of the invention will become apparent by reference to the remaining portions of the specification and drawings.

BRIEF DESCRIPTION OF THE DRAWINGS

FIGS. 13A-13F show the use of a chemical gradient according to one embodiment of the present invention.

FIG. 14 shows a roll-to-roll system according to the present invention.

DESCRIPTION OF THE SPECIFIC EMBODIMENTS

Figure 1A:
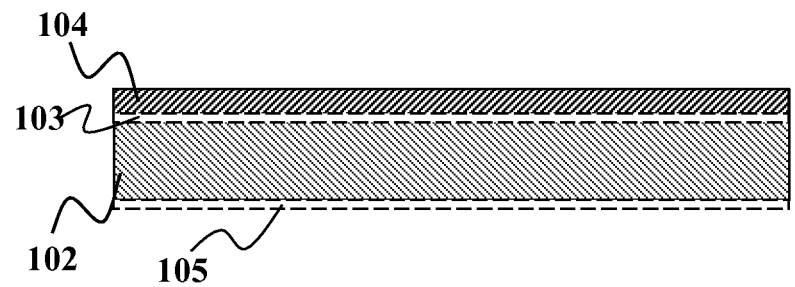
FIGS. 1A-1D are schematic cross-sectional diagrams illustrating fabrication of a film according to an embodiment of the present invention.

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

According to embodiments of the present invention, an active layer for a photovoltaic device may be fabricated by first formulating an ink of non-spherical particles each containing at least one element from groups IB, IIIA and/or VIA, coating a substrate with the ink to form a precursor layer, and heating the precursor layer to form a dense film. Optionally, it should be understood that in some embodiments, densification of the precursor layer may not be needed, particularly if the precursor materials are oxygen-free or substantially oxygen free. Thus, the heating step may optionally be skipped if the particles are processed air-free and are oxygen-free. In a preferred embodiment, the non-spherical particles are microflakes that are substantially planar in shape. The dense film may be processed in a suitable atmosphere to form a group IB-IIIA-VIA compound. The resulting group IB-IIIA-VIA compound is preferably a compound of Cu, In, Ga and selenium (Se) or sulfur S of the form $CuIn_{(1-x)}Ga_xS_{2(1-y)}Se_{2y}$, where $0 \leq x \leq 1$ and $0 \leq y \leq 1$. It should also be understood that the resulting group IB-IIIA-VIA compound may be a compound of Cu, In, Ga and selenium (Se) or sulfur S of the form $Cu_z In_{(1-x)} Ga_x S_{2(1-y)} Se_{2y}$, where $0.5 \leq z \leq 1.5$, $0 \leq x \leq 1.0$ and $0 \leq y \leq 1.0$.

It should be understood that group IB, IIIA, and VIA elements other than Cu, In, Ga, Se, and S may be included in the description of the IB-IIIA-VIA materials described herein, and that the use of a hyphen ("-" e.g., in Cu—Se or Cu—In—Se) does not indicate a compound, but rather indicates a coexisting mixture of the elements joined by the hyphen. It is also understood that group IB is sometimes referred to as group 11, group IIIA is sometimes referred to as group 13 and group VIA is sometimes referred to as group 16. Furthermore, elements of group VIA (16) are sometimes referred to as chalcogens. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) or indium (In). Group VIA elements of interest include selenium (Se), sulfur (S), and tellurium (Te), and preferably the group VIA element is either Se and/or S. It should be understood that mixtures such as, but not limited to, alloys, solid solutions, and compounds of any of the above can also be used.

Method of Forming a Film

Referring now to FIG. 1, one method of forming a semiconductor film according to the present invention will now be described. It should be understood that the present embodiment of the invention uses non-vacuum techniques to form the semiconductor film. Other embodiments, however, may form the film under a vacuum environment, and the present invention using non-spherical particles is not limited to only non-vacuum coating techniques.

As seen in FIG. 1A, a substrate 102 is provided on which the precursor layer 106 (see FIG. 1B) will be formed. By way of non-limiting example, the substrate 102 may be made of a metal such as aluminum. In other embodiments, metals such as, but not limited to, stainless steel, molybdenum, titanium, copper, metallized plastic films, or combinations of the foregoing may be used as the substrate 102. Alternative substrates include but are not limited to ceramics, glasses, and the like. Any of these substrates may be in the form of foils, sheets, rolls, the like, or combinations thereof. Depending on the material of the substrate 102, it may be useful to coat a surface of the substrate 102 with a contact layer 104 to promote electrical contact between the substrate 102 and the absorber layer that is to be formed on it, and/or to limit reactivity of the substrate 102 in subsequent steps, and/or to promote higher quality absorber growth. As a non-limiting example, when the substrate 102 is made of aluminum, the contact layer 104 may be but is not limited to a layer of molybdenum. For the purposes of the present discussion, the contact layer 104 may be regarded as being part of the substrate. As such, any discussion of forming or disposing a material or layer of material on the substrate 102 includes disposing or forming such material or layer on the contact layer 104, if one is used. Optionally, other layers of materials may also be used with the contact layer 104 for insulation or other purposes and still considered part of the substrate 102. It should be understood that the contact layer 104 may comprise of more than one type or more than one discrete layer of material. Optionally, some embodiments may use any one and/or combinations of the following for the contact layer: a copper, aluminum, chromium, molybdenum, vanadium, etc. and/or iron-cobalt alloys. Optionally, a diffusion barrier layer 103 (shown in phantom) may be included and layer 103 may be electrically conductive or electrically non-conductive. As non-limiting examples, the layer 103 may be composed of any of a variety of materials, including but not limited to chromium, vanadium, tungsten, or compounds such as nitrides (including tantalum nitride, tungsten nitride, titanium nitride, silicon nitride, zirconium nitride, and/or hafnium nitride), oxides (including Al2O3 or SiO2), carbides (including SiC), and/or any single or multiple combination of the foregoing. Optionally, a diffusion barrier layer 105 (shown in phantom) may be on the underside of substrate 102 and be comprised of a material such as but not limited to chromium, vanadium, tungsten, or compounds such as nitrides (including tantalum nitride, tungsten nitride, titanium nitride, silicon nitride, zirconium nitride, and/or hafnium nitride), oxides (including Al2O3 or SiO2), carbides (including SiC), and/or any single or multiple combination of the foregoing. The layers 103 and/or 105 may be adapted for use with any of the embodiments described herein.

Figure 1B:
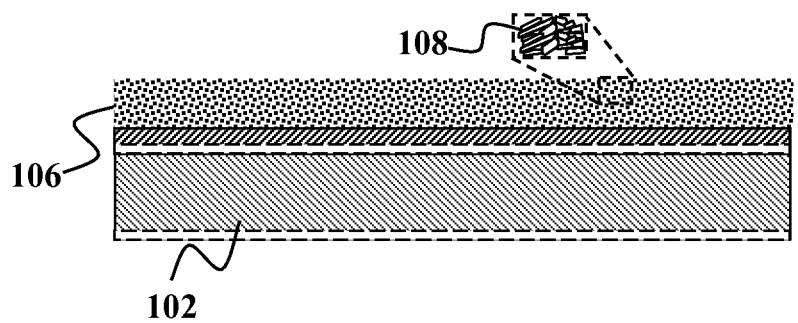

Referring now to FIG. 1B, a precursor layer 106 is formed over the substrate 102 by coating the substrate 102 with a dispersion such as but not limited to an ink. As one non-limiting example, the ink may be comprised of a carrier liquid mixed with particles such as but not limited to microflakes 108 and has a rheology that allows the ink to be solution-deposited over the substrate 102. In one embodiment, the present invention may use a single dry powder or a mixture of two or more dry powders mixed with the vehicle containing or not containing a dispersant, and sonicated before coating. Optionally, the inks may be already formulated as the precursor materials are formed in a horizontal bead mill. In the case of mixing a plurality of flake compositions, the product may be mixed from various mills. This mixing could be by sonication but other forms of mechanical agitation and/or another mill may also be used. The ink used to form the precursor layer 106 may contain non-spherical particles 108 such as but not limited to microflakes and/or nanoflakes. It should also be understood that the ink may optionally use both non-spherical and spherical particles in any of a variety of relative proportions.

FIG. 1B includes a close-up view of the particles in the precursor layer 106, as seen in the enlarged image. Although not limited to the following, the particles may be microflakes 108 that have non-spherical shapes and are substantially planar on at least one side. A more detailed view of one embodiment of the microflakes 108 can be found in FIGS. 2A and 2B of U.S. patent application Ser. No. 11/362,266, now abandoned filed Feb. 23, 2006 and fully incorporated herein by reference. Microflakes may be defined as particles having at least one substantially planar surface with a length and/or largest lateral dimension of about 500 nm or more and the particles have an aspect ratio of about 2 or more. In other embodiments, the microflake is a substantially planar structure with thickness of between about 10 and about 250 nm and lengths between about 500 nm and about 5 microns. It should be understood that in other embodiments of the invention, microflakes may have lengths as large as 10 microns. Although not limited to the following, at least some of the solid group IIIA-particles may be processed into planar particles and adapted for use during solution deposition.

It should be understood that different types of microflakes 108 may be used to form the precursor layer 106. In one nonlimiting example, the microflakes are elemental microflakes, i.e., microflakes having only a single atomic species. The microflakes may be single metal particles of Cu, Ga, In, or Se. Some inks may have only one type of microflake. Other inks may have two or more types of microflakes which may differ in material composition and/or other quality such as but not limited to shape, size, interior architecture (e.g. a central core surrounded by one or more shell layers) exterior coating, or the like. In one embodiment, the ink used for precursor layer 106 may contain microflakes comprising one or more group IB elements and microflakes comprising one or more different group IIIA elements. Preferably, the precursor layer (106) contains copper, indium and gallium. In another embodiment, the precursor layer 106 may be an oxygen-free layer containing copper, indium and gallium. Optionally, the ratio of elements in the precursor layer may be such that the layer, when processed, forms a compound of $CuIn_xGa_{1-x}$, where $0 \leq x \leq 1$. Those of skill in the art will recognize that other group IB elements may be substituted for Cu and other group IIIA elements may be substituted for In and Ga. Optionally, the precursor may contain Se as well, such as but not limited to Cu—In—Ga—Se plates. This is feasible if the precursor is oxygen-free and densification is not needed. In still further embodiments, the precursor material may contain microflakes of group IB, IIIA, and VIA elements. In one nonlimiting example, the precursor may contain Cu—In—Ga—Se microflakes, which would be particularly advantageous if the microflakes are formed air free and densification prior to film formation is not needed.

Optionally, the microflakes 108 in the ink may be alloy microflakes. In one nonlimiting example, the microflakes may be binary alloy microflakes such as but not limited to Cu—In, In—Ga, or Cu—Ga. Alternatively, the microflakes may be a binary alloy of group IB, IIIA elements, a binary alloy of Group IB, VIA elements, and/or a binary alloy of group IIIA, VIA elements. In other embodiments, the particles may be a ternary alloy of group IB, IIIA, and/or VIA elements. For example, the particles may be ternary alloy particles of any of the above elements such as but not limited to Cu—In—Ga. In other embodiments, the ink may contain particles that are a quaternary alloy of group IB, IIIA, and/or VIA elements. Some embodiments may have quaternary or multi-nary microflakes. The ink may also combine microflakes of different classes such as but not limited to elemental microflakes with alloy microflakes or the like. In one embodiment of the present invention, the microflakes used to form the precursor layer 106 contains no oxygen other than those amounts unavoidably present as impurities. Optionally, the microflakes contain less than about 0.1 wt % of oxygen. In other embodiments, the microflakes contain less than about 0.5 wt % of oxygen. In still further embodiments, the microflakes contain less than about 1.0 wt % of oxygen. In yet another embodiment, the microflakes contain less than about 3.0 wt % of oxygen. In other embodiments, the microflakes contain less than about 5.0 wt % of oxygen.

Optionally, the microflakes 108 in the ink may be chalcogenide particles, such as but not limited to, a group IB or group IIIA selenide. In one nonlimiting example, the microflakes may be a group IB-chalcogenide formed with one or more elements of group IB (new-style: group 11), e.g., copper (Cu), silver (Ag), and gold (Au). Examples include, but are not limited to, $Cu_xSe_y$, wherein x is in the range of about 1 to 10 and y is in the range of about 1 to 10. In some embodiments of the present invention, x<y. Alternatively, some embodiments may have selenides that are more selenium rich, such as but not limited to, $Cu_1Se_x$ (where x>1). This may provide an increased source of selenium as discussed in commonly assigned, co-pending U.S. patent application Ser. No. 11/243,522, now abandoned filed on Feb. 23, 2006 and fully incorporated herein by reference. In another nonlimiting example, the microflakes may be a group IIIA-chalcogenide formed with one or more elements of group IIIA (new style: group 16), e.g., aluminum (Al), indium (In), gallium (Ga), and thallium (Tl). Examples include $In_xSe_y$ and $Ga_xSe_y$ wherein x is in the range of about 1 to about 10 and y is in the range of about 1 to about 10. Still further, the microflakes may be a Group IB-IIIA-chalcogenide compound of one or more group IB elements, one or more group IIIA elements and one or more chalcogens. Examples include CuInGa—$Se_2$. Other embodiments may replace the selenide component with another group VIA element such as but not limited to sulfur, or combinations of multiple group VIA elements such as both sulfur and selenium.

It should be understood that the ink used in the present invention may include more than one type of chalcogenide microflakes. For example, some may include microflakes from both group IB-chalcogenide(s) and group IIIA-chalcogenide(s). Others may include microflakes from different group IB-chalcogenides with different stoichiometric ratios. Others may include microflakes from different group IIIA-chalcogenides with different stoichiometric ratios.

Optionally, the microflakes 108 in the ink may also be particles of at least one solid solution. In one nonlimiting example, the nano-powder may contain copper-gallium solid solution particles, and at least one of indium particles, indium-gallium solid-solution particles, copper-indium solid solution particles, and copper particles. Alternatively, the nano-powder may contain copper particles and indium-gallium solid-solution particles.

One of the advantages of using microflake-based dispersions is that it is possible to vary the concentration of the elements within the precursor layer 106 from top to bottom by building the precursor layer in a sequence of thinner sub-layers, which when combined, form the precursor layer. The material may be deposited to form the first, second layer or subsequent sub-layers, and reacted in at least one suitable atmosphere to form the corresponding component of the active layer. In other embodiment, the sub-layers may be reacted as the sub-layers are deposited. The relative elemental concentration of the microflakes that make up the ink for each sub-layer may be varied. Thus, for example, the concentration of gallium within the absorber layer may be varied as a function of depth within the absorber layer. The precursor layer 106 (or selected constituent sub-layers, if any) may be deposited using a precursor material formulated with a controlled overall composition having a desired stoichiometric ratio. More details on one method of building a layer in a sequence of sub-layers can be found in commonly assigned, copending U.S. patent application Ser. No. 11/243,492 filed Oct. 3, 2005 and fully incorporated herein by reference for all purposes.

It should be understood that the film may be a layer made from a dispersion, such as but not limited to an ink, paste, or paint. A layer of the dispersion can be spread onto the substrate and annealed to form the precursor layer 106. By way of example the dispersion can be made by forming oxygen-free microflakes containing elements from group IB, group IIIA and intermixing these microflakes and adding them to a vehicle, which may encompass a carrier liquid (such as but not limited to a solvent), and any additives.

Generally, an ink may be formed by dispersing any of the aforementioned particles (and/or other particles) in a vehicle containing a dispersant (e.g., a surfactant or polymer) along with (optionally) some combination of other components commonly used in making inks. In some embodiments of the present invention, the ink is formulated without a dispersant or other additives. The carrier liquid may be an aqueous (water-based) or non-aqueous (organic) solvent. Other components include, without limitation, dispersing agents, binders, emulsifiers, anti-foaming agents, dryers, solvents, fillers, extenders, thickening agents, film conditioners, anti-oxidants, flow and leveling agents, plasticizers and preservatives. These components can be added in various combinations to improve the film quality and optimize the coating properties of the microflake dispersion. An alternative method to mixing microflakes and subsequently preparing a dispersion from these mixed microflakes would be to prepare separate dispersions for each individual type of microflake and subsequently mixing these dispersions. It should be understood that, due to favorable interaction of the planar shape of the microflakes with the carrier liquid, some embodiments of the ink may be formulated by use of a carrier liquid and without a dispersing agent.

The precursor layer 106 from the dispersion may be formed on the substrate 102 by any of a variety of solution-based coating techniques including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, and the like, as well as combinations of the above and/or related technologies. The foregoing may apply to any embodiments herein, regardless of particle size or shape.

In some embodiments, extra chalcogen, alloys particles, or elemental particles, e.g., micron- or sub-micron-sized chalcogen powder may be mixed into the dispersion containing the microflakes so that the microflakes and extra chalcogen are deposited at the same time. Alternatively the chalcogen powder may be deposited on the substrate in a separate solution-based coating step before or after depositing the dispersion containing the microflakes. In other embodiment, group IIIA elemental material such as but not limited to gallium droplets may be mixed with the flakes. This is more fully described in commonly assigned, copending U.S. patent application Ser. No. 11/243,522, now abandoned filed on Feb. 23, 2006 and fully incorporated herein by reference. This may create an additional layer 107 (shown in phantom in FIG. 1C). Optionally, additional chalcogen may be added by any combination of (1) any chalcogen source that can be solution-deposited, e.g. a Se or S nano- or micron-sized powder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5) an $H_2$ atmosphere, (6) an organo-selenium atmosphere, e.g. diethylselenide or another organo-metallic material, (7) another reducing atmosphere, e.g. CO, and a (8) heat treatment. The stoichiometric ratio of microflakes to extra chalcogen, given as Se/(Cu+In+Ga+Se) may be in the range of about 0 to about 1000.

Note that the solution-based deposition of the proposed mixtures of microflakes does not necessarily have to be performed by depositing these mixtures in a single step. In some embodiments of the present invention, the coating step may be performed by sequentially depositing microflake dispersions having different compositions of IB-, IIIA- and chalcogen-based particulates in two or more steps. For example, the method may be to first deposit a dispersion containing an indium selenide microflake (e.g. with an In-to-Se ratio of ~1), and subsequently deposit a dispersion of a copper selenide microflake (e.g. with a Cu-to-Se ratio of ~1) and a gallium selenide microflake (e.g. with a Ga-to-Se ratio of ~1) followed optionally by depositing a dispersion of Se. This would result in a stack of three solution-based deposited layers, which may be heated together. Alternatively, each layer may be heated or sintered before depositing the next layer. A number of different sequences are possible. For example, a layer of $In_xGa_ySe_z$ with $x \geq 0$ (larger than or equal to zero), $y \geq 0$ (larger than or equal to zero), and $z \geq 0$ (larger than or equal to zero), may be formed as described above on top of a uniform, dense layer of $Cu_wIn_xGa_y$ with $w \geq 0$ (larger than or equal to zero), $x \geq 0$ (larger than or equal to zero), and $y \geq 0$ (larger than or equal to zero), and subsequently converting (heating) the two layers into CIGS. Alternatively a layer of $Cu_wIn_xGa_y$ may be formed on top of a uniform, dense layer of $In_xGa_ySe_z$ and subsequently converting (heating) the two layers into CIGS.

In alternative embodiments, microflake-based dispersions as described above may further include elemental IB, and/or IIIA nanoparticles (e.g., in metallic form). These nanoparticles may be in flake form, or optionally, take other shapes such as but not limited to spherical, spheroidal, oblong, cubic, or other non-planar shapes. These particles may also include emulsions, molten materials, mixtures, and the like, in addition to solids. For example $Cu_xIn_yGa_zSe_u$ materials, with $u \geq 0$ (larger than zero), with $x \geq 0$ (larger than or equal to zero), $y \geq 0$ (larger than or equal to zero), and $z \geq 0$ (larger than or equal to zero), may be combined with an additional source of selenium (or other chalcogen) and metallic gallium into a dispersion that is formed into a film on the substrate by heating. Metallic gallium nanoparticles and/or nanoglobules and/or nanodroplets may be formed, e.g., by initially creating an emulsion of liquid gallium in a solution. Gallium metal or gallium metal in a solvent with or without emulsifier may be heated to liquefy the metal, which is then sonicated and/or otherwise mechanically agitated in the presence of a solvent. Agitation may be carried out either mechanically, electromagnetically, or acoustically in the presence of a solvent with or without a surfactant, dispersant, and/or emulsifier. The gallium nanoglobules and/or nanodroplets can then be manipulated in the form of a solid-particulate, by quenching in an environment either at or below room temperature to convert the liquid gallium nanoglobules into solid gallium nanoparticles. This technique is described in detail in commonly-assigned U.S. patent application Ser. No. 11/081,163, now U.S. Pat. No. 7,604,843 to Matthew R. Robinson and Martin R. Roscheisen entitled "Metallic Dispersion", the entire disclosures of which are incorporated herein by reference.

Note that the method may be optimized by using, prior to, during, or after the solution deposition and/or heating of one or more of the precursor layers, any combination of (1) any chalcogen source that can be solution-deposited, e.g. a Se or S nanopowder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5), an organo-selenium containing atmosphere, e.g. diethylselenide (6) an $H_2$ atmosphere, (7) another reducing atmosphere, e.g. CO, (8) a wet chemical reduction step, and a (9) heat treatment.

Figure 1C:
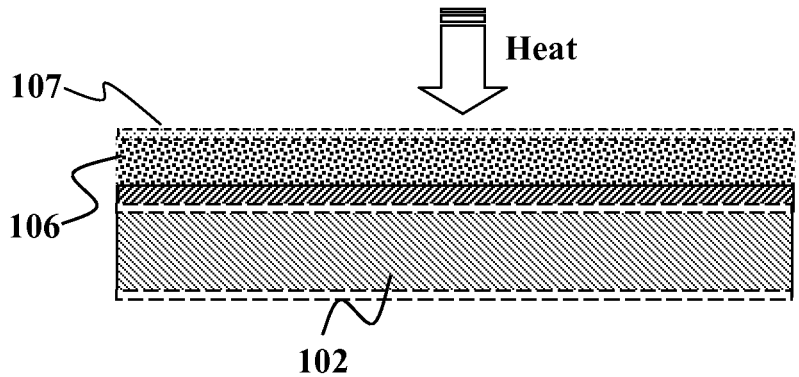

Referring now to FIG. 1C, the precursor layer 106 may then be processed in a suitable atmosphere to form a film. The film may be a dense film. In one embodiment, this involves heating the precursor layer 106 to a temperature sufficient to convert the ink (as-deposited ink. Note that solvent and possibly dispersant have been removed by drying). The temperature may be between about 375° C. and about 525° C. (a safe temperature range for processing on aluminum foil or high-melting-temperature polymer substrates). The processing may occur at various temperatures in the range, such as but not limited to 450° C. In other embodiments, the temperature at the substrate may be between about 400° C. and about 600° C. at the level of the precursor layer, but cooler at the substrate. The time duration of the processing may also be reduced by at least about 20% if certain steps are removed. The heating may occur over a range between about four minutes to about ten minutes. In one embodiment, the processing comprises heating the precursor layer to a temperature greater than about 375° C. but less than a melting temperature of the substrate for a period of less than about 15 minutes. In another embodiment, the processing comprises heating the precursor layer to a temperature greater than about 375° C. but less than a melting temperature of the substrate for a period of about 1 minute or less. In a still further embodiment, the processing comprises heating the precursor layer to an annealing temperature but less than a melting temperature of the substrate for a period of about 1 minute or less. The processing step may also be accelerated via thermal processing techniques using at least one of the following processes: pulsed thermal processing, exposure to laser beams, or heating via IR lamps, and/or similar or related processes.

The atmosphere associated with the annealing step in FIG. 1C may also be varied. In one embodiment, the suitable atmosphere comprises an atmosphere containing more than about 10% hydrogen. In another embodiment the suitable atmosphere comprises a carbon monoxide atmosphere. However, in other embodiments where very low or no amounts of oxygen are found in the particles, the suitable atmosphere may be a nitrogen atmosphere, an argon atmosphere, or an atmosphere having less than about 10% hydrogen. These other atmospheres may be advantageous to enable and improve material handling during production.

Although pulsed thermal processing remains generally promising, certain implementations of the pulsed thermal processing such as a directed plasma arc system, face numerous challenges. In this particular example, a directed plasma arc system sufficient to provide pulsed thermal processing is an inherently cumbersome system with high operational costs. The direct plasma arc system requires power at a level that makes the entire system energetically expensive and adds significant cost to the manufacturing process. The directed plasma arc also exhibits long lag time between pulses and thus makes the system difficult to mate and synchronize with a continuous, roll-to-roll system. The time it takes for such a system to recharge between pulses also creates a very slow system or one that uses more than directed plasma arc, which rapidly increase system costs.

In some embodiments of the present invention, other devices suitable for rapid thermal processing may be used and they include pulsed layers used in adiabatic mode for annealing (Shtyrokov E I, *Sov. Phys.—Semicond.* 9 1309), continuous wave lasers (10-30 W typically) (Ferris S D 1979 *Laser-Solid Interactions and Laser Processing* (New York: AIP)), pulsed electron beam devices (Kamins T I 1979 *Appl. Phys. Leti.* 35 282-5), scanning electron beam systems (McMahon R A 1979 *J. Vac. Sci. Techno.* 16 1840-2) (Regolini J L 1979 *Appl. Phys. Lett.* 34 410), other beam systems (Hodgson R T 1980 *Appl. Phys. Lett.* 37 187-9), graphite plate heaters (Fan J C C 1983 *Mater. Res. Soc. Proc.* 4 751-8) (M W Geis 1980 *Appl. Phys. Lett.* 37 454), lamp systems (Cohen R L 1978 *Appl. Phys. Lett.* 33 751-3), and scanned hydrogen flame systems (Downey D F 1982 *Solid State Technol.* 25 87-93). In some embodiment of the present invention, non-directed, low density system may be used. Alternatively, other known pulsed heating processes are also described in U.S. Pat. Nos. 4,350,537 and 4,356,384. Additionally, it should be understood that methods and apparatus involving pulsed electron beam processing and rapid thermal processing of solar cells as described in expired U.S. Pat. No. 3,950,187 ("Method and apparatus involving pulsed electron beam processing of semiconductor devices") and U.S. Pat. No. 4,082,958 ("Apparatus involving pulsed electron beam processing of semiconductor devices") are in the public domain and well known. U.S. Pat. No. 4,729,962 also describes another known method for rapid thermal processing of solar cells. The above may be applied singly or in single or multiple combinations with the above or other similar processing techniques with various embodiments of the present invention.

It should be noted that using microflakes typically results in precursor layers that heat into a solid layer at temperatures as much as 50° C. lower than a corresponding layer of spherical nanoparticles. This is due in part because of the greater surface area contact between particles.

In certain embodiments of the invention, the precursor layer 106 (or any of its sub-layers) may be annealed, either sequentially or simultaneously. Such annealing may be accomplished by rapid heating of the substrate 102 and precursor layer 106 from an ambient temperature to a plateau temperature range of between about 200° C. and about 600° C. Processing comprises annealing with a ramp-rate of 1-5° C./sec, preferably over 5° C./sec, to a temperature of about 200° C. and about 600° C. The temperature is maintained in the plateau range for a period of time ranging between about a fraction of a second to about 60 minutes, and subsequently reduced. Optionally, processing further comprise selenizing this annealed layer with a ramp-rate of 1-5° C./sec, preferably over 5° C./sec, to a temperature of about 225 to 575° C. for a time period of about 60 seconds to about 10 minutes in Se vapor, where the plateau temperature is not necessarily kept constant in time, to form the thin-film containing one or more chalcogenide compounds containing Cu, In, Ga, and Se. Optionally, processing comprises selenizing without the separate annealing step in an atmosphere containing hydrogen gas, but may be densified and selenized in one step with a ramp-rate of 1-5 C/sec, preferably over 5° C./sec, to a temperature of 225 to 575° C. for a time period of about 120 seconds to about 20 minutes in an atmosphere containing either $H_2Se$ or a mixture of $H_2$ and Se vapor.

Alternatively, the annealing temperature could be modulated to oscillate within a temperature range without being maintained at a particular plateau temperature. This technique (referred to herein as rapid thermal annealing or RTA) is particularly suitable for forming photovoltaic active layers (sometimes called "absorber" layers) on metal foil substrates, such as but not limited to aluminum foil. Other suitable substrates include but are not limited to other metals such as Stainless Steel, Copper, Titanium, or Molybdenum, metallized plastic foils, glass, ceramic films, and mixtures, alloys, and blends of these and similar or related materials. The substrate may be flexible, such as the form of a foil, or rigid, such as the form of a plate, or combinations of these forms. Additional details of this technique are described in U.S. patent application Ser. No. 10/943,685, which is incorporated herein by reference.

The atmosphere associated with the annealing step may also be varied. In one embodiment, the suitable atmosphere comprises a hydrogen atmosphere. However, in other embodiments where very low or no amounts of oxygen are found in the microflakes, the suitable atmosphere may be a nitrogen atmosphere, an argon atmosphere, a carbon monoxide atmosphere, or an atmosphere having less than about 10% hydrogen. These other atmospheres may be advantageous to enable and improve material handling during production.

Figure 1D:
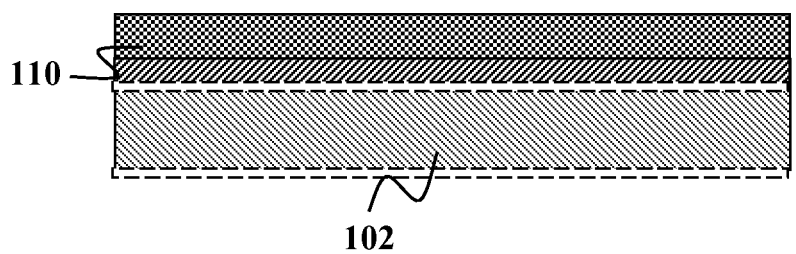

Referring now to FIG. 1D, the precursor layer 106 processed in FIG. 1C will form a film 110. The film 110 may actually have a reduced thickness compared to the thickness of the wet precursor layer 106 since the carrier liquid and other materials have been removed during processing. In one embodiment, the film 110 may have a thickness in the range of about 0.5 microns to about 2.5 microns. In other embodiments, the thickness of film 110 may be between about 1.5 microns and about 2.25 microns. In one embodiment, the resulting dense film 110 may be substantially void free. In some embodiments, the dense film 110 has a void volume of about 5% or less. In other embodiments, the void volume is about 10% or less. In another embodiment, the void volume is about 20% or less. In still other embodiments, the void volume is about 24% or less. In still other embodiments, the void volume is about 30% or less. The processing of the precursor layer 106 will fuse the particles together and in most instances, remove void space and thus reduce the thickness of the resulting dense film.

Depending on the type of materials used to form the film 110, the film 110 may be suitable for use as an absorber layer or be further processed to become an absorber layer. More specifically, the film 110 may be a film as a result of a one step process, or for use in another subsequent one step process making it a two step process, or for use in a multi-step process. In a one step process, the film 110 is formed to include group IB-IIIA-VIA compounds and the film 110 may be an absorber film suitable for use in a photovoltaic device. In a two step process, the film 110 may be a solid and/or densified film that will have further processing to be suitable for use as an absorber film for use in a photovoltaic device. As a nonlimiting example, the film 110 in a two step process may not contain any and/or sufficient amounts of a group VIA element to function as an absorber layer. Adding a group VIA element or other material may be the second step of the two-step process. Either a mixture of two or more VIA elements can be used, or a third step can be added with another VIA element as used in the second step. A variety of methods of adding that material include printing of group VIA element, using VIA element vapor, and/or other techniques. It should also be understood that in a two step process, the process atmospheres may be different. By way of nonlimiting example, one atmosphere may optionally be a group VIA-based atmosphere. As another nonlimiting example, one atmosphere may be an inert atmosphere as described herein. Other processing steps as used in a multi-step process may be a wet chemical surface treatment to improve the IB-IIIA-VIA thin-film surface, and/or an additional rapid thermal heating to improve bulk and surface properties of the IB-IIIA-VIA thin-film.

Microflakes

Figure 2A:
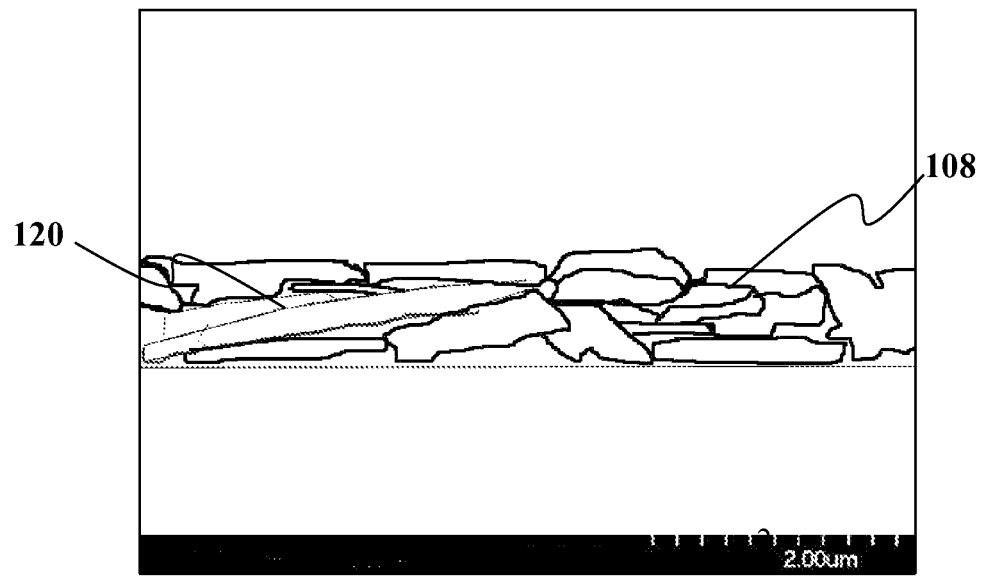
FIGS. 2A and 2B are magnified side view and magnified top-down view of microflakes according to one embodiment of the present invention.
Figure 2B:
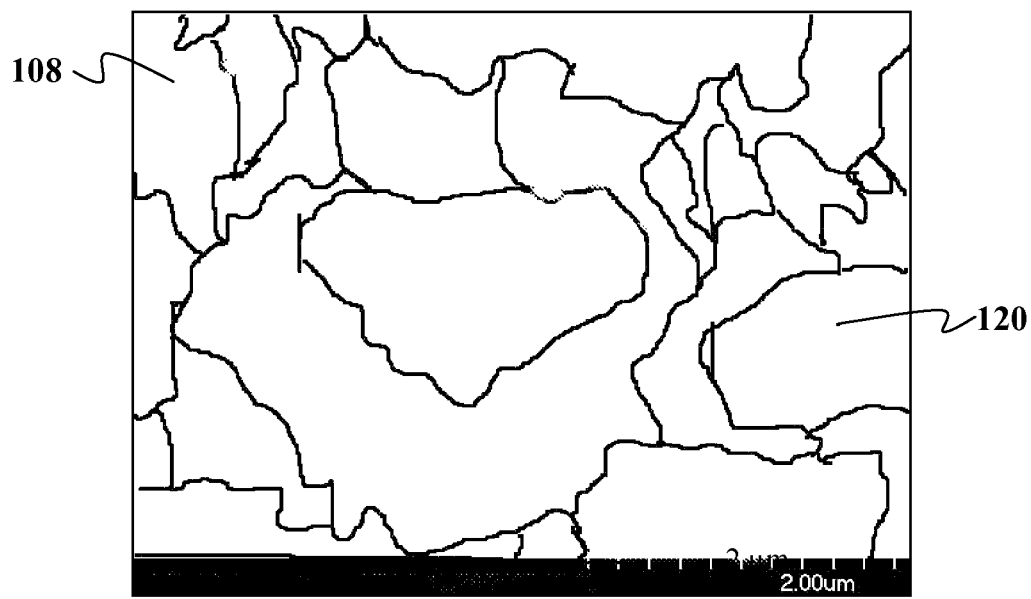

Referring now to FIGS. 2A and 2B, embodiments of the microflakes 108 according to the present invention will be described in further detail. The microflakes 108 may come in a variety of shapes and sizes. In one embodiment, the microflakes 108 may have a large aspect ratio, in terms of particle thickness to particle length. FIG. 2A shows that some microflakes have thicknesses between about 0.2 to about 0.4 microns (200 to 400 nm) and lengths between about 2 to about 5 microns (2000 to 5000 nm). As a nonlimiting example, the plates are thin (about 100 nm to 75 nm thickness or less) while their lengths may be as large as about 5 microns (5000 nm). Some may have a length of about 3 microns (3000 nm) or less. Other embodiments of the microflakes 108 may have a length of about 1 micron (1000 nm) or less. The aspect ratio in some embodiments of microflakes may be about 10:1 or more (ratio of the longest dimension to the shortest dimension of a particle). Other embodiments may have an aspect ratio of about 30:1 or more. Still others may have an aspect ratio of about 50:1 or more. An increase in aspect ratio would indicate that the longest dimension has increased over the shortest dimension or that the shortest dimension has decreased relative to the longest dimension. Thus, aspect ratio herein involves the longest lateral dimension (be it length or width) relative to the shortest dimension, which is typically the thickness of a flake. The dimensions are measured along edges or across a major axis to provide measurement of dimensions such as but not limited to length, width, depth, and/or diameter. When referring to a plurality of microflakes having a defined aspect ratio, what is meant is that all of the microflakes of a composition as a whole have an average aspect ratio as defined. It should be understood that there may be a distribution of particle aspect ratios around the average aspect ratio.

As seen in FIG. 2A, although the size and shape of the microflakes 108 may vary, most include at least one substantially planar surface 120. The at least one planar surface 120 allows for greater surface contact between adjacent microflakes 108. The greater surface contact provides a variety of benefits. The greater contact allows for improved atomic intermixing between adjacent particles. For microflakes containing more than one element, even though there may be atomic intermixing already in place for the particles, the close contact in the film allows easy subsequent diffusion. Thus, if a particle is slightly rich in one element, the increased contact facilitates a more even distribution of elements in the resulting dense film. Furthermore, greater interparticle interfacial area leads to faster reaction rates. The planar shape of the particles maximizes interparticle contact area. The interparticle contact area allows chemical reactions (e.g. based for example upon atomic diffusion) to be initiated, catalyzed, and/or progress relatively rapidly and concurrently over large areas. Thus, not only does the shape improve intermixing, the greater interfacial area and interparticle contact area also improves reaction rates.

Referring still to FIG. 2A, the planar shape also allows for improved packing density. As seen in FIG. 2A, the microflakes 108 may be oriented substantially parallel to the surface of substrate 102 and stack one on top of the other to form the precursor layer 106. Intrinsically, the geometry of the microflakes allow for more intimate contact than spherical particles or nanoparticles in the precursor layer. In fact, it is possible that 100% of the planar surface of the microflake is in contact with another microflake. Thus, the planar shape of the microflakes creates a higher packing density in the dense film as compared to a film made from a precursor layer using an ink of spherical nanoparticles of the same composition that is otherwise substantially identical. In some embodiments, the planar shape of the microflakes creates a packing density of at least about 70% in the precursor layer. In other embodiments, the microflakes create a packing density of at least about 80% in the precursor layer. In other embodiments, the microflakes create a packing density of at least about 90% in the precursor layer. In other embodiments, the microflakes create a packing density of at least about 95% in the precursor layer.

As seen in FIG. 2B, the microflakes 108 may have a variety of shapes. In some embodiments, the microflakes in the ink may include those that are of random size and/or random shape. On the contrary, particles size is extremely important for standard spherical nanoparticles, and those spherical nanoparticles of different size and composition will result in dispersion with unstable atomic composition. The planar surface 120 of the microflakes allows for particles that are more easily suspended in the carrier liquid. Thus, even though the microflakes may not be monodisperse in size, putting the constituent metals in plate form provides one method to have particles suspended in the carrier liquid without rapid and/or preferential settling of any constituent element.

It should be understood that the microflakes 108 of the present invention may be formed and/or size discriminated to provide a more controlled size and shape distribution. The size distribution of microflakes may be such that one standard deviation from a mean length and/or width of the microflakes is less than about 1000 nm. The size distribution of microflakes may be such that one standard deviation from a mean length and/or width of the microflakes is less than about 600 nm. The size distribution of microflakes may be such that one standard deviation from a mean length and/or width of the microflakes is less than about 500 nm. The size distribution of microflakes may be such that one standard deviation from a mean length and/or width of the microflakes is less than about 400 nm. The size distribution of microflakes may be such that one standard deviation from a mean length and/or width of the microflakes is less than about 250 nm. In another embodiment, the size distribution of microflakes may be such that one standard deviation from a mean length and/or width of the microflakes is less than about 100 nm. In another embodiment, one standard deviation from a mean length of the microflakes is less than about 50 nm.

Figure 2C:
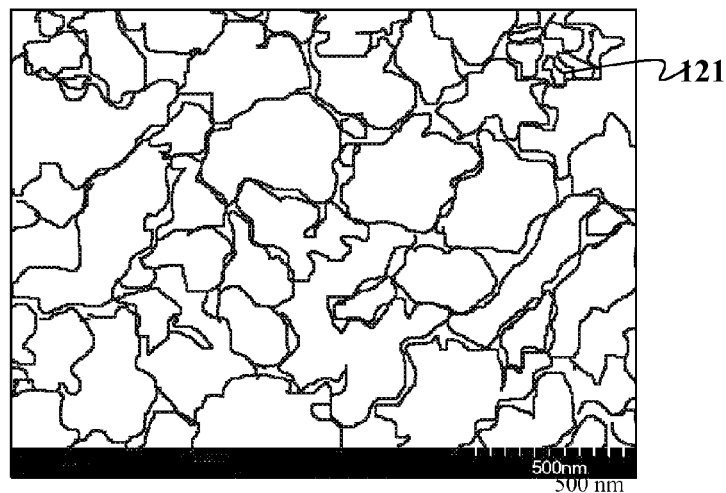
FIG. 2C is a magnified top-down view of a nanoflake according to one embodiment of the present invention.

In yet another embodiment, one standard deviation from a mean thickness of the microflakes is less than about 10 nm. In another embodiment of the invention, one standard deviation from a mean thickness of the microflakes is less than about 5 nm. The microflakes each have a thickness less than about 250 nm. In another embodiment, the microflakes each have a thickness less than about 100 nm. In yet another embodiment, the microflakes each have a thickness less than about 20 nm. The microflakes may have a length of less than about 5 microns and a thickness of less than about 250 nm. In another embodiment, the microflakes may have a length of less than about 2 microns and a thickness of less than about 100 nm. In another embodiment, the microflakes have a length of less than about 1 micron and a thickness of less than about 50 nm. In terms of their shape, the microflakes may have an aspect ratio of at least about 10 or more. In another embodiment, the microflakes have an aspect ratio of at least about 15 or more. The microflakes are of random planar shape and/or a random size distribution. In other embodiments, the microflakes are of non-random planar shape and/or a non-random size distribution. Additionally, FIG. 2C shows a magnified top-down view of nanoflakes 121 according to one embodiment of the present invention The stoichiometric ratio of elements may vary between individual microflakes so long as the overall amount in all of the particles combined is at the desired or close to the desired stoichiometric ratio for the precursor layer and/or resulting dense film. According to one preferred embodiment of that process, the overall amount of elements in the resulting film has a Cu/(In+Ga) compositional range of about 0.7 to about 1.0 and a Ga/(In+Ga) compositional range of about 0.05 to about 0.30. Optionally, the Se/(In+Ga) compositional range may be about 0.00 to about 4.00 such that a later step involving use of an additional source of Se may or may not be required.

Microflake Formation

Figure 3:
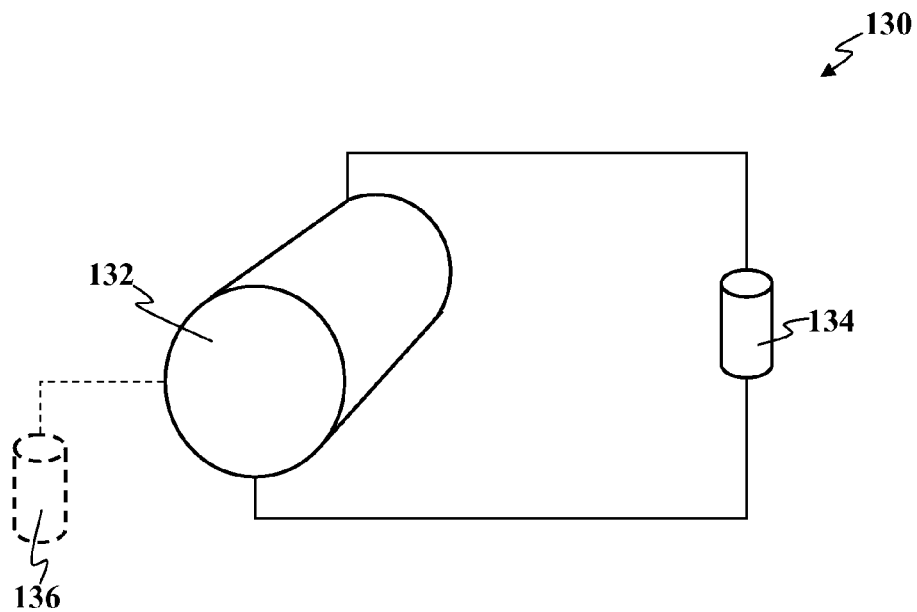
FIG. 3 shows a schematic of a milling system according to the one embodiment of the present invention.

Referring now to FIG. 3, one embodiment of a device for forming microflakes 108 will now be described. Microflakes 108 may be obtained by a variety of techniques including, but not limited to, size reducing techniques like ball milling, bead milling, small media milling, agitator ball milling, planetary milling, horizontal ball milling, pebble milling, pulverizing, hammering, dry grinding, wet grinding, jet milling, or other types of milling, applied singly or in any combination, on a commercially available feedstock of the desired elemental, binary, ternary, or multi-nary material. FIG. 3 shows one embodiment of a milling system 130 using a milling machine 132 that contains the balls or beads, or other material used in the milling process. The system 130 may be a closed system to provide an oxygen-free environment for processing of the feedstock material. A source of inert gas 134 may be coupled to the closed system to maintain an oxygen-free environment. The milling system 130 may also be configured to allow for cryomilling by providing a liquid nitrogen or other cooling source 136 (shown in phantom). Alternatively, the milling system 130 may also be configured to provide heating during the milling process. Cycles of heating and/or cooling can also be carried out during the milling process. Optionally, the milling may also involve mixing a carrier liquid and/or a dispersing agent with the powder or feedstock being processed. In one embodiment of the present invention, the microflakes 108 created by milling may be of a variety of sizes such as but not limited to, about 20 nanometers to about 500 nanometers in thickness. In another embodiment, the microflakes may be between about 75 nanometers to 100 nanometers in thickness.

It should be understood that the milling may use beads or microbeads made of materials harder and/or having a higher mass density than the feedstock particles to transform the feedstock particles to the appropriate size and shape. In one embodiment, these beads are glass, ceramic, alumina, porcelain, silicon carbide, or tungsten carbide beads, stainless steel balls with ceramic shells, iron balls with ceramic shells, or the like to minimize contamination risk to the microflakes. The mill itself or parts of the mill may also have a ceramic lining or a lining of another inert material or parts of the mill may be completely ceramic or made chemically and mechanically inert to minimize contamination of the slurry containing the microflakes. The beads may also be sieved regularly during the process.

The ball milling may occur in an oxygen-free environment. This may involve using a mill that is sealed from the outside environment and purged of air. Milling may then occur under an inert atmosphere or other oxygen-free environment. Some embodiments may involve placing the mill inside a hood or chamber that provides the sealing for an oxygen-free environment. The process may involve drying and degassing the vehicle or choosing anhydrous, oxygen-free solvent to begin with and loading without contact to air. The oxygen-free milling may create oxygen-free microflakes which in turn reduces the need for a step to remove oxygen from the particles. This could significantly reduce the anneal time associated with turning the microflakes precursor layer into the dense film. In some embodiments, the anneal time is in the range of about 30 seconds. Related to air-free microflake creation (size reduction), it should be understood that the present invention may also include air-free dispersion creation, and air-free coating, storage and/or handling.

The milling may occur at a variety of temperatures. In one embodiment of the present invention, the milling occurs at room temperature. In another embodiment, the milling occurs at a cryogenic temperature such as but not limited to ≤−175°

C. This may allow milling to work on particles that may be liquid or not sufficiently brittle at room temperature for size reduction. The milling may also occur at a desired milling temperature wherein all precursor particles are solids and the precursor particles have a sufficient malleability at the milling temperature to form the planar shape from the non-planar or planar starting shape. This desired temperature may be at room temperature, above room temperature, or below room temperature, and/or cycle between various temperatures. In one embodiment, the milling temperature may be less than about 15 degrees C. In another embodiment, the temperature is at less than about −175 degrees C. In yet another embodiment, the milling may be cooled by liquid nitrogen which is 80K, being −193° C. Temperature control during milling may control possible chemical reaction between solvent, dispersant, feedstock material, and/or parts of the mill. It should be understood that in addition to the aforementioned, the temperature may also vary over different time periods of the milling process. As a nonlimiting example, the milling may occur at a first temperature over an initial milling time period and proceed to other temperatures for subsequent time periods during the milling.

The milling may transform substantially all of the precursor particles into microflakes. In some embodiments, the milling transforms at least about 50% (by weight of all of the precursor particles) of the precursor particles into microflakes. Additionally, it should be understood that the temperature can be constant or changed during milling. This may be useful to adjust the material properties of the feedstock material or partially milled material to create particles of desired shape, size, and/or composition.

Although the present invention discloses a "top down" method for forming microflakes, it should be understood that other techniques may also be used. For example, quenching a material from the melt on a surface such as a liquid cooling bath. Indium (and likely gallium and selenium) microflakes may be formed by emulsifying molten indium while agitating and quenching at the surface of a cooling bath. It should be understood that any wet chemical, dry chemical, dry physical, and/or wet physical technique to make flakes can be used with the present invention (apart from dry or wet size reduction). Thus, the present invention is not limited to wet physical top-down methods (milling), but may also include dry/wet bottom-up approaches. It should also be noted that size reduction may optionally be a multi-step process. In one nonlimiting example, this may first involve taking mm-sized chunks/pieces that are dry grinded to <100 um, subsequently milled in one, two, three, or more steps with subsequent reducing bead size to the microflakes.

It should be understood that the feedstock particles for use with the present invention may be prepared by a variety of methods. By way of example and not limitation, U.S. Pat. No. 5,985,691 issued to B. M. Basol et al describes a particle-based method to form a Group IB-IIIA-VIA compound film. Eberspacher and Pauls in U.S. Pat. No. 6,821,559 describe a process for making phase-stabilized precursors in the form of fine particles, such as sub-micron multinary metal particles, and multi-phase mixed-metal particles comprising at least one metal oxide. Bulent Basol in U.S. Published Patent application number 20040219730 describes a process of forming a compound film including formulating a nano-powder material with a controlled overall composition and having particles of one solid solution. Using the solid-solution approach, Gallium can be incorporated into the metallic dispersion in non-oxide form—but only with up to approximately 18 relative atomic percent (Subramanian, P. R. and Laughlin, D. E., in *Binary Alloy Phase Diagrams* $2^{nd}$ Edition, edited by Massalski, T. B. 1990. ASM international, Materials Park, Ohio, pp 1410-1412; Hansen, M., *Constitution of Binary Alloys*. 1958. $2^{nd}$ Edition, McGraw Hill, pp. 582-584.) U.S. patent application Ser. No. 11/081,163 describes a process of forming a compound film by formulating a mixture of elemental nanoparticles composed of the IB, the IIIA, and, optionally, the VIA group of elements having a controlled overall composition. Discussion on chalcogenide powders may also be found in the following: [(1) Vervaet, A. et al., E. C. Photovoltaic Sol. Energy Conf., Proc. Int. Conf., 10th (1991), 900-3; (2) Journal of Electronic Materials, Vol. 27, No. 5, 1998, p. 433; Ginley et al.; (3) WO 99,378,32; Ginley et al.; (4) U.S. Pat. No. 6,126,740]. These methods may be used to create feedstock to be size reduced. Others may form precursor sub-micron-sized particles ready for solution-deposition. All documents listed above are fully incorporated herein by reference for all purposes.

Ink Preparation

To formulate the dispersion used in the precursor layer 106, the microflakes 108 are mixed together and with one or more chemicals including but not limited to dispersants, surfactants, polymers, binders, cross-linking agents, emulsifiers, anti-foaming agents, dryers, solvents, fillers, extenders, thickening agents, film conditioners, anti-oxidants, flow agents, leveling agents, and corrosion inhibitors.

The inks created using the present invention may optionally include a dispersant. Some embodiments may not include any dispersants. Dispersants (also called wetting agents) are surface-active substances used to prevent particles from aggregating or flocculating, thus facilitating the suspension of solid materials in a liquid medium and stabilizing the dispersion thereby produced. If particle surfaces attract one another, then flocculation occurs, often resulting in aggregation and decreasing stability and/or homogeneity. If particle surfaces repel one another, then stabilization occurs, where particles do not aggregate and tend not to settle out of solution as fast.

An efficient dispersing agent can typically perform pigment wetting, dispersing, and stabilizing. Dispersing agents are different depending on the nature of the ink/paint. Polyphosphates, styrene-maleinates and polyacrylates are often used for aqueous formulations whereas fatty acid derivatives and low molecular weight modified alkyd and polyester resins are often used for organic formulations.

Surfactants are surface-active agents that lower the surface tension of the solvent in which they dissolve, serving as wetting agents, and keeping the surface tension of an (aqueous) medium low so that an ink interacts with a substrate surface. Certain types of surfactants are also used as dispersing agents. Surfactants typically contain both a hydrophobic carbon chain and a hydrophilic polar group. The polar group can be non-ionic. If the polar group is ionic, the charge can be either positive or negative, resulting in cationic or anionic surfactants. Zwitterionic surfactants contain both positive and negative charges within the same molecule; one example is N-n-Dodecyl-N,N-dimethyl betaine. Certain surfactants are often used as dispersant agents for aqueous solutions. Representative classes include acetylene diols, fatty acid derivatives, phosphate esters, sodium polyacrylate salts, polyacrylic acids, soya lecithin, trioctylphosphine (TOP), and trioctylphosphine oxide (TOPO).

Binders and resins are often used to hold together proximate particles in a nascent or formed dispersion. Examples of typical binders include acrylic monomers (both as monofunctional diluents and multifunctional reactive agents), acrylic resins (e.g. acrylic polyol, amine synergists, epoxy acrylics, polyester acrylics, polyether acrylics, styrene/acrylics, urethane acrylics, or vinyl acrylics), alkyd resins (e.g. long-oil, medium-oil, short-oil, or tall oil), adhesion promoters such as but not limited to polyvinyl pyrrolidone (PVP), amide resins, amino resins (such as but not limited to melamine-based or urea-based compounds), asphalt/bitumen, butadiene acrylonitriles, cellulosic resins (such as but not limited to cellulose acetate butyrate (CAB)), cellulose acetate proprionate (CAP), ethyl cellulose (EC), nitrocellulose (NC), or organic cellulose ester), chlorinated rubber, dimer fatty acids, epoxy resin (e.g. acrylates, bisphenol A-based resins, epoxy UV curing resins, esters, phenol and cresol (Novolacs), or phenoxy-based compounds), ethylene co-terpolymers such as ethylene acrylic/methacrylic Acid, E/AA, E/M/AA or ethylene vinyl acetate (EVA), fluoropolymers, gelatin (e.g. Pluronic F-68 from BASF Corporation of Florham Park, N.J.), glycol monomers, hydrocarbon resins (e.g. aliphatic, aromatic, or coumarone-based such as indene), maelic resins, modified urea, natural rubber, natural resins and gums, rosins, modified phenolic resins, resols, polyamide, polybutadienes (liquid hydroxyl-terminated), polyesters (both saturated and unsaturated), polyolefins, polyurethane (PU) isocyanates (e.g. hexamethylene diisocynate (HDI), isophorone diisocyanate (IPDI), cycloaliphatics, diphenylmethane disiocyanate (MDI), toluene diisocynate (TDI), or trimethylhexamethylene diisocynate (TMDI)), polyurethane (PU) polyols (e.g. caprolactone, dimer-based polyesters, polyester, or polyether), polyurethane (PU) dispersions (PUDs) such those based on polyesters or polyethers, polyurethane prepolymers (e.g. caprolactone, dimer-based polyesters, polyesters, polyethers, and compounds based on urethane acrylate), Polyurethane thermoplastics (TPU) such as polyester or polyether, silicates (e.g. alkyl-silicates or water-glass based compounds), silicones (amine functional, epoxy functional, ethoxy functional, hydroxyl functional, methoxy functional, silanol functional, or cinyl functional), styrenes (e.g. styrene-butadiene emulsions, and styrene/vinyl toluene polymers and copolymers), or vinyl compounds (e.g. polyolefins and polyolefin derivatives, polystyrene and styrene copolymers, or polyvinyl acetate (PVAC)).

Emulsifiers are dispersing agents that blend liquids with other liquids by promoting the breakup of aggregating materials into small droplets and therefore stabilize the suspension in solution. For example, sorbitan esters are used as an emulsifier for the preparation of water-in-oil (w/o) emulsions, for the preparation of oil absorption bases (w/o), for the formation of w/o type pomades, as a reabsorption agent, and as a non toxic anti-foaming agent. Examples of emulsifiers are sorbitan esters such as sorbitan sesquioleate (Arlacel 60), sorbitan sesquioleate (Arlacel 83), sorbitan monolaurate (Span 20), sorbitan monopalmitate (Span 40), sorbitan monostearate (Span 60), sorbitan tristearate (Span 65), sorbitan mono-oleate (Span 80), and sorbitan trioleate (Span 85) all of which are available, e.g., from Uniqema of New Castle, Del. Other polymeric emulsifiers include polyoxyethylene monostearate (Myrj 45), polyoxyethylene monostearate (Myrj 49), polyoxyl 40 stearate (Myrj 52), polyoxyethylene monolaurate (PEG 400), polyoxyethylene monooleate (PEG 400 monoleate) and polyoxyethylene monostearate (PEG 400 monostearate), and the Tween series of surfactants including but not limited to polyoxyethylene sorbitan monolaurate (Tween 20), polyoxyethylene sorbitan monolaurate (Tween 21), polyoxyethylene sorbitan monopalmitate (Tween 40), polyoxyethylene sorbitan monostearate (Tween 60), polyoxyethylene sorbitan tristearate (Tween 61), polyoxyethylene sorbitan mono-oleate (Tween 80), polyoxyethylene sorbitan monooleate (Tween 81), and polyoxyethylene sorbitan tri-oleate (Tween 85) all of which are available, e.g., from Uniqema of New Castle, Del. Arlacel, Myrj, and Tween are registered trademarks of ICI Americas Inc. of Wilmington, Del.

Foam may form during the coating/printing process, especially if the printing process takes place at high speeds. Surfactants may adsorb on the liquid-air interface and stabilize it, accelerating foam formation. Anti-foaming agents prevent foaming from being initiated, while defoaming agents minimize or eliminate previously-formed foam. Anti-foaming agents include hydrophobic solids, fatty oils, and certain surfactants, all of which penetrate the liquid-air interface to slow foam formation. Anti-foaming agents also include both silicate, silicone and silicone-free materials. Silicone-free materials include microcrystalline wax, mineral oil, polymeric materials, and silica- and surfactant-based materials.

Solvents can be aqueous (water-based) or non-aqueous (organic). While environmentally friendly, water-based solutions carry the disadvantage of a relatively higher surface tension than organic solvents, making it more difficult to wet substrates, especially plastic substrates. To improve substrate wetting with polymer substrates, surfactants may be added to lower the ink surface tension (while minimizing surfactant-stabilized foaming), while the substrate surfaces are modified to enhance their surface energy (e.g. by corona treatment). Typical organic solvents include acetate, acrylates, alcohols (butyl, ethyl, isopropyl, or methyl), aldehydes, benzene, dibromomethane, chloroform, dichloromethane, dichloroethane, trichloroethane, cyclic compounds (e.g. cyclopentanone or cyclohexanone), esters (e.g. butyl acetate or ethyl acetate), ethers, glycols (such as ethylene glycol or propylene glycol), hexane, heptane, aliphatic hydrocarbons, aromatic hydrocarbons, ketones (e.g. acetone, methyl ethyl ketone, or methyl isobutyl ketone), natural oils, terpenes, terpinol, toluene.

Additional components may include fillers/extenders, thickening agents, rheology modifiers, surface conditioners, including adhesion promoters/bonding, anti-gelling agents, anti-blocking agents, antistatic agents, chelating/complexing agents, corrosion inhibitors, flame/rust inhibitors, flame and fire retardants, humectants, heat stabilizers, light-stabilizers/UV absorbers, lubricants, pH stabilizers, and materials for slip control, anti-oxidants, and flow and leveling agents. It should be understood that all components may be added singly or in combination with other components.

Roll-to-Roll Manufacturing

Figure 4:
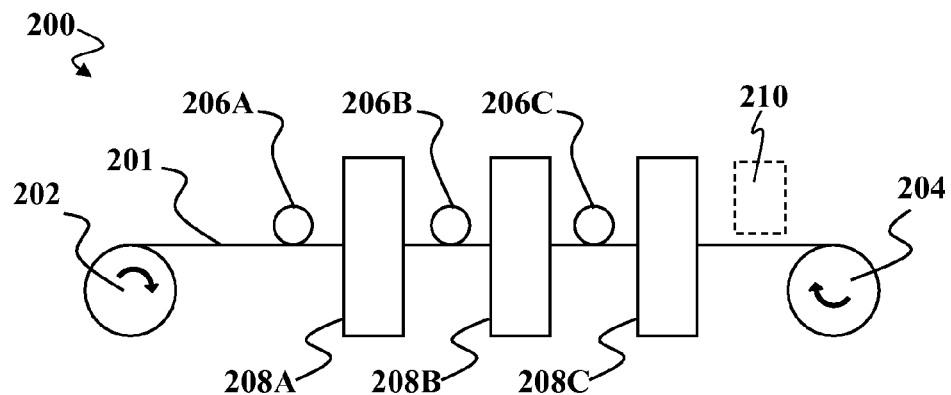
FIG. 4 shows a schematic of a roll-to-roll manufacturing system according to the one embodiment of the present invention.

Referring now to FIG. 4, a roll-to-roll manufacturing process according to the present invention will now be described. Embodiments of the invention using the microflakes are well suited for use with roll-to-roll manufacturing. Specifically, in a roll-to-roll manufacturing system 200a flexible substrate 201, e.g., aluminum foil travels from a supply roll 202 to a take-up roll 204. In between the supply and take-up rolls, the substrate 201 passes a number of applicators 206A, 206B, 206C, e.g. microgravure rollers and heater units 208A, 208B, 208C. Each applicator deposits a different layer or sub-layer of a precursor layer, e.g., as described above. The heater units are used to anneal the different layers and/or sub-layers to form dense films. In the example depicted in FIG. 4, applicators 206A and 206B may apply different sub-layers of a precursor layer (such as precursor layer 106). Heater units 208A and 208B may anneal each sub-layer before the next sub-layer is deposited. Alternatively, both sub-layers may be annealed at the same time. Applicator 206C may optionally apply an extra layer of material containing chalcogen or alloy or elemental particles as described above. Heater unit 208C heats the optional layer and precursor layer as described above. Note that it is also possible to deposit the precursor layer (or sub-layers) then deposit any additional layer and then heat all three layers together to form the IB-IIIA-chalcogenide compound film used for the photovoltaic absorber layer. The roll-to-roll system may be a continuous roll-to-roll and/or segmented roll-to-roll, and/or batch mode processing.

Photovoltaic Device

Figure 5:
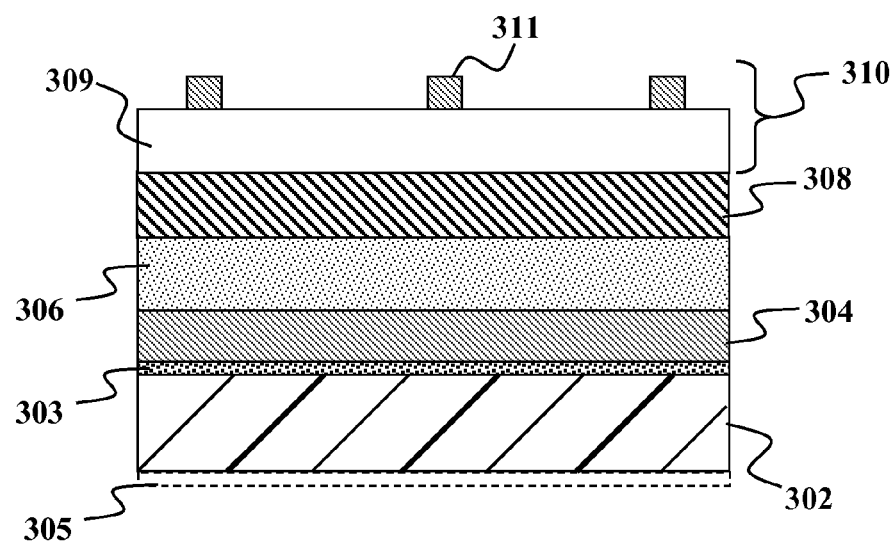
FIG. 5 shows a cross-sectional view of a photovoltaic device according to one embodiment of the present invention.

Referring now to FIG. 5, the films fabricated as described above may serve as an absorber layer in a photovoltaic device, module, or solar panel. An example of such a photovoltaic device 300 is shown in FIG. 4. The device 300 includes a base substrate 302, an optional adhesion and/or barrier layer 303, a base or back electrode 304, a p-type absorber layer 306 incorporating a film of the type described above, a n-type semiconductor thin film 308 and a transparent electrode 310. By way of example, the base substrate 302 may be made of a metal foil, a polymer such as polyimides (PI), polyamides, polyetheretherketone (PEEK), Polyethersulfone (PES), polyetherimide (PEI), polyethylene naphtalate (PEN), Polyester (PET), related polymers, or a metallized plastic. By way of nonlimiting example, related polymers include those with similar structural and/or functional properties and/or material attributes. The base electrode 304 is made of an electrically conductive material. By way of example, the base electrode 304 may be of a metal layer whose thickness may be selected from the range of about 0.1 micron to about 25 microns.

An optional intermediate layer 303 may be incorporated between the electrode 304 and the substrate 302. Optionally, the layer 303 may be a diffusion barrier layer to prevent diffusion of material between the substrate 302 and the electrode 304. Aluminum and molybdenum can and often do inter-diffuse into one another, especially upon heating to elevated temperatures as used for absorber growth, with deleterious electronic and/or optoelectronic effects on the device 300. Furthermore aluminum can diffuse though molybdenum into layers beyond e.g. CIG(S). To inhibit such inter-diffusion, an intermediate, interfacial layer 303 may be incorporated between the aluminum foil substrate 302 and molybdenum base electrode 304. The interfacial layer may be composed of any of a variety of materials, including but not limited to chromium, vanadium, tungsten, and glass, or compounds such as nitrides (including but not limited to titanium nitride, tantalum nitride, tungsten nitride, hafnium nitride, niobium nitride, zirconium nitride, vanadium nitride, silicon nitride, or molybdenum nitride), oxynitrides (including but not limited to oxynitrides of Ti, Ta, V, W, Si, Zr, Nb, Hf, or Mo), oxides, and/or carbides. The material may be selected to be an electrically conductive material. In one embodiment, the materials selected from the aforementioned may be those that are electrically conductive diffusion barriers. The thickness of this layer can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm. In one embodiment, the thickness of the layer 303 is at least 100 nm or more. In another embodiment, the thickness of the layer 303 is at least 150 nm or more. In one embodiment, the thickness of the layer 303 is at least 200 nm or more. Optionally, some embodiments may include another layer such as but not limited to a copper layer, a titanium layer, or other metal layer above the layer 303 and below the base electrode layer 304. Optionally, some embodiments may include another layer such as but not limited to a copper layer, a titanium layer, an aluminum layer, or other metal layer below the layer 303 and below the base electrode layer 304. This layer may be thicker than the layer 303. Optionally, it may be the same thickness or thinner than the layer 303. This layer 303 may be placed on one or optionally both sides of the aluminum foil (shown as layer 305 in phantom in FIG. 5).

If barrier layers are on both sides of the aluminum foil, it should be understood that the protective layers may be of the same material or they may optionally be different materials from the aforementioned materials. The bottom protective layer 305 may be any of the materials. Optionally, some embodiments may include another layer 307 such as but not limited to an aluminum layer above the layer 305 and below the aluminum foil 302. This layer 307 may be thicker than the layer 303.

The transparent electrode 310 may include a transparent conductive layer 309 and a layer of metal (e.g., Al, Ag, Cu, or Ni) fingers 311 to reduce sheet resistance. The n-type semiconductor thin film 308 serves as a junction partner between the compound film and the transparent conducting layer 309. By way of example, the n-type semiconductor thin film 308 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. Layers of these materials may be deposited, e.g., by chemical bath deposition (CBD) and/or chemical surface deposition (and/or related methods), to a thickness ranging from about 2 nm to about 1000 nm, more preferably from about 5 nm to about 500 nm, and most preferably from about 10 nm to about 300 nm. This may also configured for use in a continuous roll-to-roll and/or segmented roll-to-roll and/or a batch mode system.

The transparent conductive layer 309 may be inorganic, e.g., a transparent conductive oxide (TCO) such as but not limited to indium tin oxide (ITO), fluorinated indium tin oxide, zinc oxide (ZnO) or aluminum doped zinc oxide, or a related material, which can be deposited using any of a variety of means including but not limited to sputtering, evaporation, chemical bath deposition (CBD), electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes or related structures, or other transparent organic materials, either singly or in combination, which can be deposited using spin, dip, or spray coating, and the like or using any of various vapor deposition techniques. Optionally, it should be understood that intrinsic (non-conductive) i-ZnO may be used between CdS and Al-doped ZnO. Optionally, an insulating layer may be included between the layer 308 and transparent conductive layer 309. Combinations of inorganic and organic materials can also be used to form a hybrid transparent conductive layer. Thus, the layer 309 may optionally be an organic (polymeric or a mixed polymeric-molecular) or a hybrid (organic-inorganic). Examples of such a transparent conductive layer are described e.g., in commonly-assigned US Patent Application Publication Number 20040187917, which is incorporated herein by reference.

Those of skill in the art will be able to devise variations on the above embodiments that are within the scope of these teachings. For example, it is noted that in embodiments of the present invention, portions of the IB-IIIA precursor layers (or certain sub-layers of the precursor layers or other layers in the stack) may be deposited using techniques other than microflake-based inks. For example precursor layers or constituent sub-layers may be deposited using any of a variety of alternative deposition techniques including but not limited to solution-deposition of spherical nanopowder-based inks, vapor deposition techniques such as ALD, evaporation, sputtering, CVD, PVD, electroplating and the like.

Figure 6:
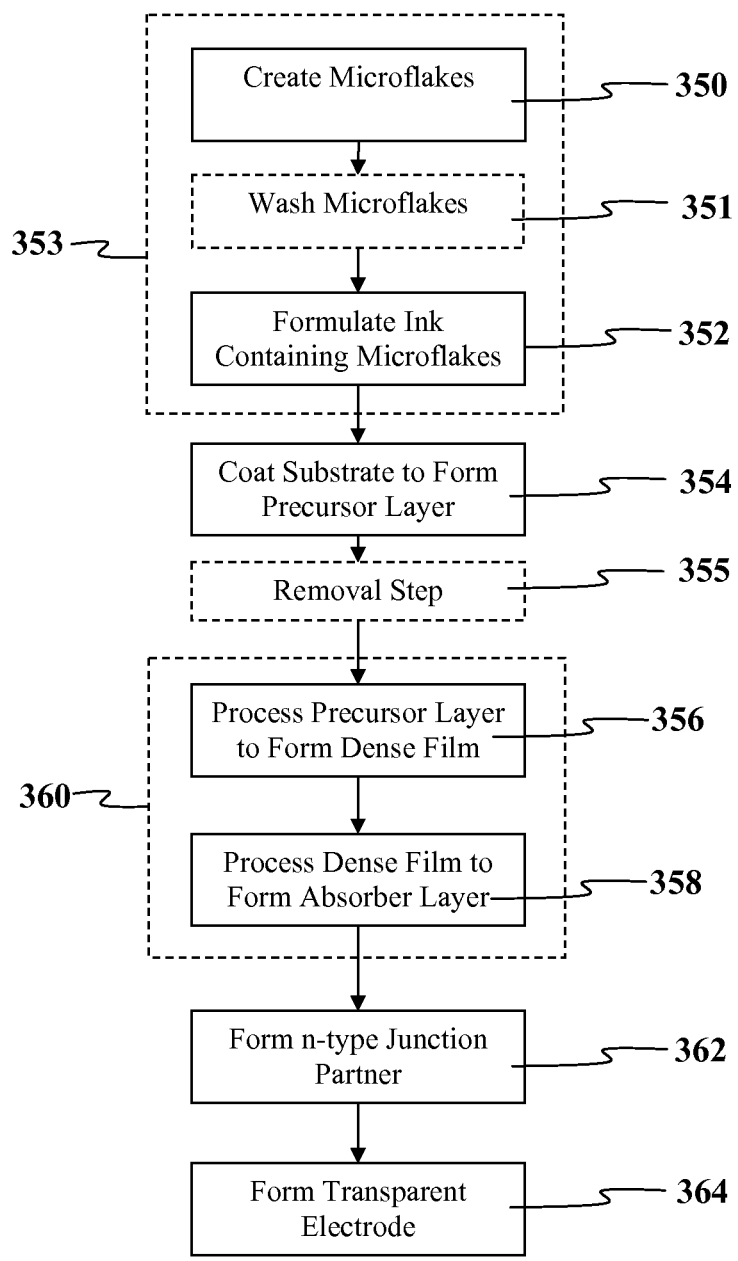
FIG. 6 shows a flowchart of a method according to one embodiment of the present invention.

Referring now to FIG. 6, a flowchart showing one embodiment of a method according to the present invention will now be described. FIG. 6 shows that at step 350, the microflakes 108 may be created using one of the processes described herein. Optionally, there may be a washing step 351 to remove any undesired residue. Once the microflakes 108 are created, step 352 shows that the ink may be formulated with the microflakes and at least one other component such as but not limited to a carrier liquid. Optionally, it should be understood that some embodiments of the invention may combine the steps 350 and 352 into one process step as indicated by box 353 (shown in phantom) if the creation process results in a coatable formulation. As one nonlimiting example, this may be the case if the dispersants and/or solvents used during formation can also be used to form a good coating. At step 354, the substrate 102 may be coated with the ink to form the precursor layer 106. Optionally, there may be a step 355 of removing dispersant and/or other residual of the as-coated layer 106 by methods such as but not limited to heating, washing, or the like. Optionally, step 355 may involve a step of removing solve after ink deposition by using a drying device such as but not limited to a drying tunnel/furnace. Step 356 shows the precursor layer is processed to form a dense film which may then further be processed at step 358 to form the absorber layer. Optionally, it should be understood that some embodiments of the invention may combine the steps 356 and 358 into one process step if the dense film is an absorber layer and no further processing of the film is needed. Step 360 shows that the n-type junction may be formed over and/or in contact with the absorber layer. Step 362 shows that a transparent electrode may be formed over the n-type junction layer to create a stack that can function as a solar cell.

Figure 7:
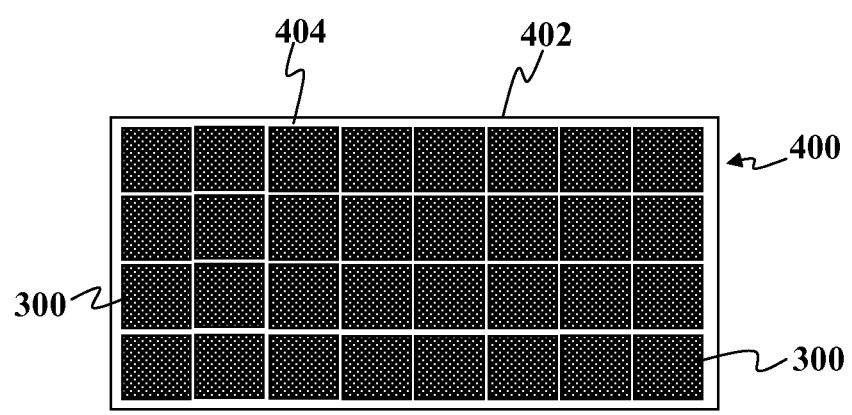
FIG. 7 shows a module having a plurality of photovoltaic devices according to one embodiment of the present invention.

Referring now to FIG. 7, it should also be understood that a plurality of devices 300 may be incorporated into a module 400 to form a solar module that includes various packaging, durability, and environmental protection features to enable the devices 300 to be installed in an outdoor environment. In one embodiment, the module 400 may include a frame 402 that supports a substrate 404 on which the devices 300 may be mounted. This module 400 simplifies the installation process by allowing a plurality of devices 300 to be installed at one time. Alternatively, flexible form factors may also be employed. It should also be understood that an encapsulating device and/or layers may be used to protect from environmental influences. As a nonlimiting example, the encapsulating device and/or layers may block the ingress of moisture and/or oxygen and/or acidic rain into the device, especially over extended environmental exposure.

Extra Source of Chalcogen

It should be understood that the present invention using microflakes may also use an extra chalcogen source in a manner similar to that described in copending, U.S. patent application Ser. No. 11/290,633, now U.S. Pat. No. 8,048,477, wherein the precursor material contains 1) chalcogenides such as, but not limited to, copper selenide, and/or indium selenide and/or gallium selenide and/or 2) a source of extra chalcogen such as, but not limited to, Se or S nanoparticles less than about 200 nanometers in size. In one nonlimiting example, the chalcogenide and/or the extra chalcogen may be in the form of microflakes and/or nanoflakes while the extra source of chalcogen may be flakes and/or non-flakes. The chalcogenide microflakes may be one or more binary alloy chalcogenides such as, but not limited to, group IB-binary chalcogenide nanoparticles (e.g. group IB non-oxide chalcogenides, such as Cu—Se, Cu—S or Cu—Te) and/or group IIIA-chalcogenide nanoparticles (e.g., group IIIA non-oxide chalcogenides, such as Ga(Se, S, Te), In(Se, S, Te) and Al(Se, S, Te). In other embodiments, the microflakes may be non-chalcogenides such as but not limited to group IB and/or IIIA materials like Cu—In, Cu—Ga, and/or In—Ga. If the chalcogen melts at a relatively low temperature (e.g., 220° C. for Se, 120° C. for S) the chalcogen is already in a liquid state and makes good contact with the microflakes. If the microflakes and chalcogen are then heated sufficiently (e.g., at about 375° C.), the chalcogen reacts with the chalcogenides to form the desired IB-IIIA-chalcogenide material.

Figure 8A:
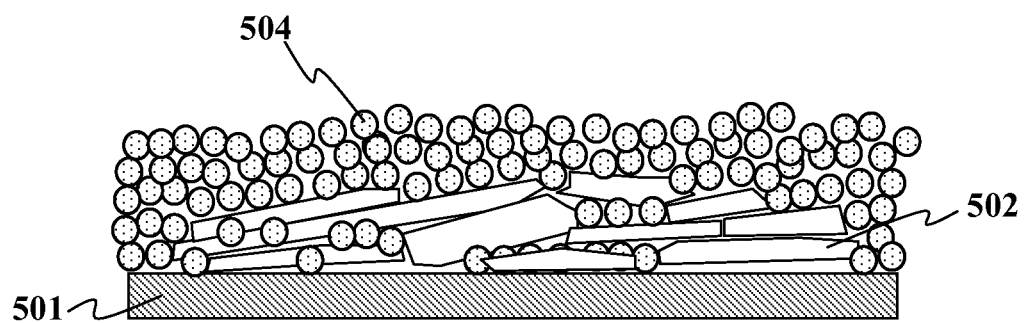
FIGS. 8A-8C show a schematic view of planar particles used with spherical particles according to one embodiment of the present invention.
Figure 8B:
Figure 8B:
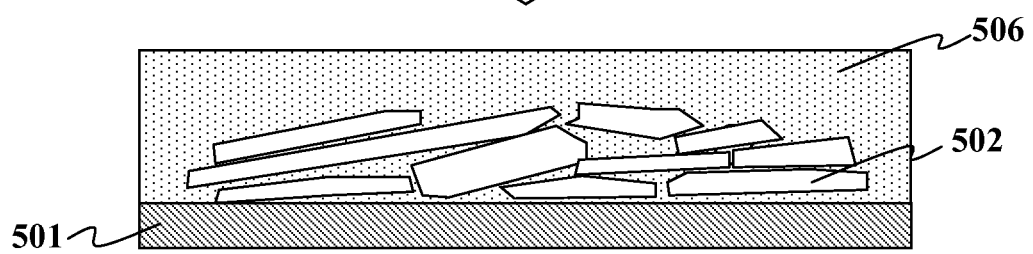
Figure 8C:
Figure 8C:

Referring now to FIGS. 8A-8C, the chalcogenide microflakes 502 and a source of extra chalcogen, e.g., in the form of a powder containing chalcogen particles 504 may be supported on a substrate 501. As a nonlimiting example, the chalcogen particles may be micron- and/or submicron-sized non-oxygen chalcogen (e.g., Se, S or Te) particles, e.g., a few hundred nanometers or less to a few microns in size. The mixture of chalcogenide microflakes 502 and chalcogen particles 504 is placed on the substrate 501 and heated to a temperature sufficient to melt the extra chalcogen particles 504 to form a liquid chalcogen 506 as shown in FIG. 8B. The liquid chalcogen 506 and chalcogenides 502 are heated to a temperature sufficient to react the liquid chalcogen 506 with the chalcogenides 502 to form a dense film of a group IB-IIIA-chalcogenide compound 508 as shown in FIG. 1C. The dense film of group IB-IIIA-chalcogenide compound is then cooled down.

Although not limited to the following, the chalcogenide particles 502 may be obtained starting from a binary chalcogenide feedstock material, e.g., micron size particles or larger. Examples of chalcogenide materials available commercially are listed below in Table 1.

TABLE I

| Chemical | Formula | Typical % Purity |
| --- | --- | --- |
| Aluminum selenide | Al2Se3 | 99.5 |
| Aluminum sulfide | Al2S3 | 98 |
| Aluminum sulfide | Al2S3 | 99.9 |
| Aluminum telluride | Al2Te3 | 99.5 |
| Copper selenide | Cu—Se | 99.5 |
| Copper selenide | Cu2Se | 99.5 |
| Gallium selenide | Ga2Se3 | 99.999 |
| Copper sulfide | Cu2S(may be Cu1.8—2S) | 99.5 |
| Copper sulfide | CuS | 99.5 |
| Copper sulfide | CuS | 99.99 |
| Copper telluride | CuTe(generally Cu1.4Te) | 99.5 |
| Copper telluride | Cu2Te | 99.5 |
| Gallium sulfide | Ga2S3 | 99.95 |
| Gallium sulfide | GaS | 99.95 |
| Gallium telluride | GaTe | 99.999 |
| Gallium telluride | Ga2Te3 | 99.999 |
| Indium selenide | In2Se3 | 99.999 |
| Indium selenide | In2Se3 | 99.99% |
| Indium selenide | In2Se3 | 99.9 |
| Indium selenide | In2Se3 | 99.9 |
| Indium sulfide | InS | 99.999 |
| Indium sulfide | In2S3 | 99.99 |
| Indium telluride | In2Te3 | 99.999 |
| Indium telluride | In2Te3 | 99.999 |

Examples of chalcogen powders and other feedstocks commercially available are listed in Table II below.

TABLE II

| Chemical | Formula | Typical % Purity |
|---|---|---|
| Selenium metal | Se | 99.99 |
| Selenium metal | Se | 99.6 |
| Selenium metal | Se | 99.6 |
| Selenium metal | Se | 99.999 |
| Selenium metal | Se | 99.999 |
| Sulfur | S | 99.999 |
| Tellurium metal | Te | 99.95 |
| Tellurium metal | Te | 99.5 |
| Tellurium metal | Te | 99.5 |
| Tellurium metal | Te | 99.9999 |
| Tellurium metal | Te | 99.99 |
| Tellurium metal | Te | 99.999 |
| Tellurium metal | Te | 99.999 |
| Tellurium metal | Te | 99.95 |
| Tellurium metal | Te | 99.5 |

Printing a Layer of the Extra Source of Chalcogen

Figure 9A:
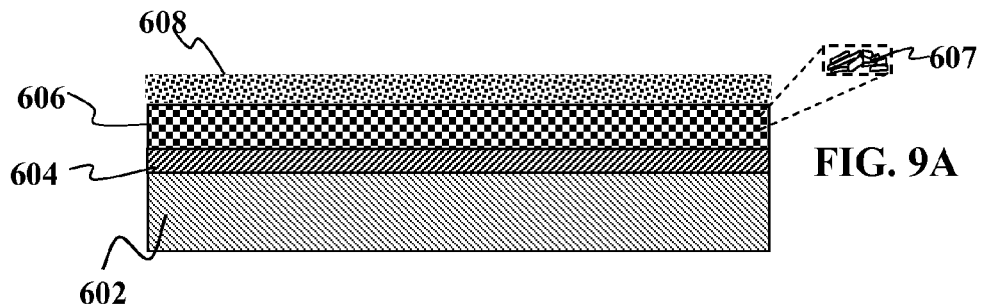
FIGS. 9A-9D show a schematic view of a discrete printed layer of a chalcogen source used with planar particles according to one embodiment of the present invention.
Figure 9B:
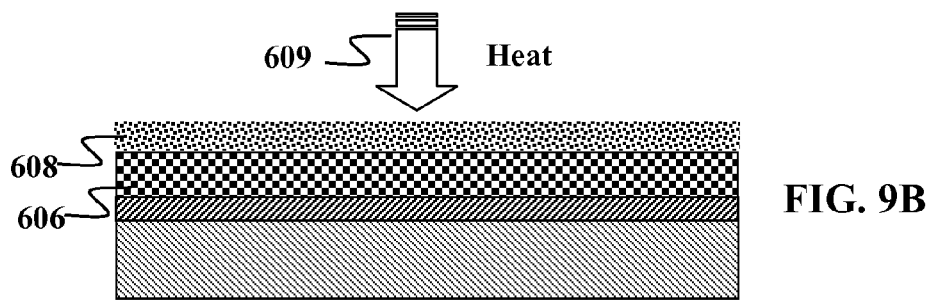
Figure 9C:
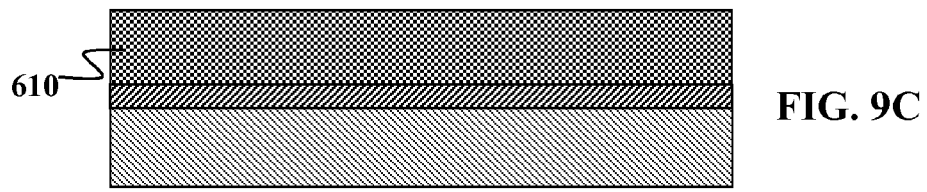

Referring now to FIGS. 9A-9E, another embodiment of the present invention using microflakes will now be described. FIG. 9A shows a substrate 602 with a contact layer 604 on which a microflake precursor layer 606 is formed. An extra source of chalcogen may be provided as a discrete layer 608 containing an extra source of chalcogen such as, but not limited to, elemental chalcogen particles 607 over a microflake precursor layer 606. By way of example, and without loss of generality, the chalcogen particles may be particles of selenium, sulfur or tellurium. As shown in FIG. 9B, heat 609 is applied to the microflake precursor layer 606 and the layer 608 containing the chalcogen particles to heat them to a temperature sufficient to melt the chalcogen particles 607 and to react the chalcogen particles 607 with the elements in the precursor layer 606. It should be understood that the microflakes may be made of a variety of materials include but not limited to group IB elements, group IIIA elements, and/or group VIA elements. The reaction of the chalcogen particles 607 with the elements of the precursor layer 606 forms a compound film 610 of a group IB-IIIA-chalcogenide compound as shown in FIG. 9C. Preferably, the group IB-IIIA-chalcogenide compound is of the form $CuIn_{1-x}Ga_xSe_{2(1-y)}S_{2y}$, where $0 \leq x \leq 1$ and $0 \leq y \leq 1$. It should be understood that in some embodiments, the precursor layer 106 may be heated prior to application of the layer 108 with the extra source of chalcogen. In other embodiments, the precursor layer 106 is not pre-heated and the layers 106 and 108 are heated together.

In one embodiment of the present invention, the precursor layer 606 may be between about 4.0 to about 0.5 microns thick. The layer 608 containing chalcogen particles 607 may have a thickness in the range of about 4.0 microns to about 0.5 microns. The chalcogen particles 607 in the layer 608 may be between about 1 nanometer and about 25 microns in size, preferably between about 25 nanometers and about 300 nanometers in size. It is noted that the chalcogen particles 607 may be initially larger than the final thickness of the IB-IIIA-VIA compound film 610. The chalcogen particles 607 may be mixed with solvents, carriers, dispersants etc. to prepare an ink or a paste that is suitable for wet deposition over the precursor layer 606 to form the layer 608. Alternatively, the chalcogen particles 607 may be prepared for deposition on a substrate through dry processes to form the layer 608. It is also noted that the heating of the layer 608 containing chalcogen particles 607 may be carried out by an RTA process, e.g., as described above.

The chalcogen particles 607 (e.g., Se or S) may be formed in several different ways. For example, Se or S particles may be formed starting with a commercially available fine mesh powder (e.g., 200 mesh/75 micron) and ball milling the powder to a desirable size. A typical ball milling procedure may use a ceramic milling jar filled with grinding ceramic balls and a feedstock material, which may be in the form of a powder, in a liquid medium. When the jar is rotated or shaken, the balls shake and grind the powder in the liquid medium to reduce the size of the particles of the feedstock material. Optionally, the process may include dry (pre-) grinding of bigger pieces of material such as but not limited to Se. The dry-grinding may use pieces 2-6 mm and smaller, but it would be able to handle bigger pieces as well. Note that this is true for all size reductions where the process may start with bigger feedstock materials, dry grinding, and subsequently starting wet grinding (such as but not limited to ball milling). The mill itself may range from a small media mill to a horizontal rotating ceramic jar.

Figure 9D:
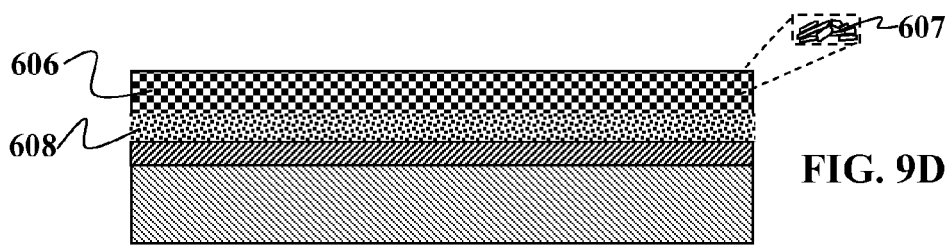

Referring now to FIG. 9D, it should also be understood that in some embodiments, the layer 608 of chalcogen particles may be formed below the precursor layer 606. This position of the layer 608 still allows the chalcogen particles to provide a sufficient surplus of chalcogen to the precursor layer 606 to fully react with the group IB and group IIIA elements in layer 606. Additionally, since the chalcogen released from the layer 608 may be rising through the layer 606, this position of the layer 608 below layer 606 may be beneficial to generate greater intermixing between elements. The thickness of the layer 608 may be in the range of about 4.0 microns to about 0.5 microns. In still other embodiments, the thickness of layer 608 may be in the range of about 500 nm to about 50 nm. In one nonlimiting example, a separate Se layer of about 100 nm or more might be sufficient. The coating of chalcogen may incorporate coating with powder, Se evaporation, or other Se deposition method such as but not limited to chemical vapor deposition (CVD), physical vapor deposition (PVD), atomic layer deposition (ALD), electroplating, and/or similar or related methods using singly or in combination. Other types of material deposition technology may be used to get Se layers thinner than 0.5 microns or thinner than 1.0 micron. It should also be understood that in some embodiments, the extra source of chalcogen is not limited to only elemental chalcogen, but in some embodiments, may be an alloy and/or solution of one or more chalcogens.

Optionally, it should be understood that the extra source of chalcogen may be mixed with and/or deposited within the precursor layer, instead of as a discrete layer. In one embodiment of the present invention, oxygen-free particles or substantially oxygen-free particles of chalcogen could be used. If the chalcogen is used with microflakes and/or plate shaped precursor materials, densification might not end up an issue due to the higher density achieved by using planar particles, so there is no reason to exclude printing Se and/or other source of chalcogen within the precursor layer as opposed to a discrete layer. This may involve not having to heat the precursor layer to the previous processing temperatures. In some embodiments, this may involve forming the film without heating above 400° C. In some embodiments, this may involve not having to heat above about 300° C.

In still other embodiments of the present invention, multiple layers of material may be printed and reacted with chalcogen before deposition of the next layer. One nonlimiting example would be to deposit a Cu—In—Ga layer, anneal it, then deposit an Se layer then treat that with RTA, follow that up by depositing another precursor layer rich in Ga, followed by another deposition of Se, and finished by a second RTA treatment. More generically, this may include forming a precursor layer (either heat or not) then coating a layer of the extra source of chalcogen (then heat or not) then form another layer of more precursor (heat or not) and then for another layer of the extra source of chalcogen (then heat or not) and repeat as many times as desired to grade the composition or nucleating desired crystal sizes. In one nonlimiting example, this may be used to grade the gallium concentration. In another embodiment, this may be used to grade the copper concentration. In yet another embodiment, this may be used to grade the indium concentration. In a still further embodiment, this may be used to grade the selenium concentration. In yet another embodiment this may be used to grade the selenium concentration. Another reason would be to first grow copper rich films to get big crystals and then to start adding copper-poor layers to get the stoichiometry back. Of course this embodiment can combined to allow the chalcogen to be deposited in the precursor layer for any of the steps involved.

Figure 9E:
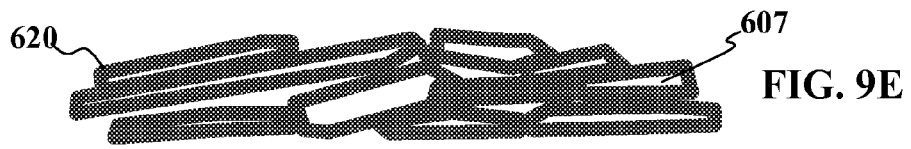
FIG. 9E shows particles having a shell of chalcogen according to one embodiment of the present invention.

Referring now to FIG. 9E, an alternative way to take advantage of the low melting points of chalcogens such as but not limited to Se and S is to form core-shell microflakes in which the core is a microflake 607 and the shell 620 is a chalcogen coating. The chalcogen 620 melts and quickly reacts with the material of the core microflakes 607. As a nonlimiting example, the core may be a mix of elemental particles of groups IB (e.g., Cu) and/or 111A (e.g., Ga and In), which may be obtained by ball milling of elemental feedstock to a desired size. Examples of elemental feedstock materials available are listed in Table III below. The core may also be a chalcogenide core or other material as described herein.

TABLE III

| Chemical | Formula | Typical % Purity |
| --- | --- | --- |
| Copper metal | Cu | 99.99 |
| Copper metal | Cu | 99 |
| Copper metal | Cu | 99.5 |
| Copper metal | Cu | 99.5 |
| Copper metal | Cu | 99 |
| Copper metal | Cu | 99.999 |
| Copper metal | Cu | 99.999 |
| Copper metal | Cu | 99.9 |
| Copper metal | Cu | 99.5 |
| Copper metal | Cu | 99.9 ($O_2$ typ. 2-10%) |
| Copper metal | Cu | 99.99 |
| Copper metal | Cu | 99.997 |
| Copper metal | Cu | 99.99 |
| Gallium metal | Ga | 99.999999 |
| Gallium metal | Ga | 99.99999 |
| Gallium metal | Ga | 99.99 |
| Gallium metal | Ga | 99.9999 |
| Gallium metal | Ga | 99.999 |
| Indium metal | In | 99.9999 |
| Indium metal | In | 99.999 |
| Indium metal | In | 99.999 |
| Indium metal | In | 99.99 |
| Indium metal | In | 99.999 |
| Indium metal | In | 99.99 |
| Indium metal | In | 99.99 |

Chalcogen-Rich Chalcogenide Particles

Figure 10A:
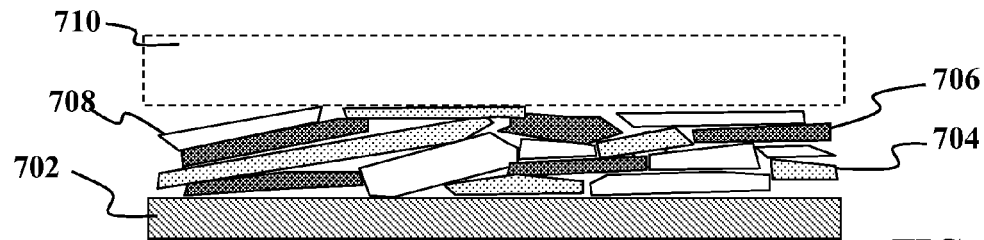
FIGS. 10A-10C show the use of chalcogenide planar particles according to one embodiment of the present invention.
Figure 10B:
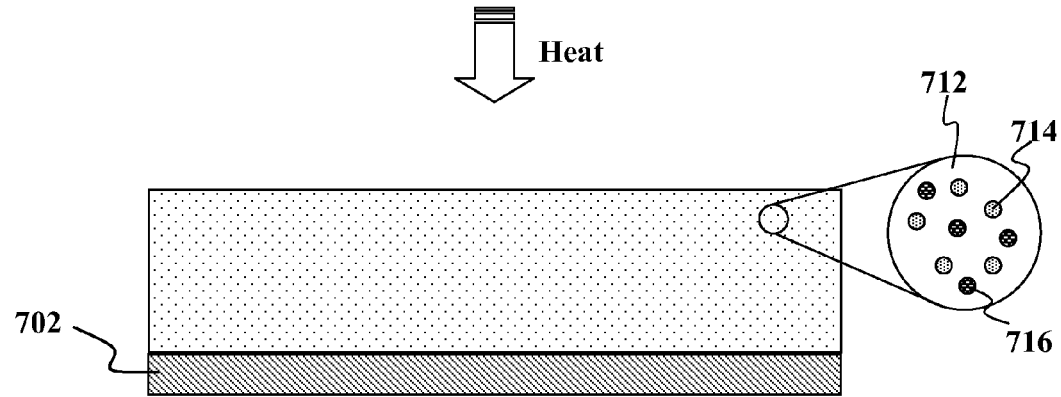
Figure 10C:
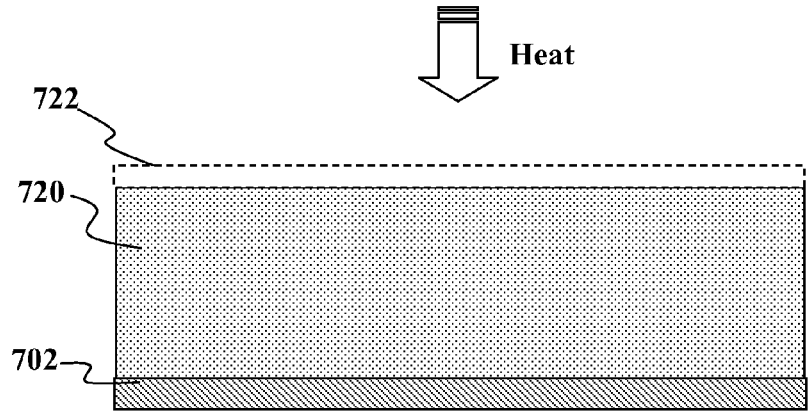

Referring now to FIGS. 10A-10C, it should be understood that yet another embodiment of the present invention includes embodiments where the microflake particles may be chalcogenide particles that are chalcogen-rich (whether they be group IB-chalcogenides, group IIIA chalcogenides, or other chalcogenides). In these embodiments, the use of a separate source of chalcogen may not be needed since the excess chalcogen is contained within the chalcogenide particles themselves. In one nonlimiting example of a group IB-chalcogenide, the chalcogenide may be copper selenide, wherein the material comprises $Cu_xSe_y$, wherein x<y. Thus, this is a chalcogen-rich chalcogenide that will provide excess amounts of selenium when the particles of the precursor material are processed.

The purpose of providing an extra source of chalcogen is to first create liquid to enlarge the contact area between the initial solid particles (flakes) and the liquid. Secondly, when working with chalcogen-poor films, the extra source adds chalcogen to get to the stoichiometric desired chalcogen amount. Third, chalcogens such as Se are volatile and inevitably some is lost during processing. So, main purpose is to create liquid. There are also a variety of other routes to increase the amount of liquid when the precursor layer is processed. These routes include but are not limited to: 1) Cu—Se more Se-rich than Cu2-xSe (>377° C., even more liquid above >523° C.); 2) Cu—Se equal to or more Se-rich than Cu2Se when adding additional Se (>220° C.); 3) In—Se of composition In4Se3, or in between In4Se3 and In1Se1 (>550° C.); 4) In—Se equal to or more Se-rich than In4Se3 when adding additional Se (>220° C.); 5) In—Se in between In and In4Se3 (>156° C., preferably in an oxygen-free environment since In is created 6) Ga-emulsion (>29° C., preferably oxygen-free); and hardly (but possible) for Ga—Se. Even when working with Se vapor, it still would be tremendously advantageous to create additional liquid in the precursor layer itself using one of the above methods or by a comparable method.

Referring now to FIG. 10A, it should be understood that the ink may contain multiple types of particles. In FIG. 10A, the particles 704 are a first type of particle and the particles 706 are a second type of particle. In one nonlimiting example, the ink may have multiple types of particles wherein only one type of particle is a chalcogenide and is also chalcogen-rich. In other embodiments, the ink may have particles wherein at least two types of chalcogenides in the ink are chalcogen-rich. As a nonlimiting example, the ink may have $Cu_xSe_y$ (wherein x<y) and $In_aSe_b$ (wherein a<b). In still further embodiments, the ink may have particles 704, 706, and 708 (shown in phantom) wherein at least three types of chalcogenide particles are in the ink. By way of nonlimiting example, the chalcogen-rich chalcogenide particles may be Cu—Se, In—Se, and/or Ga—Se. All three may be chalcogen-rich. A variety of combinations are possible to obtain the desired excess amount of chalcogen. If the ink has three types of particles, it should be understood that not all of the particles need to be chalcogenides or chalcogen rich. Even within an ink with only one type of particle, e.g. Cu—Se, there may be a mixture of chalcogen-rich particles e.g. $Cu_xSe_y$ with x<y, and non-chalcogen-rich particles, e.g. $Cu_xSe_y$ with x>y. As a nonlimiting example, a mixture may contain particles of copper selenide that may have the following compositions: $Cu_1Se_1$ and $Cu_1Se_2$.

Referring still to FIG. 10A, it should also be understood that even with the chalcogen-rich particles, an additional layer 710 (shown in phantom) may be also printed or coated on to the ink to provide an excess source of chalcogen as described previously. The material in this layer may be a pure chalcogen, a chalcogenide, or a compound that contains chalcogen. As seen in FIG. 10C, the additional layer 710 (shown in phantom) may also be printed onto the resulting film if further processing with chalcogen is desired.

Referring now to FIG. 10B, heat may be applied to the particles 704 and 706 to begin converting them. Due to the various melting temperatures of the materials in the particles, some may start to assume a liquid form sooner than others. In the present invention, this is particularly advantageous if the materials assuming liquid form also release the excess chalcogen as a liquid 712 which may surround the other materials and/or elements such as 714 and 716 in the layer. FIG. 10B includes a view with an enlarged view of the liquid 712 and materials and/or elements 714 and 716.

The amount of extra chalcogen provided by all of the particles overall is at a level that is equal to or above the stoichiometric level found in the compound after processing. In one embodiment of the present invention, the excess amount of chalcogen comprises an amount greater than the sum of 1) a stoichiometric amount found in the final IB-IIIA-chalcogenide film and 2) a minimum amount of chalcogen necessary to account for losses during processing to form the final IB-IIIA-chalcogenide having the desired stoichiometric ratio. Although not limited to the following, the excess chalcogen may act as a flux that will liquefy at the processing temperature and promote greater atomic intermixing of particles provided by the liquefied excess chalcogen. The liquefied excess chalcogen may also ensure that sufficient chalcogen is present to react with the group IB and IIIA elements. The excess chalcogen helps to "digest" or "solubilize" the particles or flakes. The excess chalcogen will escape from the layer before the desired film is fully formed.

Referring now to FIG. 10C, heat may continue to be applied until the group IB-IIIA chalcogenide film 720 is formed. Another layer 722 (shown in phantom) may be applied for further processing of the film 720 if particular features are desired. As a nonlimiting example, an extra source of gallium may be added to the top layer and further reacted with the film 720. Others sources may provide additional selenium to improve selenization at the top surface of the film 720. Selenization may also occur by using a selenium vapor atmosphere.

It should be understood that a variety of chalcogenide particles may also be combined with non-chalcogenide particles to arrive at the desired excess supply of chalcogen in the precursor layer. The following table (Table IV) provides a non-limiting matrix of some of the possible combinations between chalcogenide particles listed in the rows and the non-chalcogenide particles listed in the columns. It should also be understood that two more materials from the columns may be combined. As a nonlimiting example, Cu—Ga+In+Se may also be combined even though the are from different columns. Another possibility involves, Cu—Ga+In—Ga+Se (or some other chalcogen source).

TABLE IV

|  | Cu | In | Ga | Cu—In |
|---|---|---|---|---|
| Se | Se + Cu | Se + In | Se + Ga | Se + Cu—In |
| Cu—Se | Cu—Se + Cu | Cu—Se + In | Cu—Se + Ga | Cu—Se + Cu—In |
| In—Se | In—Se + Cu | In—Se + In | In—Se + Ga | In—Se + Cu—In |
| Ga—Se | Ga—Se + Cu | Ga—Se + In | Ga—Se + Ga | Ga—Se + Cu—In |
| Cu—In—Se | Cu—In—Se + Cu | Cu—In—Se + In | Cu—In—Se + Ga | Cu—In—Se + Cu—In |
| Cu—Ga—Se | Cu—Ga—Se + Cu | Cu—Ga—Se + In | Cu—Ga—Se + Ga | Cu—Ga—Se + Cu—In |
| In—Ga—Se | In—Ga—Se + Cu | In—Ga—Se + In | In—Ga—Se + Ga | In—Ga—Se + CuIn |
| Cu—In—Ga—Se | Cu—In—Ga—Se + Cu | Cu—In—Ga—Se + In | Cu—In—Ga—Se + Ga | Cu—In—Ga—Se + CuIn |

|  | Cu—Ga | In—Ga | Cu—In—Ga |
|---|---|---|---|
| Se | Se + Cu—Ga | Se + In—Ga | Se + Cu—In—Ga |
| Cu—Se | Cu—Se + Cu—Ga | Cu—Se + In—Ga | Cu—Se + Cu—In—Ga |
| In—Se | In—Se + Cu—Ga | In—Se + In—Ga | In—Se + Cu—In—Ga |
| Ga—Se | Ga—Se + Cu—Ga | Ga—Se + In—Ga | Ga—Se + Cu—In—Ga |
| Cu—In—Se | Cu—In—Se + Cu—Ga | Cu—In—Se + In—Ga | Cu—In—Se + Cu—In—Ga |
| Cu—Ga—Se | Cu—Ga—Se + Cu—Ga | Cu—Ga—Se + In—Ga | Cu—Ga—Se + Cu—In—Ga |
| In—Ga—Se | In—Ga—Se + Cu—Ga | In—Ga—Se + In—Ga | In—Ga—Se + Cu—In—Ga |
| Cu—In—Ga—Se | Cu—In—Ga—Se + Cu—Ga | Cu—In—Ga—Se + In—Ga | Cu—In—Ga—Se + Cu—In—Ga |

In yet another embodiment, the present invention may combine a variety of chalcogenide particles with other chalcogenide particles. The following table (Table V) provides a non-limiting matrix of some of the possible combinations between chalcogenide particles listed for the rows and chalcogenide particles listed for the columns.

TABLE V

|  | Cu—Se | In—Se | Ga—Se | Cu—In—Se |
|---|---|---|---|---|
| Se | Se + Cu—Se | Se + In—Se | Se + Ga—Se | Se + Cu—In—Se |
| Cu—Se | Cu—Se | Cu—Se + In—Se | Cu—Se + Ga—Se | Cu—Se + Cu—In—Se |
| In—Se | In—Se + Cu—Se | In—Se | In—Se + Ga—Se | In—Se + Cu—In—Se |
| Ga—Se | Ga—Se + Cu—Se | Ga—Se + In—Se | Ga—Se | Ga—Se + Cu—In—Se |
| Cu—In—Se | Cu—In—Se + Cu—Se | Cu—In—Se + In—Se | Cu—In—Se + Ga—Se | Cu—In—Se |
| Cu—Ga—Se | Cu—Ga—Se + Cu—Se | Cu—Ga—Se + In—Se | Cu—Ga—Se + Ga—Se | Cu—Ga—Se + Cu—In—Se |
| In—Ga—Se | In—Ga—Se + Cu—Se | In—Ga—Se + In—Se | In—Ga—Se + Ga—Se | In—Ga—Se + Cu—In—Se |
| Cu—In—Ga—Se | Cu—In—Ga—Se + Cu—Se | Cu—In—Ga—Se + In—Se | Cu—In—Ga—Se + Ga—Se | Cu—In—Ga—Se + Cu—In—Se |

|  | Cu—Ga—Se | In—Ga—Se | Cu—In—Ga—Se |
|---|---|---|---|
| Se | Se + Cu—Ga—Se | Se + In—Ga—Se | Se + Cu—In—Ga—Se |
| Cu—Se | Cu—Se + Cu—Ga—Se | Cu—Se + In—Ga—Se | Cu—Se + Cu—In—Ga—Se |

TABLE V-continued

| In—Se | In—Se + Cu—Ga—Se | In—Se + In—Ga—Se | In—Se + Cu—In—Ga—Se |
|---|---|---|---|
| Ga—Se | Ga—Se + Cu—Ga—Se | Ga—Se + In—Ga—Se | Ga—Se + Cu—In—Ga—Se |
| Cu—In—Se | Cu—In—Se + Cu—Ga—Se | Cu—In—Se + In—Ga—Se | Cu—In—Se + Cu—In—Ga—Se |
| Cu—Ga—Se | Cu—Ga—Se | Cu—Ga—Se + In—Ga—Se | Cu—Ga—Se + Cu—In—Ga—Se |
| In—Ga—Se | In—Ga—Se + Cu—Ga—Se | In—Ga—Se | In—Ga—Se + Cu—In—Ga—Se |
| Cu—In—Ga—Se | Cu—In—Ga—Se + Cu—Ga—Se | Cu—In—Ga—Se + In—Ga—Se | Cu—In—Ga—Se |

Nucleation Layer

Figure 11A:
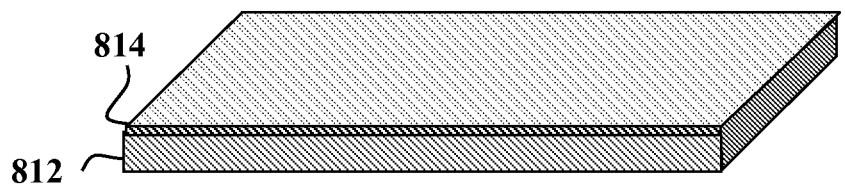
FIGS. 11A-11C show a nucleation layer according to one embodiment of the present invention.
Figure 11B:
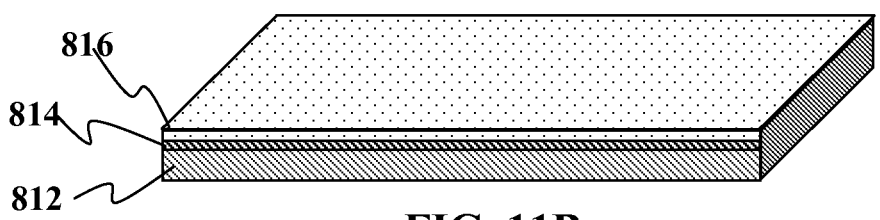
Figure 11C:
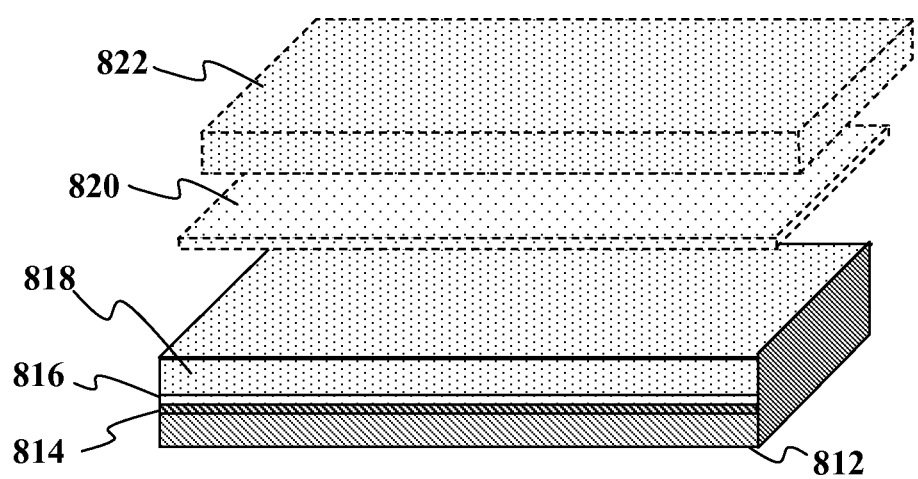

Referring now to FIGS. 11A-11C, yet another embodiment of the present invention using particles or flakes such as but not limited to microflakes will now be described. This embodiment provides a method for improving crystal growth on the substrate by depositing a thin group IB-IIIA chalcogenide layer on the substrate to serve as a nucleation plane for film growth for the precursor layer which is formed on top of the thin group IB-IIIA chalcogenide layer. This nucleation layer of a group IB-IIIA chalcogenide may be deposited, coated, or formed prior to forming the precursor layer. The nucleation layer may be formed using vacuum or non-vacuum techniques. The precursor layer formed on top of the nucleation layer may be formed by a variety of techniques including but not limited to using an ink containing a plurality of microflakes as described in this application.

FIG. 11A shows that the absorber layer may be formed on a substrate 812, as shown in FIG. 11A. A surface of the substrate 812, may be coated with a contact layer 814 to promote electrical contact between the substrate 812 and the absorber layer that is to be formed on it. By way of example, an aluminum substrate 812 may be coated with a contact layer 814 of molybdenum. As discussed herein, forming or disposing a material or layer of material on the substrate 812 includes disposing or forming such material or layer on the contact layer 814, if one is used.

As shown in FIG. 11B, a nucleation layer 816 is formed on the substrate 812. This nucleation layer may comprise of a group IB-IIIA chalcogenide and may be deposited, coated, or formed prior to forming the precursor layer. As a nonlimiting example, this may be a CIGS layer, a Ga—Se layer, any other high-melting IB-IIIA-chalcogenide layer, or even a thin layer of gallium.

Referring now to FIG. 11C, once the nucleation layer is formed, the precursor layer 818 may be formed on top of the nucleation layer. In some embodiments, the nucleation layer and the precursor layer may be formed simultaneously. The precursor layer 818 may contain one or more group IB elements and one or more group IIIA elements. Preferably, the one or more group IB elements include copper. The one or more group IIIA elements may include indium and/or gallium. The precursor layer may be formed from a film, e.g., using any of the techniques described above.

Referring still to FIG. 11C, it should also be understood that the structure of the alternating nucleation layer and precursor layer may be repeated in the stack. FIG. 11C show that, optionally, another nucleation layer 820 (shown in phantom) may be formed over the precursor layer 818 to continue the structure of alternating nucleation layer and precursor layer. Another precursor layer 822 may then be formed over the nucleation layer 820 to continue the layering, which may be repeated as desired. Although not limited to the following, there may be 2, 3, 4, 5, 6, 7, 8, 9, 10, or more sets of alternating nucleation layers and precursor layers to build up the desired qualities. The each set may have different materials or amounts of materials as compared to other sets in the stack. The alternating layers may be solution deposited, vacuum deposited or the like. Different layers may be deposited by different techniques. In one embodiment, this may involve solution depositing (or vacuum depositing) a precursor layer (optionally with a desired Cu-to-In-to-Ga ratio), subsequently adding chalcogen (solution-based, vacuum-based, or otherwise such as but not limited to vapor or $H_2Se$, ec . . . ), optionally heat treating this stack (during or after introduction of the chalcogen source), subsequently depositing an additional precursor layer (optionally with a desired Cu-to-In-to-Ga ratio), and finally heat treating the final stack (during or after the introduction of additional chalcogen). The goal is to create planar nucleation so that there are no holes or areas where the substrate will not be covered by subsequent film formation and/or crystal growth. Optionally, the chalcogen source may also be introduced before adding the first precursor layer containing Cu+In+Ga. It should also be understood that in some other embodiments, layer 820 may be a chalcogen containing layer, such as but not limited to a selenium layer, and be heated with each precursor layer (or at the end after all precursor layers are formed).

Nucleation Layer by Thermal Gradient

Figure 12A:
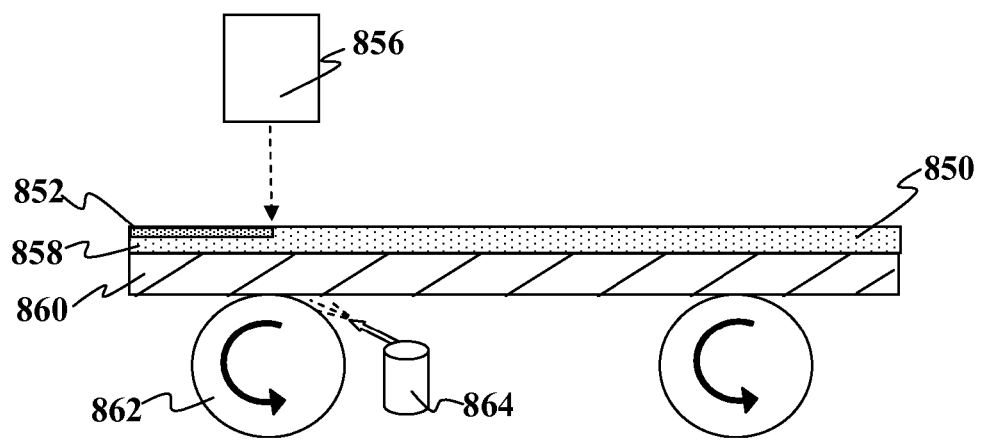
FIGS. 12A-12B show schematics of devices which may be used to create a nucleation layer through a thermal gradient.
Figure 12B:
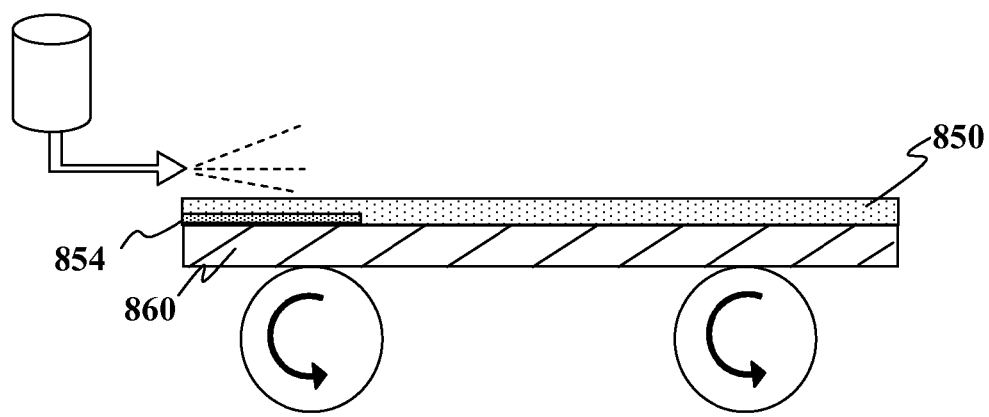

Referring now to FIGS. 12A-12B, it should be understood that a nucleation layer for use with a microflake based precursor material may also be formed by creating a thermal gradient in the precursor layer 850. As a nonlimiting example, the nucleation layer 852 may be formed starting from the upper portion of the precursor layer or optionally by forming the nucleation layer 854 from a lower portion of the precursor layer. In one embodiment of the present invention, the nucleation layer may be viewed as being a layer where an initial IB-IIIA-VIA compound crystal growth is preferred over crystal growth in another location of the precursor layer and/or stacks of precursor layers. The nucleation layer 852 or 854 is formed by creating a thermal gradient in the precursor layer such that one portion of the layer reaches a temperature sufficient to begin crystal growth. The nucleation layer may be in the form a nucleation plane having a substantially planar configuration to promote a more even crystal growth across the substrate while minimizing the formation of pinholes and other anomalies.

As seen in FIG. 12A, in one embodiment of the present invention, the thermal gradient used to form the nucleation layer 852 may be created by using a laser 856 to increase only an upper portion of the precursor layer 850 to a processing temperature. The laser 856 may be pulsed or otherwise controlled to not heat the entire thickness of the precursor layer to a processing temperature. The backside 858 of the precursor layer and the substrate 860 supporting it may be in contact with cooled rollers 862, cooled planar contact surface, or cooled drums which provide an external source of cooling to prevent lower portions of the layer from reaching processing temperature. Cooled gas 864 may also be provided on one side of the substrate and adjacent portion of the precursor layer to lower the temperature of the precursor layer below a processing temperature where nucleation to the final IB-IIIA-chalcogenide compound begins. It should be understood that other devices may be used to heat the upper portion of the precursor layer such as but not limited to, pulsed thermal processing, plasma heating, or heating via IR lamps.

As seen in FIG. 12B, in another embodiment of the present invention, the nucleation layer 854 may be formed on a lower portion of the precursor layer 850 using techniques similar to those described above. Since the substrate 860 used with the present invention may be selected to be thermally conductive, underside heating of the substrate will also cause heating of a lower portion of the precursor layer. The nucleation plane will then form along the bottom portion of the lower portion. The upper portion of the precursor layer may be cooled by a variety of techniques such as, but not limited to, cooled gas, cooled rollers, or other cooling device.

After the nucleation layer has formed, preferably consisting of material identical or close to the final IB-IIIA-chalcogenide compound, the entire precursor layer, or optionally only those portions of the precursor layer that remain more or less unprocessed, will be heated to the processing temperature so that the remaining material will begin to convert into the final IB-IIIA-chalcogenide compound in contact with the nucleation layer. The nucleation layer guides the crystal formation and minimizes the possibility of areas of the substrate forming pinhole or having other abnormalities due to uneven crystal formation.

It should be understood that in addition to the aforementioned, the temperature may also vary over different time periods of precursor layer processing. As a nonlimiting example, the heating may occur at a first temperature over an initial processing time period and proceed to other temperatures for subsequent time periods of the processing. Optionally, the method may include intentionally creating one or more temperature dips so that, as a nonlimiting example, the method comprises heating, cooling, heating, and subsequent cooling. In one embodiment of the present invention, this may involve lowering the temperature from between about 50° C. to about 200° C. from a temperature in an initial time period.

Nucleation Layer by Chemical Gradient

Referring now to FIGS. 13A-13F, a still further method of forming a nucleation layer with a microflake precursor material according to the present invention will be described in more detail. In this embodiment of the present invention, the composition of the deposited layers of precursor material may be selected so that crystal formation begins sooner in some layers than in other layers. It should be understood that the various methods of forming a nucleation layer may be combined together to facilitate layer formation. As a nonlimiting example, the thermal gradient and chemical gradient methods may be combined to facilitate nucleation layer formation. It is imagined that single or multiple combinations of using a thermal gradient, chemical gradient, and/or thin film nucleation layer may be combined.

Referring now to FIG. 13A, the absorber layer may be formed on a substrate 912, as shown in FIG. 13A. A surface of the substrate 912 may be coated with a contact layer 914 to promote electrical contact between the substrate 912 and the absorber layer that is to be formed on it. By way of example, an aluminum substrate 912 may be coated with a contact layer 914 of molybdenum. As discussed herein, forming or disposing a material or layer of material on the substrate 912 includes disposing or forming such material or layer on the contact layer 914, if one is used. Optionally, it should also be understood that a layer 915 may also be formed on top of contact layer 914 and/or directly on substrate 912. This layer may be solution coated, evaporated, and/or deposited using vacuum based techniques. Although not limited to the following, the layer 915 may have a thickness less than that of the precursor layer 916. In one nonlimiting example, the layer may be between about 1 to about 100 nm in thickness. The layer 915 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

As shown in FIG. 13B, a precursor layer 916 is formed on the substrate. The precursor layer 916 contains one or more group IB elements and one or more group IIIA elements. Preferably, the one or more group IB elements include copper. The one or more group IIIA elements may include indium and/or gallium. The precursor layer may be formed using any of the techniques described above. In one embodiment, the precursor layer contains no oxygen other than those unavoidably present as impurities or incidentally present in components of the film other than the microflakes themselves. Although the precursor layer 916 is preferably formed using non-vacuum methods, it should be understood that it may optionally be formed by other means, such as evaporation, sputtering, ALD, etc. By way of example, the precursor layer 916 may be an oxygen-free compound containing copper, indium and gallium. In one embodiment, the non-vacuum system operates at pressures above about 3.2 kPa (24 Torr). Optionally, it should also be understood that a layer 917 may also be formed on top of precursor layer 916. It should be understood that the stack may have both layers 915 and 917, only one of the layers, or none of the layers. Although not limited to the following, the layer 917 may have a thickness less than that of the precursor layer 916. In one nonlimiting example, the layer may be between about 1 to about 100 nm in thickness. The layer 917 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

Referring now to FIG. 13C, a second precursor layer 918 of a second precursor material may optionally be applied on top of the first precursor layer. The second precursor material may have an overall composition that is more chalcogen-rich than the first precursor material in precursor layer 916. As a nonlimiting example, this allows for creating a gradient of available Se by doing two coatings (preferably with only one heating process of the stack after depositing both precursor layer coatings) where the first coating contains selenides with relatively less selenium in it (but still enough) than the second. For instance, the precursor for the first coating can contain $Cu_xSe_y$ where the x is larger than in the second coating. Or it may contain a mix of $Cu_xSe_y$ particles wherein there is a larger concentration (by weight) of the selenide particles with the large x. In this current embodiment, each layer has preferably the targeted stoichiometry because the C/J/G ratios are kept the same for each precursor layer. Again, although this second precursor layer 918 is preferably formed using non-vacuum methods, it should be understood that it may optionally be formed by other means, such as evaporation, sputtering, ALD, etc.

The rationale behind the use of chalcogen grading, or more general a grading in melting temperature from bottom to top, is to control the relative rate of crystallization in depth and to have the crystallization happen e.g. faster at the bottom portion of the stack of precursor layers than at the top of the stack of precursor layers. The additional rationale is that the common grain structure in typical efficient solution-deposited CIGS cells where the cells have large grains at the top of the photoactive film, which is the part of the photoactive film that is mainly photoactive, and small grains at the back, still have appreciable power conversion efficiencies. It should be understood that in other embodiments, a plurality of many layers of different precursor materials may be used to build up a desired gradient of chalcogen, or more general, a desired gradient in melting temperature and/or subsequent solidification into the final IB-IIIA-chalcogenide compound, or even more general, a desired gradient in melting and/or subsequent solidification into the final IB-IIIA-chalcogenide compound, either due to creating a chemical (compositional) gradient, and/or a thermal gradient, in the resulting film. As nonlimiting examples, the present invention may use particles and/or microflakes and/or nanoflakes with different melting points such as but not limited to lower melting materials Se, $In_4Se_3$, Ga, and $Cu_1Se_1$, compared to higher melting materials $In_2Se_3$, $Cu_2Se$.

Referring now to FIG. 13C, heat 920 is applied to heat the first precursor layer 916 and the second precursor layer 918 into a group IB-IIIA compound film 922. The heat 920 may be supplied in a rapid thermal annealing process, e.g., as described above. Specifically, the substrate 912 and precursor layer(s) 916 and/or 918 may be heated from an ambient temperature to a plateau temperature range of between about 200° C. and about 600° C. The temperature is maintained in the plateau range for a period of time ranging between about a fraction of a second to about 60 minutes, and subsequently reduced.

Optionally, as shown in FIG. 13D, it should be understood that a layer 924 containing elemental chalcogen particles may be applied over the precursor layers 916 and/or 918 prior to heating. Of course, if the material stack does not include a second precursor layer, the layer 924 is formed over the precursor layer 916. By way of example, and without loss of generality, the chalcogen particles may be particles of selenium, sulfur or tellurium. Such particles may be fabricated as described above. The chalcogen particles in the layer 924 may be between about 1 nanometer and about 25 microns in size, preferably between 50 nm and 500 nm. The chalcogen particles may be mixed with solvents, carriers, dispersants etc. to prepare an ink or a paste that is suitable for wet deposition over the precursor layer 916 and/or 918 to form the layer 924. Alternatively, the chalcogen particles may be prepared for deposition on a substrate through dry processes to form the layer 924.

Optionally, as shown in FIG. 13E, a layer 926 containing an additional chalcogen source, and/or an atmosphere containing a chalcogen source, may optionally be applied to layer 922, particularly if layer 924 was not applied in FIG. 13D. Heat 928 may optionally be applied to layer 922 and the layer 926 and/or atmosphere containing the chalcogen source to heat them to a temperature sufficient to melt the chalcogen source and to react the chalcogen source with the group IB element and group IIIA elements in the precursor layer 922. The heat 928 may be applied in a rapid thermal annealing process, e.g., as described above. The reaction of the chalcogen source with the group IB and IIIA elements forms a compound film 930 of a group IB-IIIA-chalcogenide compound as shown in FIG. 13F. Preferably, the group IB-IIIA-chalcogenide compound is of the form $Cu_zIn_{1-x}Ga_xSe_{2(1-y)}S_{2y}$, where $0 \le x \le 1$, $0 \le y \le 1$, and $0.5 \le y \le 1.5$.

Referring still to FIGS. 13A-13F, it should be understood that sodium may also be used with the precursor material to improve the qualities of the resulting film. In a first method, as discussed in regards to FIGS. 13A and 13B, one or more layers of a sodium containing material may be formed above and/or below the precursor layer 916. The formation may occur by solution coating and/or other techniques such as but not limited to sputtering, evaporation, CBD, electroplating, sol-gel based coating, spray coating, chemical vapor deposition (CVD), physical vapor deposition (PVD), atomic layer deposition (ALD), and the like.

Optionally, in a second method, sodium may also be introduced into the stack by sodium doping the microflakes and/or particles in the precursor layer 916. As a nonlimiting example, the microflakes and/or other particles in the precursor layer 916 may be a sodium containing material such as, but not limited to, Cu—Na, In—Na, Ga—Na, Cu—In—Na, Cu—Ga—Na, In—Ga—Na, Na—Se, Cu—Se—Na, In—Se—Na, Ga—Se—Na, Cu—In—Se—Na, Cu—Ga—Se—Na, In—Ga—Se—Na, Cu—In—Ga—Se—Na, Na—S, Cu—S—Na, In—S—Na, Ga—S—Na, Cu—In—S—Na, Cu—Ga—S—Na, In—Ga—S—Na, and/or Cu—In—Ga—S—Na. In one embodiment of the present invention, the amount of sodium in the microflakes and/or other particles may be about 1 at. % or less. In another embodiment, the amount of sodium may be about 0.5 at. % or less. In yet another embodiment, the amount of sodium may be about 0.1 at. % or less. It should be understood that the doped particles and/or flakes may be made by a variety of methods including milling feedstock material with the sodium containing material and/or elemental sodium.

Optionally, in a third method, sodium may be incorporated into the ink itself, regardless of the type of particle, nanoparticle, microflake, and/or nanoflakes dispersed in the ink. As a nonlimiting example, the ink may include microflakes (Na doped or undoped) and a sodium compound with an organic counter-ion (such as but not limited to sodium acetate) and/or a sodium compound with an inorganic counter-ion (such as but not limited to sodium sulfide). It should be understood that sodium compounds added into the ink (as a separate compound), might be present as particles (e.g. nanoparticles), or dissolved, and/or in (reverse) micelles. The sodium may be in "aggregate" form of the sodium compound (e.g. dispersed particles), and the "molecularly dissolved" form.

None of the three aforementioned methods are mutually exclusive and may be applied singly or in any single or multiple combination to provide the desired amount of sodium to the stack containing the precursor material. Additionally, sodium and/or a sodium containing compound may also be added to the substrate (e.g. into the molybdenum target). Also, sodium-containing layers may be formed in between one or more precursor layers if multiple precursor layers (using the same or different materials) are used. It should also be understood that the source of the sodium is not limited to those materials previously listed. As a nonlimiting example, basically, any deprotonated alcohol where the proton is replaced by sodium, any deprotonated organic and inorganic acid, the sodium salt of the (deprotonated) acid, $Na_xH_ySe_zS_uTe_vO_w$ where x, y, z, u, v, and $w \ge 0$, $Na_xCu_yIn_zGa_uO_v$ where x, y, z, u, and v≥0, sodium hydroxide, sodium acetate, and the sodium salts of the following acids: butanoic acid, hexanoic acid, octanoic acid, decanoic acid, dodecanoic acid, tetradecanoic acid, hexadecanoic acid, 9-hexadecenoic acid, octadecanoic acid, 9-octadecenoic acid, 11-octadecenoic acid, 9,12-octadecadienoic acid, 9,12,15-octadecatrienoic acid, and/or 6,9,12-octadecatrienoic acid.

Optionally, as seen in FIG. 13F, it should also be understood that sodium and/or a sodium compound may be added to the processed chalcogenide film after the precursor layer has been heated or otherwise processed. This embodiment of the present invention thus modifies the film after CIGS formation. With sodium, carrier trap levels associated with the grain boundaries are reduced, permitting improved electronic properties in the film. A variety of sodium containing materials such as those listed above may be deposited as layer 932 onto the processed film and then annealed to treat the CIGS film.

Additionally, the sodium material may be combined with other elements that can provide a bandgap widening effect. Two elements which would achieve this include gallium and sulfur. The use of one or more of these elements, in addition to sodium, may further improve the quality of the absorber layer. The use of a sodium compound such as but not limited to $Na_2S$, $NaInS_2$, or the like provides both Na and S to the film and could be driven in with an anneal such as but not limited to an RTA step to provide a layer with a bandgap different from the bandgap of the unmodified CIGS layer or film.

Referring now to FIG. 14, embodiments of the invention may be compatible with roll-to-roll manufacturing. Specifically, in a roll-to-roll manufacturing system 1000 a flexible substrate 1001, e.g., aluminum foil travels from a supply roll 1002 to a take-up roll 1004. In between the supply and take-up rolls, the substrate 1001 passes a number of applicators 1006A, 1006B, 1006C, e.g. microgravure rollers and heater units 1008A, 1008B, 1008C. Each applicator deposits a different layer or sub-layer of a photovoltaic device active layer, e.g., as described above. The heater units are used to anneal the different sub-layers. In the example depicted in FIG. 14, applicators 1006A and 1006B may be applied different sub-layers of a precursor layer (such as precursor layer 106, precursor layer 916, or precursor layer 918). Heater units 1008A and 1008B may anneal each sub-layer before the next sub-layer is deposited. Alternatively, both sub-layers may be annealed at the same time. Applicator 1006C may apply a layer of material containing chalcogen particles as described above. Heater unit 1008C heats the chalcogen layer and precursor layer as described above. Note that it is also possible to deposit the precursor layer (or sub-layers) then deposit the chalcogen-containing layer and then heat all three layers together to form the IB-IIIA-chalcogenide compound film used for the photovoltaic absorber layer.

The total number of printing steps can be modified to construct absorber layers with bandgaps of differential gradation. For example, additional layers (fourth, fifth, sixth, and so forth) can be printed (and optionally annealed between printing steps) to create an even more finely-graded bandgap within the absorber layer. Alternatively, fewer films (e.g. double printing) can also be printed to create a less finely-graded bandgap. For any of the above embodiments, it is possible to have different amounts of chalcogen in each layer as well as to vary crystal growth that may be influenced by the amount of chalcogen present.

Additionally, it should be understood that any number of combinations of flake and non-flake particles may be used according to the present invention in the various layers. As a nonlimiting example, the combinations may include but are not limited to:

TABLE VI

| | |
|---|---|
| Combination 1 | 1) chalcogenide (flake) + non-chalcogenide (flake) |
| Combination 2 | 2) chalcogenide (flake) + non-chalcogenide (non-flake) |
| Combination 3 | 3) chalcogenide (non-flake) + non-chalcogenide (flake) |
| Combination 4 | 4) chalcogenide (non-flake) + non-chalcogenide (non-flake) |
| Combination 5 | 5) chalcogenide (flake) + chalcogenide (flake) |
| Combination 6 | 6) chalcogenide (flake) + chalcogenide (non-flake) |
| Combination 7 | 7) chalcogenide (non-flake) + chalcogenide (non-flake) |
| Combination 8 | 8) non-chalcogenide (flake) + non-chalcogenide (flake) |
| Combination 9 | 9) non-chalcogenide (flake) + non-chalcogenide (non-flake) |
| Combination 10 | 10) non-chalcogenide (non-flake) + non-chalcogenide (non-flake) |

Although not limited to the following, the chalcogenide and non-chalcogenide materials may be selected from any of those listed in the Tables IV and V.

Reduced Melting Temperature

In yet another embodiment of the present invention, the ratio of elements within a particle or flake may be varied to produce more desired material properties. In one nonlimiting example, this embodiment comprises using desired stoichiometric ratios of elements so that the particles used in the ink have a reduced melting temperature. By way of nonlimiting example, for a group IB chalcogenide, the amount of the group IB element and the amount of the chalcogen is controlled to move the resulting material to a portion of the phase diagram that has a reduced melting temperature. Thus for $Cu_xSe_y$, the values for x and y are selected to create a material with reduced melting temperature as determined by reference to a phase diagram for the material. Phase diagrams for the following materials may be found in ASM Handbook, Volume 3 Alloy Phase Diagrams (1992) by ASM International and fully incorporated herein by reference for all purposes. Some specific examples may be found on pages 2-168, 2-170, 2-176, 2-178, 2-208, 2-214, 2-257, and/or 2-259.

As a nonlimiting example, copper selenide has multiple melting temperatures depending on the ratio of copper to selenium in the material. Everything more Se-rich (i.e. right on the binary phase diagram with pure Cu on the left and pure Se on the right) of the solid-solution $Cu_2$-xSe will create liquid selenium. Depending on composition, the melting temperature may be as low as 221° C. (more Se rich than $Cu_1Se_2$), as low as 332° C. (for compositions between $Cu_1Se_1$ & $Cu_1Se_2$), and as low as 377° C. (for compositions between $Cu_2$-xSe and $Cu_1Se_1$). At 523° C. and above, the material is all liquid for Cu—Se that is more Se-rich than the eutectic (~57.9 wt.-% Se). For compositions in between the solid-solution $Cu_2$-xSe and the eutectic (~57.9 wt.-% Se), it will create a solid solid-solution $Cu_2$-xSe and liquid eutectic (~57.9 wt.-% Se) at 523° C. and just above.

Another nonlimiting example involves gallium selenide which may have multiple melting temperatures depending on the ratio of gallium to selenium in the material. Everything more Se-rich (i.e. right on the binary phase diagram with pure Ga on the left and pure Se on the right) than $Ga_2Se_3$ will create liquid above 220° C., which is mainly pure Se. Making Ga—Se more Se-rich than $Ga_1Se_1$ is possible by making e.g. the compound $Ga_2Se_3$ (or anything more Se-rich than $Ga_1Se_1$), but only when adding other sources of selenium when working with a composition in between or equal to $Ga_1Se_1$ and $Ga_2Se_3$ (being an additional source of selenium or Se-rich Cu—Se) will liquefy the Ga—Se at processing temperature. Hence, an additional source of Se may be provided to facilitate the creation of a liquid involving gallium selenide.

Yet another nonlimiting example involves indium selenide which may have multiple melting temperatures depending on the ratio of indium to selenium in the material. Everything more Se-rich (i.e. right on the binary phase diagram with pure In on the left and pure Se on the right) than $In_2Se_3$ will create liquid above 220° C., which is mainly pure Se. Making In—Se more Se-rich than $In_1Se_1$ would create liquid for $In_2Se_3$ and also for $In_6Se_7$ (or a bulk composition in between $In_1Se_1$ and Se), but when dealing with a composition between or equal to $In_1Se_1$ and $In_2Se_3$, only by adding other sources of selenium (being an additional source of selenium or Se-rich Cu—Se) the In—Se will liquefy at processing temperature. Optionally for In—Se, there is another way of creating more liquid by going in the "other" direction and using compositions that are less Se-rich (i.e. left on the binary phase diagram). By using a material composition between pure In and $In_4Se_3$ (or between In and $In_1Se_1$ or between In and $In6Se7$ depending on temperature), pure liquid In can be created at 156° C. and even more liquid at 520° C. (or at a higher temperature when going more Se-rich moving from the eutectic point of ~24.0 wt.-% Se up to $In_1Se_1$). Basically, for a bulk composition less Se-rich than the In—Se eutectic (~24.0 wt.-% Se), all the In—Se will turn into a liquid at 520° C. Of course, with these type of Se poor materials, one of the other particles (such as but not limited to $Cu_1Se_2$ and/or Se) will be needed to increase the Se content, or another source of Se.

Accordingly, liquid may be created at our processing temperature by: 1) adding a separate source of selenium, 2) using Cu—Se more Se-rich than $Cu_2$-xSe, 3) using Ga-emulsion (or In—Ga emulsion), or In (in an air free environment), or 4) using In—Se less Se-rich than In1Se1 though this may also require an air free environment. When copper selenide is used, the composition may be $Cu_xSe_y$, wherein x is in the range of about 2 to about 1 and y is in the range of about 1 to about 2. When indium selenide is used, the composition may be $In_xSe_y$, wherein x is in the range of about 1 to about 6 and y is in the range of about 0 to about 7. When gallium selenide is used, the composition may be $Ga_xSe_y$, wherein x is in the range of about 1 to about 2 and y is in the range of about 1 to about 3.

It should be understood that adding a separate source of selenium will make the composition behave initially as more Se-rich at the interface of the selenide particle and the liquid selenium at the processing temperature.

Additional Chalcogen

Any of the methods described herein may be further optimized by using, prior to, during, or after the solution deposition and/or heating of one or more of the precursor layers, any combination of (1) any chalcogen source that can be solution-deposited, e.g. a Se or S nano- or micron-sized powder mixed into the precursor layers or deposited as a separate layer, (2) chalcogen (e.g., Se or S) evaporation, (3) an $H_2Se$ ($H_2S$) atmosphere, (4) a chalcogen (e.g., Se or S) atmosphere, (5) an $H_2$ atmosphere, (6) an organo-selenium atmosphere, e.g. diethylselenide or another organo-metallic material, (7) another reducing atmosphere, e.g. CO, and a (8) heat treatment. The stoichiometric ratio of microflakes to extra chalcogen, given as Se/(Cu+In+Ga+Se) may be in the range of about 0 to about 1000.

Figure 15A:
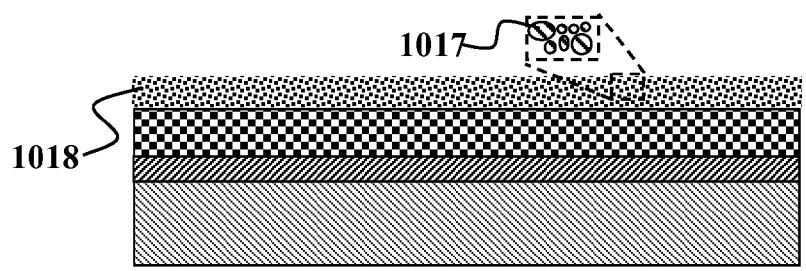
FIGS. 15A-15D show a schematic of a system using a chalcogen material according to one embodiment of the present invention.
Figure 15B:
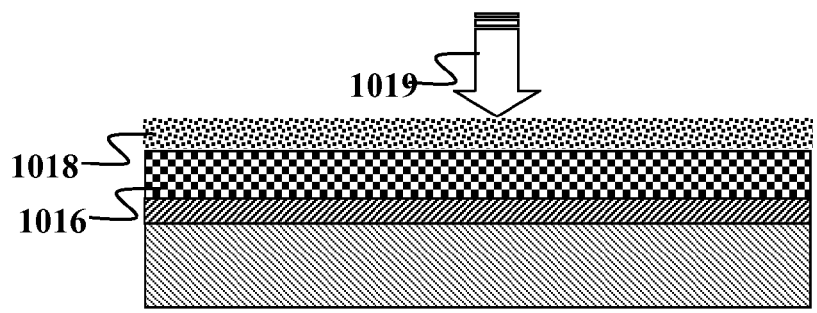
Figure 15C:
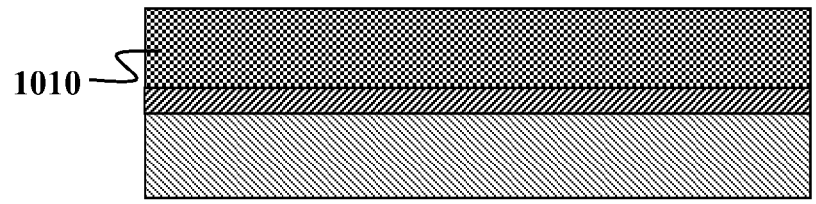
Figure 15D:
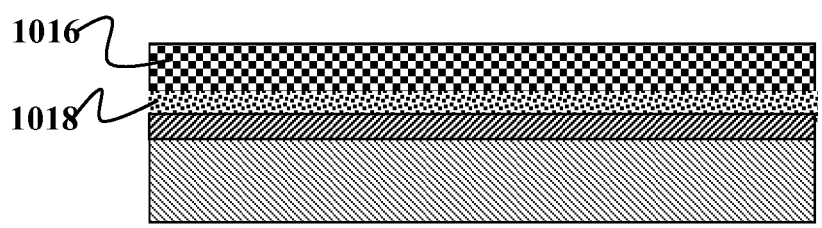

For example as shown in FIG. 15A, a layer 1018 containing elemental chalcogen particles 1017 over the precursor layer 1016. By way of example, and without loss of generality, the chalcogen particles may be particles of selenium, sulfur or tellurium. As shown in FIG. 15B, heat 1019 is applied to the precursor layer 1016 and the layer 1018 containing the chalcogen particles to heat them to a temperature sufficient to melt the chalcogen particles 1017 and to react the chalcogen particles 1017 with the group IB element and group IIIA elements in the precursor layer 1016. The reaction of the chalcogen particles 1017 with the group IB and IIIA elements forms a compound film 1810 of a group IB-IIIA-chalcogenide compound as shown in FIG. 15C. Optionally, the group IB-IIIA-chalcogenide compound is of the form $Cu_zIn_{1-x}Ga_xSe_{2(1-y)}S_y$, where $0 \le x \le 1$, $0 \le y \le 1$, and $0.5 \le z \le 1.5$.

If the chalcogen particles 1017 melt at a relatively low temperature (e.g., 220° C. for Se, 120° C. for S) the chalcogen is already in a liquid state and makes good contact with the group IB and IIIA nanoparticles in the precursor layer 1016. If the precursor layer 1016 and molten chalcogen are then heated sufficiently (e.g., at about 375° C.) the chalcogen reacts with the group IB and IIIA elements in the precursor layer 1016 to form the desired IB-IIIA-chalcogenide material in the compound film 1810. As one nonlimiting example, the precursor layer is between about 10 nm and about 5000 nm thick. In other embodiments, the precursor layer may be between about 4.0 to about 0.5 microns thick.

There are a number of different techniques for forming the IB-IIIA precursor layer 1016. For example, the precursor layer 1016 may be formed from a nanoparticulate film including nanoparticles containing the desired group IB and IIIA elements. The nanoparticles may be a mixture elemental nanoparticles, i.e., nanoparticles having only a single atomic species. Alternatively, the nanoparticles may be binary nanoparticles, e.g., Cu—In, In—Ga, or Cu—Ga or ternary particles, such as, but not limited to, Cu—In—Ga, or quaternary particles. Such nanoparticles may be obtained, e.g., by ball milling a commercially available powder of the desired elemental, binary or ternary material. These nanoparticles may be between about 0.1 nanometer and about 500 nanometers in size.

One of the advantages of the use of nanoparticle-based dispersions is that it is possible to vary the concentration of the elements within the compound film 1810 either by building the precursor layer in a sequence of sub-layers or by directly varying the relative concentrations in the precursor layer 1016. The relative elemental concentration of the nanoparticles that make up the ink for each sub-layer may be varied. Thus, for example, the concentration of gallium within the absorber layer may be varied as a function of depth within the absorber layer.

The layer 1018 containing the chalcogen particles 1017 may be disposed over the nanoparticulate film and the nanoparticulate film (or one or more of its constituent sub-layers) may be subsequently heated in conjunction with heating the chalcogen particles 1017. Alternatively, the nanoparticulate film may be heated to form the precursor layer 1016 before disposing the layer 1018 containing elemental chalcogen particles 1017 over precursor layer 1016. Additional disclosure on depositing chalcogen material may be found in co-pending U.S. patent application Ser. No. 11/361,522, now abandoned filed Feb. 23, 2006 and fully incorporated herein by reference for all purposes.

Figure 15E:
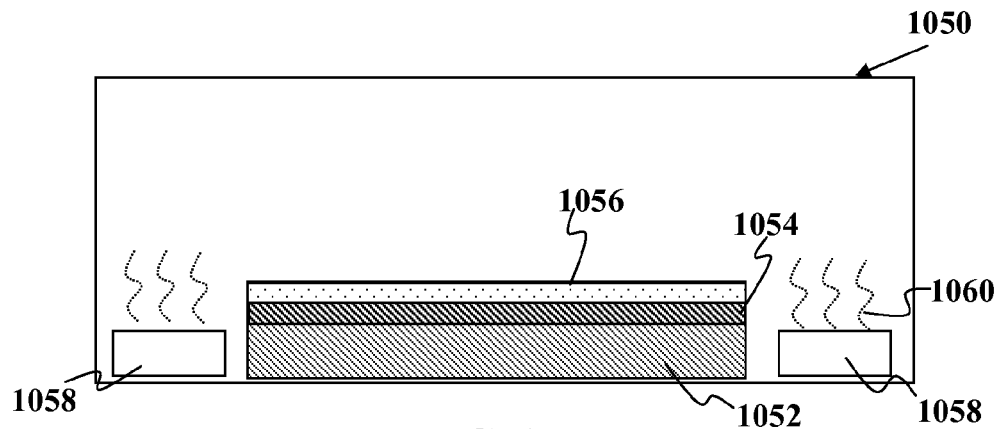
FIG. 15E shows a schematic of a system using a chalcogen vapor environment according to one embodiment of the present invention.

Referring now to FIG. 15E, yet another embodiment of the present invention will now be described. In this embodiment for use with a microflake precursor material, it should be understood that overpressure from chalcogen vapor is used to provide a chalcogen atmosphere to improve processing of the film and crystal growth. FIG. 15E shows a chamber 1050 with a substrate 1052 having a contact layer 1054 and a precursor layer 1056. Extra sources 1058 of chalcogen are included in the chamber and are brought to a temperature to generate chalcogen vapor as indicated by lines 1060. In one embodiment of the present invention, the chalcogen vapor is provided to have a partial pressure of the chalcogen present in the atmosphere greater than or equal to the vapor pressure of chalcogen that would be required to maintain a partial chalcogen pressure at the processing temperature and processing pressure to minimize loss of chalcogen from the precursor layer, and if desired, provide the precursor layer with additional chalcogen. The partial pressure is determined in part on the temperature that the chamber 1050 or the precursor layer 1056 is at. It should also be understood that the chalcogen vapor is used in the chamber 1050 at a non-vacuum pressure. In one embodiment, the pressure in the chamber is at about atmospheric pressure. Per the ideal gas law PV=nRT, it should be understood that the temperature influences the vapor pressure. In one embodiment, this chalcogen vapor may be provided by using a partially or fully enclosed chamber with a chalcogen source 1062 therein or coupled to the chamber. In another embodiment using a more open chamber, the chalcogen atmosphere may be provided by supplying a source producing a chalcogen vapor. The chalcogen vapor may serve to help keep the chalcogen in the film or to provide the chalcogen to covert the precursor layer. Thus, the chalcogen vapor may or may not be used to provide excess chalcogen. In some embodiments, this may serve more to keep the chalcogen present in the film than to provide more chalcogen into the film. Optionally, this maybe used as a chalcogen that is introduced into an otherwise chalcogen free or selenium free precursor layer. The exposure to chalcogen vapor may occur in a non-vacuum environment. The exposure to chalcogen vapor may occur at atmospheric pressure. These conditions may be applicable to any of the embodiments described herein. The chalcogen may be carried into the chamber by a carrier gas. The carrier gas may be an inert gas such as nitrogen, argon, or the like. This chalcogen atmosphere system may be adapted for use in a roll-to-roll system.

Figure 15F:
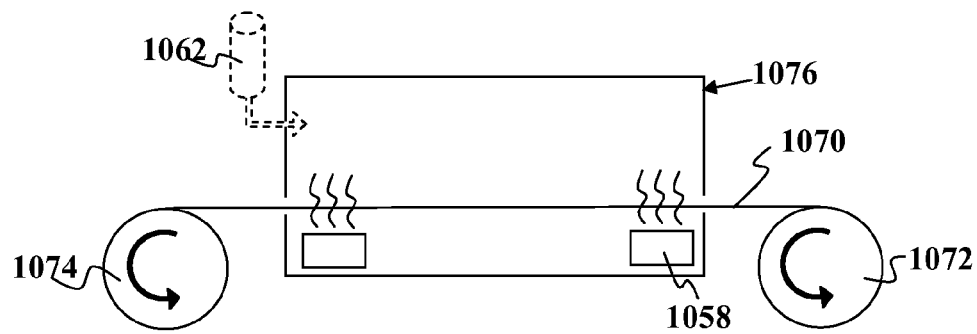
FIG. 15F shows a schematic of a system using a chalcogen vapor environment according to one embodiment of the present invention.

Referring now to FIG. 15F, it shown that the present invention may be adopted for use with a roll-to-roll system where the substrate 1070 carrying the precursor layer may be flexible and configured as rolls 1072 and 1074. The chamber 1076 may be at vacuum or non-vacuum pressures. The chamber 1076 may be designed to incorporate a differential valve design to minimize the loss of chalcogen vapor at the chamber entry and chamber exit points of the roll-to-roll substrate 1070.

Figure 15G:
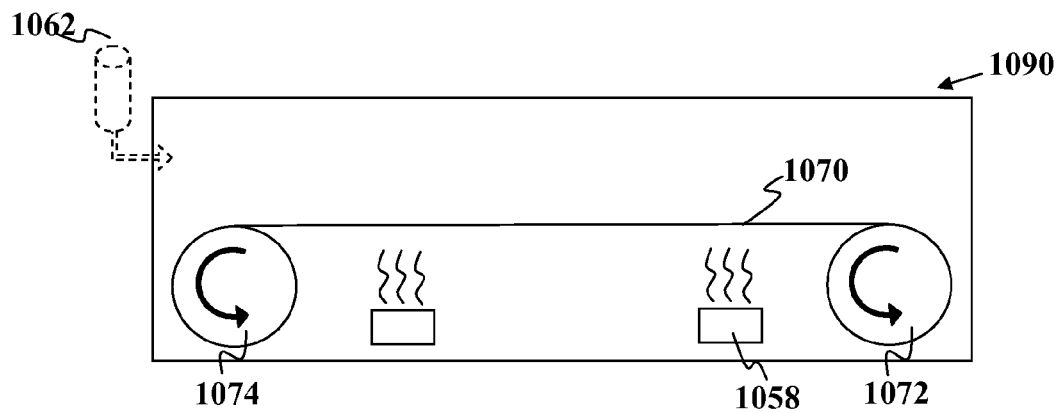
FIG. 15G shows a schematic of a system using a chalcogen vapor environment according to one embodiment of the present invention.

Referring now to FIG. 15G, yet another embodiment of the present invention uses a chamber 1090 of sufficient size to hold the entire substrate, including any rolls 1072 or 1074 associated with using a roll-to-roll configuration.

Figure 16A:
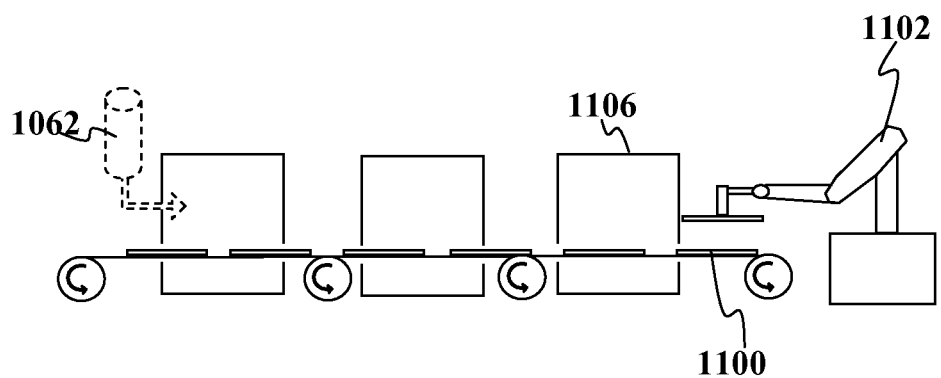
FIG. 16A shows one embodiment of a system for use with rigid substrates according to one embodiment of the present invention.

Referring now to FIG. 16A, it should also be understood that the embodiments of the present invention may also be used on a rigid substrate 1100. By way of nonlimiting example, the rigid substrate 1100 may be glass, soda-lime glass, steel, stainless steel, aluminum, polymer, ceramic, coated polymer, or other rigid material suitable for use as a solar cell or solar module substrate. A high speed pick-and-place robot 1102 may be used to move rigid substrates 1100 onto a processing area from a stack or other storage area. In FIG. 16A, the substrates 1100 are placed on a conveyor belt which then moves them through the various processing chambers. Optionally, the substrates 1100 may have already undergone some processing by the time and may already include a precursor layer on the substrate 1100. Other embodiments of the invention may form the precursor layer as the substrate 1100 passes through the chamber 1106.

Figure 16B:
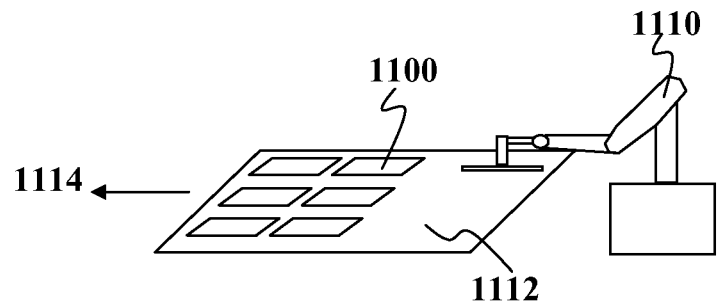
FIG. 16B shows one embodiment of a system for use with rigid substrates according to one embodiment of the present invention.

FIG. 16B shows another embodiment of the present system where a pick-and-place robot 1110 is used to position a plurality of rigid substrates on a carrier device 1112 which may then be moved to a processing area as indicated by arrow 1114. This allows for multiple substrates 1100 to be loaded before they are all moved together to undergo processing.

Figure 17:
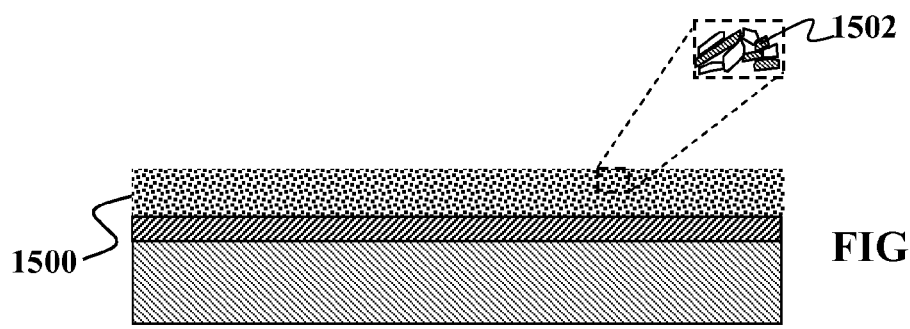
FIGS. 17-19 show the use of inter-metallic material to form a film according to embodiments of the present invention.

Referring now to FIG. 17, yet another embodiment of the present invention will now be described. In one embodiment, the particles used to form a precursor layer 1500 may include particles that are inter-metallic particles 1502. In one embodiment, an inter-metallic material is a material containing at least two elements, wherein the amount of one element in the inter-metallic material is less than about 50 molar percent of the total molar amount of the inter-metallic material and/or the total molar amount of that one element in a precursor material. The amount of the second element is variable and may range from less than about 50 molar percent to about 50 or more molar percent of the inter-metallic material and/or the total molar amount of that one element in a precursor material. Alternatively, inter-metallic phase materials may be comprised of two or more metals where the materials are admixed in a ratio between the upper bound of the terminal solid solution and an alloy comprised of about 50% of one of the elements in the inter-metallic material. The particle distribution shown in the enlarged view of FIG. 17 is purely exemplary and is nonlimiting. It should be understood that some embodiments may have particles that all contain inter-metallic materials, mixture of metallic and inter-metallic materials, metallic particles and inter-metallic particles, or combinations thereof.

It should be understood that inter-metallic phase materials are compounds and/or intermediate solid solutions containing two or more metals, which have characteristic properties and crystal structures different from those of either the pure metals or the terminal solid solutions. Inter-metallic phase materials arise from the diffusion of one material into another via crystal lattice vacancies made available by defects, contamination, impurities, grain boundaries, and mechanical stress. Upon two or more metals diffusing into one another, intermediate metallic species are created that are combinations of the two materials. Sub-types of inter-metallic compounds include both electron and interstitial compounds.

Electron compounds arise if two or more mixed metals are of different crystal structure, valency, or electropositivity relative to one another; examples include but are not limited to copper selenide, gallium selenide, indium selenide, copper telluride, gallium telluride, indium telluride, and similar and/or related materials and/or blends or mixtures of these materials.

Interstitial compounds arise from the admixture of metals or metals and non-metallic elements, with atomic sizes that are similar enough to allow the formation of interstitial crystal structures, where the atoms of one material fit into the spaces between the atoms of another material. For inter-metallic materials where each material is of a single crystal phase, two materials typically exhibit two diffraction peaks, each representative of each individual material, superimposed onto the same spectra. Thus inter-metallic compounds typically contain the crystal structures of both materials contained within the same volume. Examples include but are not limited to Cu—Ga, Cu—In, and similar and/or related materials and/or blends or mixtures of these materials, where the compositional ratio of each element to the other places that material in a region of its phase diagram other than that of the terminal solid solution.

Inter-metallic materials are useful in the formation of precursor materials for CIGS photovoltaic devices in that metals interspersed in a highly homogenous and uniform manner amongst one another, and where each material is present in a substantially similar amount relative to the other, thus allowing for rapid reaction kinetics leading to high quality absorber films that are substantially uniform in all three dimensions and at the nano-, micro, and meso-scales.

In the absence of the addition of indium nanoparticles, which are difficult to synthesize and handle, terminal solid solutions do not readily allow a sufficiently large range of precursor materials to be incorporated into a precursor film in the correct ratio (e.g. Cu/(In+Ga)=0.85) to provide for the formation of a highly light absorbing, photoactive absorber layer. Furthermore, terminal solid solutions may have mechanical properties that differ from those of inter-metallic materials and/or intermediate solid solutions (solid solutions between a terminal solid solution and/or element). As a nonlimiting example, some terminal solid solutions are not brittle enough to be milled for size reduction. Other embodiments may be too hard to be milled. The use of inter-metallic materials and/or intermediate solid solutions can address some of these drawbacks.

The advantages of particles 1502 having an inter-metallic phase are multi-fold. As a nonlimiting example, a precursor material suitable for use in a thin film solar cell may contain group IB and group IIIA elements such as copper and indium, respectively. If an inter-metallic phase of Cu—In is used such as $Cu_1In_2$, then Indium is part of an In-rich Cu material and not added as pure indium. Adding pure indium as a metallic particle is challenging due to the difficulty in achieving In particle synthesis with high yield, small and narrow nanoparticle size distribution, and requiring particle size discrimination, which adds further cost. Using inter-metallic In-rich Cu particles avoids pure elemental In as a precursor material. Additionally, because the inter-metallic material is Cu poor, this also advantageously allows Cu to be added separately to achieve precisely the amount of Cu desired in the precursor material. The Cu is not tied to the ratio fixed in alloys or solid solutions that can be created by Cu and In. The inter-metallic material and the amount of Cu can be fine tuned as desired to reach a desired stoichiometric ratio. Ball milling of these particles results in no need for particle size discrimination, which decreases cost and improves the throughput of the material production process.

In some specific embodiments of the present invention, having an inter-metallic material provides a broader range of flexibility. Since economically manufacturing elemental indium particles is difficult, it would be advantageous to have an indium-source that is more economically interesting. Additionally, it would be advantageous if this indium source still allows varying both the Cu/(In+Ga) and Ga/(In+Ga) in the layer independently of each other. As one nonlimiting example, a distinction can be made between $Cu_{11}In_9$ and $Cu_1In_2$ with an inter-metallic phase. This particularly true if only one layer of precursor material is used. If, for this particular example, if indium is only provided by $Cu_{11}In_9$, there is more restriction what stoichiometric ratio can be created in a final group IB-IIIA-VIA compound. With $Cu_1In_2$ as the only indium source, however, there is much greater range of ratio can be created in a final group IB-IIIA-VIA compound. $Cu_1In_2$ allows you to vary both the Cu/(In+Ga) and Ga/(In+Ga) independently in a broad range, whereas Cu11In9 does not. For instance, Cu11In9 does only allow for Ga/(In+Ga)=0.25 with Cu/(In+Ga)>0.92. Yet another example, Cu11In9 does only allow for Ga/(In+Ga)=0.20 with Cu/(In+Ga)>0.98. Yet another example, Cu11In9 does only allow for Ga/(In+Ga)=0.15 with Cu/(In+Ga)>1.04. Thus for an intermetallic material, particularly when the intermetallic material is a sole source of one of the elements in the final compound, the final compound may be created with stoichiometric ratios that more broadly explore the bounds of Cu/(In+Ga) with a compositional range of about 0.7 to about 1.0, and Ga/(In+Ga) with a compositional range of about 0.05 to about 0.3. In other embodiments, Cu/(In+Ga) compositional range may be about 0.01 to about 1.0. In other embodiments, the Cu/(In+Ga) compositional range may be about 0.01 to about 1.1. In other embodiments, the Cu/(In+Ga) compositional range may be about 0.01 to about 1.5. This typically results in additional $Cu_xSe_y$ which we might be able to remove afterwards if it is at the top surface. It should be understood that these ratios may apply to any of the above embodiments described herein.

Furthermore, it should be understood that during processing, an intermetallic material may create more liquid than other compounds. As a nonlimiting example, $Cu_1In_2$ will form more liquid when heated during processing than Cu11In9. More liquid promotes more atomic intermixing since it easier for material to move and mix while in a liquid stage.

Additionally, there are specific advantages for particular types of inter-metallic particles such as, but not limited to, $Cu_1In_2$. $Cu_1In_2$ is a material that is metastable. The material is more prone to decomposition, which advantageously for the present invention, will increase the rate of reaction (kinetically). Further, the material is less prone to oxidation (e.g. compared to pure In) and this further simplifies processing. This material may also be single-phase, which would make it more uniform as a precursor material, resulting in better yield.

Figure 18:
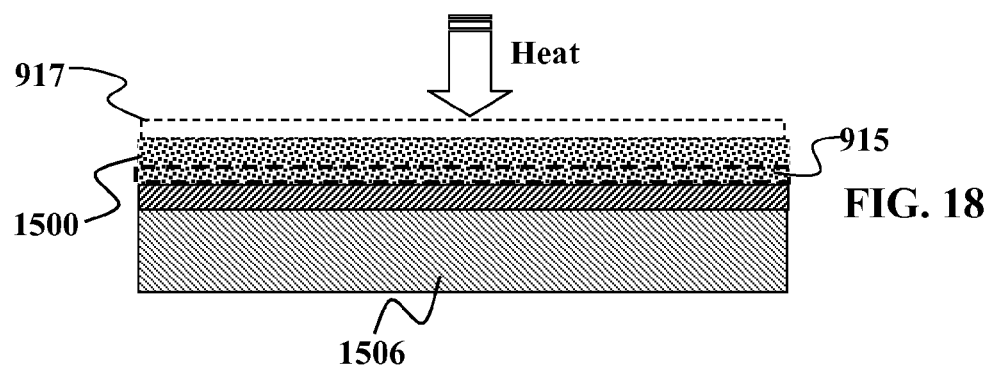
Figure 19:
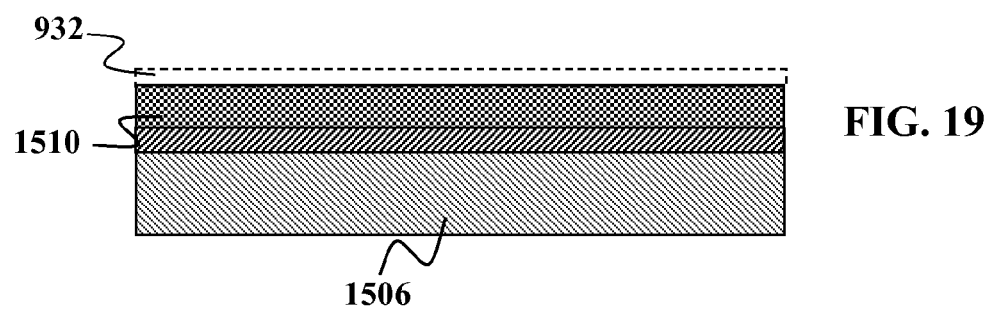

As seen in FIGS. 18 and 19, after the layer 1500 is deposited over the substrate 1506, it may then be heated in a suitable atmosphere to react the layer 1500 in FIG. 18 and form film 1510 shown in FIG. 19. It should be understood that the layer 1500 may be used in conjunction with layers 915 and 917 as described above with regards to FIG. 13A-13B. The layer 915 may be comprised of various materials including but not limited at least one of the following: a group IB element, a group IIIA element, a group VIA element, a group IA element (new style: group 1), a binary and/or multinary alloy of any of the preceding elements, a solid solution of any of the preceding elements. It should be understood that sodium or a sodium-based material such as but not limited to sodium, a sodium compound, sodium fluoride, and/or sodium indium sulfide, may also be used in layer 915 with the precursor material to improve the qualities of the resulting film. FIG. 19 shows that a layer 932 may also be used as described with regards to FIG. 13F. Any of the method suggested previously with regards to sodium content may also be adapted for use with the embodiments shown in FIGS. 17-19.

It should be understood that other embodiments of the present invention also disclose material comprised of at least two elements wherein the amount of at least one element in the material is less than about 50 molar percent of the total molar amount of that element in the precursor material. This includes embodiments where the amount of group IB element is less than the amount of group IIIA element in inter-metallic material. As a nonlimiting example, this may include other group IB poor, group IB-IIIA materials such as Cu-poor $Cu_xIn_y$ particles (where x<y). The amount of group IIIA material may be in any range as desired (more than about 50 molar percent of the element in the precursor material or less than 50 molar percent). In another nonlimiting example, $Cu_xGa_2$ may be used with elemental Cu and elemental In. Although this material is not an inter-metallic material, this material is a intermediate solid solution and is different from a terminal solid solution. All solid particles are created based on a $Cu_xGa_2$ precursor. In this embodiment, no emulsions are used.

In still other embodiments of the present invention, other viable precursor materials may be formed using a group IB rich, group IB-IIIA material. As a nonlimiting example, a variety of intermediate solid-solutions may be used. Cu—Ga (38 at % Ga) may be used in precursor layer 1500 with elemental indium and elemental copper. In yet another embodiment, Cu—Ga (30 at % Ga) may be used in precursor layer 1500 with elemental copper and elemental indium. Both of these embodiments describe Cu-rich materials with the Group IIIA element being less than about 50 molar percent of that element in the precursor material. In still further embodiments, Cu—Ga (multiphasic, 25 at % Ga) may be used with elemental copper and indium to form the desired precursor layer. It should be understood that nanoparticles of these materials may be created by mechanical milling or other size reduction methods. In other embodiments, these particles may be made by electroexplosive wire (EEW) processing, evaporation condensation (EC), pulsed plasma processing, or other methods. Although not limited to the following, the particles sizes may be in the range of about 10 nm to about 1 micron. They may be of any shape as described herein.

Figure 20:
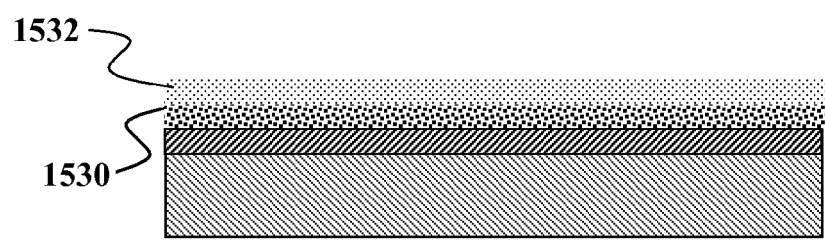
FIG. 20 is a cross-sectional view showing the use of multiple layers to form a film according to embodiments of the present invention.

Referring now to FIG. 20, in a still further embodiment of the present invention, two or more layers of materials may be coated, printed, or otherwise formed to provide a precursor layer with the desired stoichiometric ratio. As a nonlimiting example, layer 1530 may contain a precursor material having $Cu_{11}In_9$ and a Ga source such as elemental Ga and/or $Ga_xSe_y$. A copper rich precursor layer 1532 containing $Cu_{78}In_{28}$ (solid-solution) and elemental indium or $In_xSe_y$ may be printed over layer 1530. In such an embodiment, the resulting overall ratios may have Cu/(In+Ga)=0.85 and Ga/(In+Ga) 0.19. In one embodiment of the resulting film, the film may have a stoichiometric ratio of Cu/(In+Ga) with a compositional range of about 0.7 to about 1.0 and Ga/(In+Ga) with a compositional range of about 0.05 to about 0.3.

Figure 21:
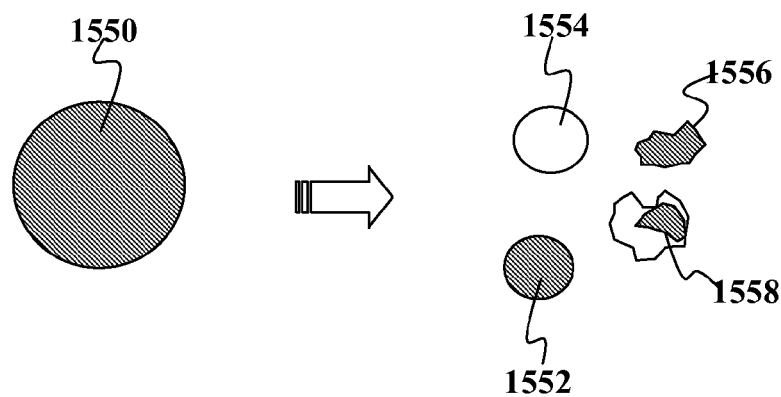
FIG. 21 shows feedstock material being processed according to embodiments of the present invention.

Referring now to FIG. 21, it should be understood that in some embodiments of the present invention, the inter-metallic material is used as a feedstock or starting material from which particles and/or nanoparticles may be formed. As a nonlimiting example, FIG. 21 shows one inter-metallic feedstock particle 1550 being processed to form other particles. Any method used for size reduction and/or shape change may be suitable including but not limited to milling, EEW, EC, pulsed plasma processing, or combinations thereof. Particles 552, 554, 556, and 558 may be formed. These particles may be of varying shapes and some may contain only the inter-metallic phase while others may contain that phase and other material phases.

Figure 22A:
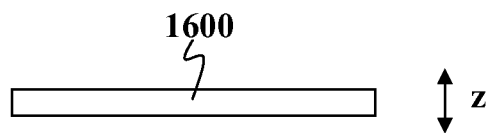
FIGS. 22A and 22B show features of flakes according to embodiments of the present invention.
Figure 22B:
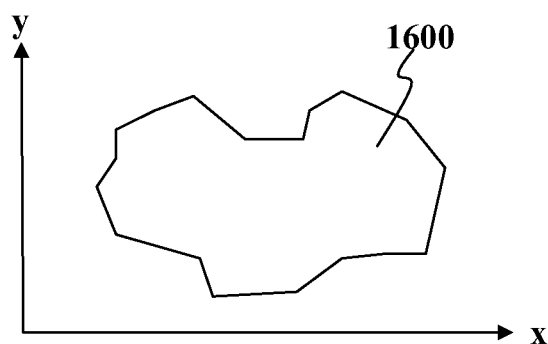
Figure 23A:
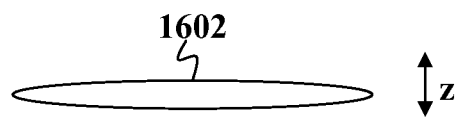
FIGS. 23A and 23B show features of platelets.
Figure 23B:
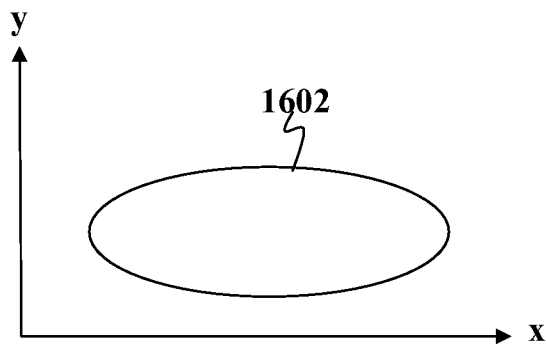

Referring now to FIGS. 22A and 22B, flakes 1600 (microflakes and/or nanoflakes) provide certain advantages over other non-spherical shapes such as but not limited to platelets. The flakes 1600 provide for highly efficient stacking (due to substantially uniform thickness in Z-axis) and high surface area (in X and Y axes). This leads to faster reactions, better kinetics, and more uniform products/films/compounds (with fewer side propagations). Platelet 1602 as seen in FIGS. 23A and 23B fail to have all of the above advantages.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, microflakes may be replaced by and/or mixed with nanoflakes wherein the lengths of the planar nanoflakes are about 500 nm to about 1 nm. As a nonlimiting example, the nanoflakes may have lengths and/or largest lateral dimension of about 300 nm to about 10 nm. In other embodiments, the nanoflakes may be of thickness in the range of about 200 nm to about 20 nm. In another embodiment, these nanoflakes may be of thickness in the range of about 100 nm to about 10 nm. In one embodiment, these nanoflakes may be of thickness in the range of about 200 nm to about 20 nm. As mentioned, some embodiments of the invention may include both microflakes and nanoflakes. Other may include flakes that are exclusively in the size range of microflakes or the size range of nanoflakes. With any of the above embodiments, the microflakes may be replaced and/or combined with microrods which are substantially linear, elongate members. Still further embodiments may combine nanorods with microflakes in the precursor layer. The microrods may have lengths between about 500 nm to about 1 nm. In another embodiment, the nanorods may have lengths between about 500 nm and 20 nm. In yet another embodiment, the nanorods may have lengths between about 300 nm and 30 nm. Any of the above embodiments may be used on rigid substrate, flexible substrate, or a combinations of the two such as but not limited to a flexible substrate that become rigid during processing due to its material properties. In one embodiment of the present invention, the particles may be plates and/or discs and/or flakes and/or wires and/or rods of micro-sized proportions. In another embodiment of the present invention, the particles may be nanoplates and/or nanodiscs and/or nanoflakes and/or nanowires and/or nanorods of nano-sized proportions.

For any of the above embodiments, it should be understood that in addition to the aforementioned, the temperature may also vary over different time periods of precursor layer processing. As a nonlimiting example, the heating may occur at a first temperature over an initial processing time period and proceed to other temperatures for subsequent time periods of the processing. Optionally, the method may include intentionally creating one or more temperature dips so that, as a nonlimiting example, the method comprises heating, cooling, heating, and subsequent cooling. For any of the above embodiments, it is also possible to have two or more elements of IB elements in the chalcogenide particle and/or the resulting film.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc. . . .

For example, still other embodiments of the present invention may use a Cu—In precursor material wherein Cu—In contribute less than about 50 percent of both Cu and In found in the precursor material. The remaining amount is incorporated by elemental form or by non IB-IIIA alloys. Thus, a $Cu_{11}In_9$ may be used with elemental Cu, In, and Ga to form a resulting film. In another embodiment, instead of elemental Cu, In, and Ga, other materials such as Cu—Se, In—Se, and/or Ga—Se may be substituted as source of the group IB or IIIA material. Optionally, in other embodiment, the IB source may be any particle that contains Cu without being alloyed with In and Ga (Cu, Cu—Se). The IIIA source may be any particle that contains In without Cu (In—Se, In—Ga—Se) or any particle that contains Ga without Cu (Ga, Ga—Se, or In—Ga—Se). Other embodiments may have these combinations of the IB material in a nitride or oxide form. Still other embodiments may have these combinations of the IIIA material in a nitride or oxide form. The present invention may use any combination of elements and/or selenides (binary, ternary, or multinary) may be used. Optionally, some other embodiments may use oxides such as $In_2O_3$ to add the desired amounts of materials. It should be understood for any of the above embodiments that more than one solid solution may be used, multi-phasic alloys, and/or more general alloys may also be used. For any of the above embodiments, the annealing process may also involve exposure of the compound film to a gas such as $H_2$, CO, $N_2$, Ar, $H_2Se$, or Se vapor.

It should also be understood that several intermediate solid solutions may also be suitable for use according to the present invention. As nonlimiting examples, a composition in the 6 phase for Cu—In (about 42.52 to about 44.3 wt % In) and/or a composition between the 6 phase for Cu—In and $Cu_{16}In_9$ may be suitable inter-metallic materials for use with the present invention to form a group IB-IIIA-VIA compound. It should be understood that these inter-metallic materials may be mixed with elemental or other materials such as Cu—Se, In—Se, and/or Ga—Se to provide sources of the group IB or IIIA material to reach the desired stoichiometric ratios in the final compound. Other nonlimiting examples of inter-metallic material include compositions of Cu—Ga containing the following phases: $\gamma_1$ (about 31.8 to about 39.8 wt % Ga), $\gamma_2$ (about 36.0 to about 39.9 wt % Ga), $\gamma_3$ (about 39.7 to about −44.9 wt % Ga), the phase between $\gamma_2$ and $\gamma_3$, the phase between the terminal solid solution and $\gamma_1$, and θ (about 66.7 to about 68.7 wt % Ga). For Cu—Ga, a suitable composition is also found in the range in between the terminal solid-solution of and the intermediate solid-solution next to it. Advantageously, some of these inter-metallic materials may be multi-phasic which are more likely to lead to brittle materials that can be mechanically milled. Phase diagrams for the following materials may be found in ASM Handbook, Volume 3 Alloy Phase Diagrams (1992) by ASM International and fully incorporated herein by reference for all purposes. Some specific examples (fully incorporated herein by reference) may be found on pages 2-168, 2-170, 2-176, 2-178, 2-208, 2-214, 2-257, and/or 2-259.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. The following applications are also incorporated herein by reference for all purposes: U.S. patent application Ser. No. 11/290,633, now U.S. Pat. No. 8,048,477 entitled "CHALCOGENIDE SOLAR CELLS" filed Nov. 29, 2005, U.S. patent application Ser. No. 10/782,017, now U.S. Pat. No. 7,663,057 entitled "SOLUTION-BASED FABRICATION OF PHOTOVOLTAIC CELL" filed Feb. 19, 2004, U.S. patent application Ser. No. 10/943,657, now U.S. Pat. No. 7,306,823 entitled "COATED NANOPARTICLES AND QUANTUM DOTS FOR SOLUTION-BASED FABRICATION OF PHOTOVOLTAIC CELLS" filed Sep. 18, 2004, U.S. patent application Ser. No. 11/081,163, now U.S. Pat. No. 7,604,843 entitled "METALLIC DISPERSION", filed Mar. 16, 2005, and U.S. patent application Ser. No. 10/943,685, entitled "FORMATION OF CIGS ABSORBER LAYERS ON FOIL SUBSTRATES", filed Sep. 18, 2004, Ser. No. 11/361,498, now abandoned entitled "HIGH-THROUGHPUT PRINTING OF SEMICONDUCTOR PRECURSOR LAYER FROM MICROFLAKE PARTICLES" filed Feb. 23, 2006, Ser. No. 11/395,426 filed Mar. 30, 2006, the entire disclosures of which are incorporated herein by reference.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
formulating an ink of particles wherein about 50% or more of all the particles are microflakes each containing at least one element from group IB, IIIA and/or VIA and having a non-spherical, planar shape, wherein overall amounts of elements from group IB, IIIA and/or VIA contained in the ink are such that the ink has a desired stoichiometric ratio of the elements; coating a substrate with the ink to form a precursor layer; and processing the precursor layer in a suitable atmosphere to form a dense film; wherein at least one set of the particles in the ink are inter-metallic microflake particles containing at least one group IB-IIIA inter-metallic alloy phase.

2. The method of claim 1 wherein the dense film is used in the formation of a semiconductor absorber for a photovoltaic device.

3. The method of claim 2 wherein the planar shape of the microflakes results in grain sizes of at least about 2.0 µm in at least one dimension in the semiconductor absorber of a photovoltaic device.

4. The method of claim 2 wherein the planar shape of the microflakes results in grain sizes of at least about 1.0 µm in at least one dimension in the semiconductor absorber of a photovoltaic device.

5. The method of claim 2 wherein the planar shape of the microflakes results in grain sizes of at least about 0.5 µm in at least one dimension in the semiconductor absorber of a photovoltaic device.

6. The method of claim 1 wherein substantially all of the particles have a non-spherical, planar shape.

7. The method of claim 1 wherein the particles comprise of microflakes and nanoflakes.

8. The method of claim 1 wherein at least about 75% or more of a total weight of all the particles are microflakes.

9. The method of claim 1 wherein the microflakes are of random planar shape and/or a random size distribution.

10. The method of claim 1 wherein the microflakes are of a non-random planar shape and/or a non-random size distribution.

11. The method of claim 1 wherein the microflakes each have a length less than about 5 microns and greater than about 0.5 microns.

12. The method of claim 1 wherein the microflakes each have a length between about 3 microns and 0.5 microns.

13. The method of claim 1 wherein the microflakes each have a thickness less than about 100 nm.

14. The method of claim 1 wherein the microflakes each have a thickness less than about 20 nm.

15. The method of claim 1 wherein the microflakes have length of less than about 2 microns and a thickness of less than 100 nm.

16. The method of claim 1 wherein the microflakes have length of less than about 1 microns and a thickness of less than 50 nm.

17. The method of claim 1 wherein the microflakes have an aspect ratio of at least about 10 or more.

18. The method of claim 1 wherein the microflakes have an aspect ratio of at least about 15 or more.

19. The method of claim 1 wherein the microflakes are substantially oxygen-free.

20. The method of claim 1 wherein the particles include chalcogenide particles.

21. The method of claim 1 wherein the particles include selenide particles.

22. A method comprising:
formulating an ink of particles wherein a majority of the particles are microflakes each containing at least one element from group IB, IIIA and/or VIA and having a non-spherical, planar shape, wherein the overall amounts of the elements from group IB, IIIA and/or VIA contained in the ink are such that the ink has a desired stoichiometric ratio of the elements;
coating a substrate with the ink to form a precursor layer; and
processing the precursor layer to form a dense film for growth of a semiconductor absorber of a photovoltaic device;
wherein at least one set of the particles in the ink are inter-metallic microflake particles containing at least one group IB-IIIA inter-metallic alloy phase.

* * * * *